(12) United States Patent
Kakehata et al.

(10) Patent No.: US 9,231,070 B2
(45) Date of Patent: Jan. 5, 2016

(54) NONVOLATILE SEMICONDUCTOR MEMORY DEVICE AND MANUFACTURING METHOD THEREOF, SEMICONDUCTOR DEVICE AND MANUFACTURING METHOD THEREOF, AND MANUFACTURING METHOD OF INSULATING FILM

(75) Inventors: Tetsuya Kakehata, Kanagawa (JP); Tetsuhiro Tanaka, Tochigi (JP); Yoshinobu Asami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 131 days.

(21) Appl. No.: 13/113,255

(22) Filed: May 23, 2011

(65) Prior Publication Data

US 2011/0227139 A1 Sep. 22, 2011

Related U.S. Application Data

(62) Division of application No. 11/802,093, filed on May 18, 2007, now Pat. No. 7,955,995.

(30) Foreign Application Priority Data

May 26, 2006 (JP) ................. 2006-147467

(51) Int. Cl.
*H01L 29/10* (2006.01)
*H01L 29/76* (2006.01)
(Continued)

(52) U.S. Cl.
CPC .......... *H01L 29/4908* (2013.01); *H01L 27/115* (2013.01); *H01L 27/11521* (2013.01);
(Continued)

(58) Field of Classification Search
CPC ................. H01L 21/28185; H01L 29/66757; H01L 29/4908; H01L 29/66825; H01L 29/78603; H01L 29/7881
USPC .......... 257/629, 932, 639, 640, 649, E21.212; 438/771, 772
See application file for complete search history.

(56) References Cited

U.S. PATENT DOCUMENTS 5,521,127 A * 5/1996 Hori ............................. 438/770
5,885,871 A * 3/1999 Chan et al. .................... 438/265
(Continued)

FOREIGN PATENT DOCUMENTS

CN 1302087 7/2001
EP 1 265 276 A1 12/2002
(Continued)

OTHER PUBLICATIONS

Chinese Office Action (Application No. 200780019310.6; PCTCN09688) Dated Jul. 14, 2010.
(Continued)

*Primary Examiner* — Jesse Y Miyoshi
(74) *Attorney, Agent, or Firm* — Nixon Peabody LLP; Jeffrey L. Costellia

(57) ABSTRACT

An object is to provide a technique to manufacture an insulating film having excellent film characteristics. In particular, an object is to provide a technique to manufacture a dense insulating film with a high withstand voltage. Moreover, an object is to provide a technique to manufacture an insulating film with few electron traps. An insulating film including oxygen is subjected to plasma treatment using a high frequency under the conditions where the electron density is $1 \times 10^{11}$ cm$^{-3}$ or more and the electron temperature is 1.5 eV or less in an atmosphere including oxygen.

20 Claims, 40 Drawing Sheets

(51) Int. Cl.
*H01L 29/49* (2006.01)
*H01L 27/115* (2006.01)
*H01L 29/66* (2006.01)
*H01L 29/786* (2006.01)
*H01L 29/788* (2006.01)
*H01L 21/314* (2006.01)
*H01L 21/316* (2006.01)
*H01L 27/12* (2006.01)

(52) U.S. Cl.
CPC ...... *H01L29/66825* (2013.01); *H01L 29/7881* (2013.01); *H01L 29/78603* (2013.01); *H01L 21/3143* (2013.01); *H01L 21/31612* (2013.01); *H01L 21/31637* (2013.01); *H01L 21/31645* (2013.01); *H01L 27/1214* (2013.01)

(56) References Cited

U.S. PATENT DOCUMENTS

| | | | |
|---|---|---|---|
| 5,939,763 | A * | 8/1999 | Hao et al. ............ 257/411 |
| 6,017,784 | A | 1/2000 | Ohta et al. |
| 6,124,154 | A * | 9/2000 | Miyasaka ............ 438/151 |
| 6,310,362 | B1 * | 10/2001 | Takemura ............ 257/59 |
| 6,380,014 | B1 | 4/2002 | Ohta et al. |
| 6,475,843 | B2 * | 11/2002 | Chen et al. ............ 438/197 |
| 6,551,948 | B2 | 4/2003 | Ohmi et al. |
| 6,649,538 | B1 * | 11/2003 | Cheng et al. ............ 438/775 |
| 6,669,825 | B2 | 12/2003 | Ohmi et al. |
| 6,720,610 | B2 | 4/2004 | Iguchi et al. |
| 6,740,605 | B1 | 5/2004 | Shiraiwa et al. |
| 6,777,764 | B2 | 8/2004 | Hsieh et al. |
| 6,787,481 | B2 | 9/2004 | Asai et al. |
| 6,838,394 | B2 | 1/2005 | Ohmi et al. |
| 6,846,753 | B2 | 1/2005 | Ohmi et al. |
| 6,897,149 | B2 * | 5/2005 | Sugawara et al. ............ 438/680 |
| 6,974,746 | B2 | 12/2005 | Iguchi et al. |
| 6,975,018 | B2 | 12/2005 | Ohmi et al. |
| 6,979,616 | B2 * | 12/2005 | Jang et al. ............ 438/257 |
| 6,987,047 | B2 | 1/2006 | Iguchi et al. |
| 6,998,354 | B2 | 2/2006 | Ohmi et al. |
| 6,998,355 | B2 | 2/2006 | Ohmi et al. |
| 7,001,855 | B2 | 2/2006 | Ohmi et al. |
| 7,026,681 | B2 | 4/2006 | Ohmi et al. |
| 7,109,083 | B2 | 9/2006 | Ohmi et al. |
| 7,217,659 | B2 | 5/2007 | Sugawara et al. |
| 7,382,015 | B2 | 6/2008 | Iguchi et al. |
| 7,439,121 | B2 | 10/2008 | Ohmi et al. |
| 7,488,646 | B2 | 2/2009 | Iguchi et al. |
| 7,582,928 | B2 | 9/2009 | Iguchi et al. |
| 7,615,772 | B2 | 11/2009 | Lee |
| 7,622,402 | B2 | 11/2009 | Sugawara et al. |
| 7,718,484 | B2 | 5/2010 | Ohmi et al. |
| 2004/0022960 | A1 | 2/2004 | Rhee et al. |
| 2004/0032003 | A1 | 2/2004 | Ohmi et al. |
| 2004/0102052 | A1 * | 5/2004 | Ohmi et al. ............ 438/765 |
| 2004/0178470 | A1 | 9/2004 | Hieda |
| 2005/0029579 | A1 * | 2/2005 | Mori ............ 257/315 |
| 2005/0272266 | A1 | 12/2005 | Ohmi et al. |
| 2006/0131672 | A1 * | 6/2006 | Wang et al. ............ 257/410 |
| 2006/0199398 | A1 | 9/2006 | Sugawara et al. |
| 2007/0218687 | A1 | 9/2007 | Sugawara et al. |
| 2010/0019225 | A1 | 1/2010 | Lee |

FOREIGN PATENT DOCUMENTS

| | | |
|---|---|---|
| EP | 1 265 279 A1 | 12/2002 |
| EP | 1 347 506 A1 | 9/2003 |
| EP | 1 347 507 A1 | 9/2003 |
| EP | 1 361 606 A1 | 11/2003 |
| EP | 1492161 A | 12/2004 |
| JP | 58-007871 A | 1/1983 |
| JP | 05-055200 | 3/1993 |
| JP | 05-299656 | 11/1993 |
| JP | 07-321106 | 12/1995 |
| JP | 10-083990 A | 3/1998 |
| JP | 2001-230419 | 8/2001 |
| JP | 2002-261091 | 9/2002 |
| JP | 2002-261097 A | 9/2002 |
| JP | 2003-124469 A | 4/2003 |
| JP | 2003-332333 A | 11/2003 |
| JP | 2004-015034 A | 1/2004 |
| JP | 2004-158811 A | 6/2004 |
| JP | 2004-207590 | 7/2004 |
| JP | 2004-281662 A | 10/2004 |
| JP | 2005-285805 | 10/2005 |
| WO | WO 01/69665 A1 | 9/2001 |
| WO | WO 01/69673 A1 | 9/2001 |
| WO | WO-02/059956 A1 | 8/2002 |
| WO | WO-03/088341 | 10/2003 |
| WO | WO-2004/017431 A1 | 2/2004 |
| WO | WO 2004/107431 A1 | 12/2004 |

OTHER PUBLICATIONS

Invitation to Pay Additional Fees and, Where Applicable, Protest Fee (Application No. PCT/JP2007/060477, PCT9688) Dated: Jun. 26, 2007.

Taiwanese Office Action (Application No. 96118218; TW09688) Dated Apr. 9, 2013.

* cited by examiner

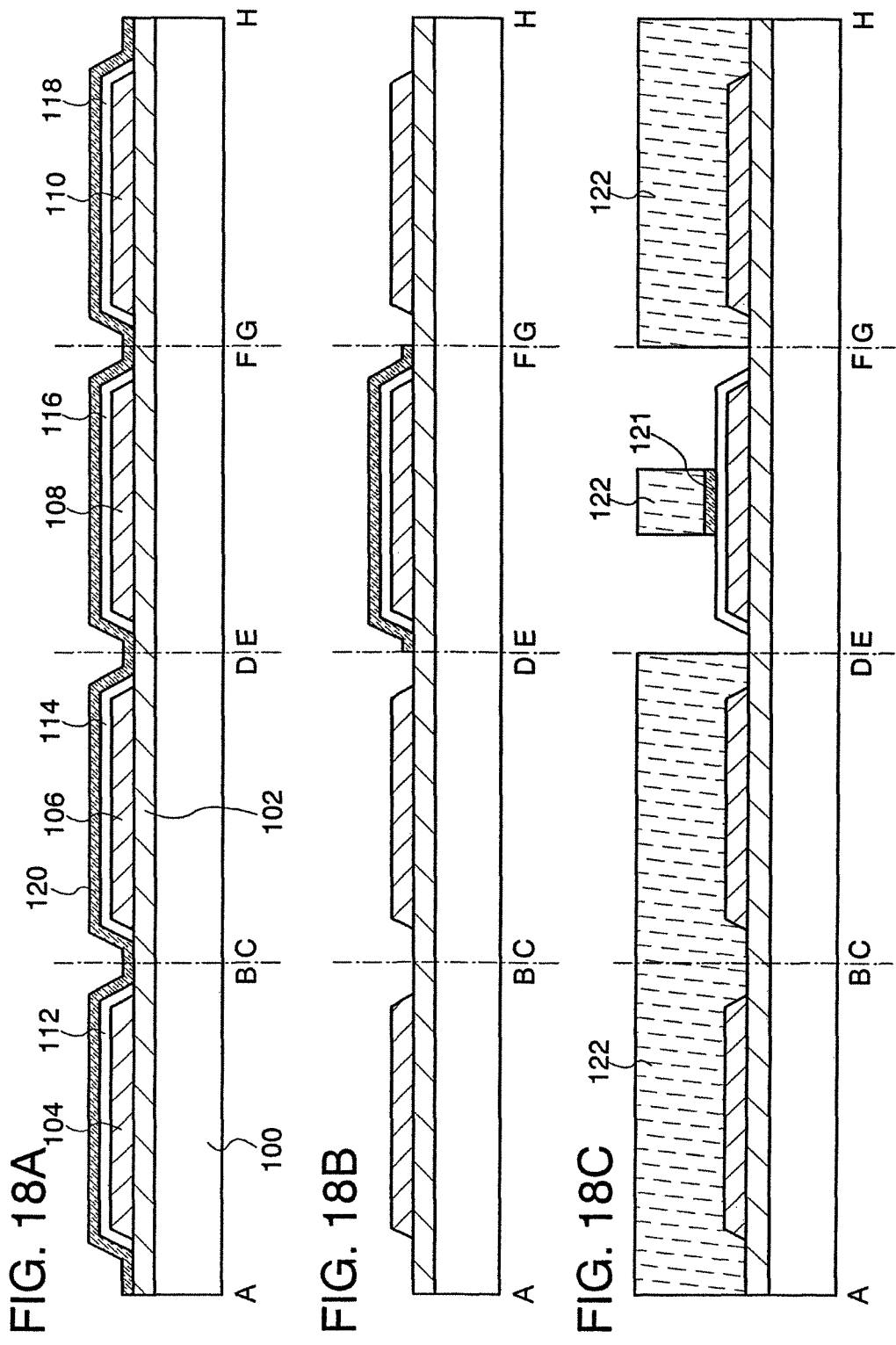

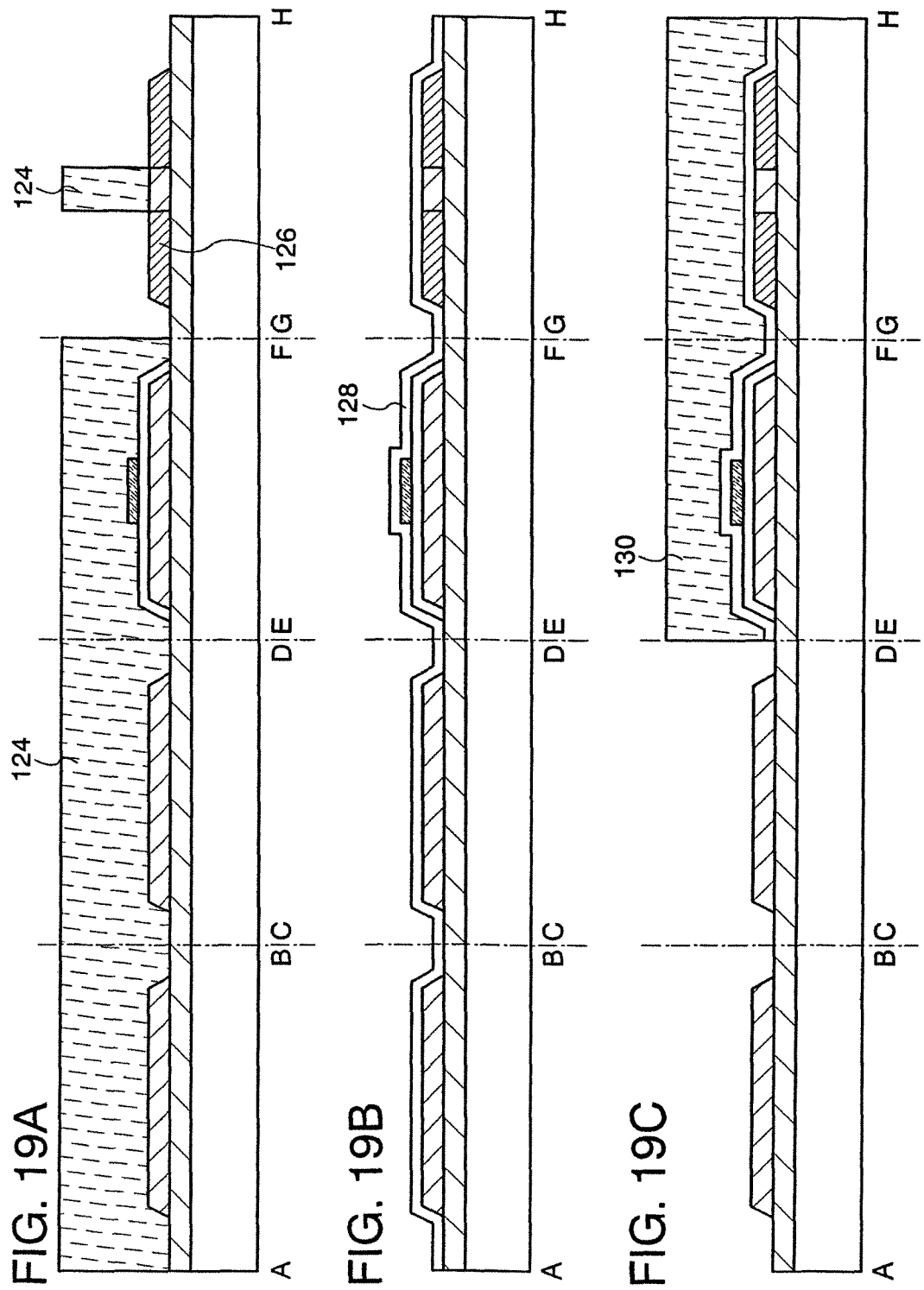

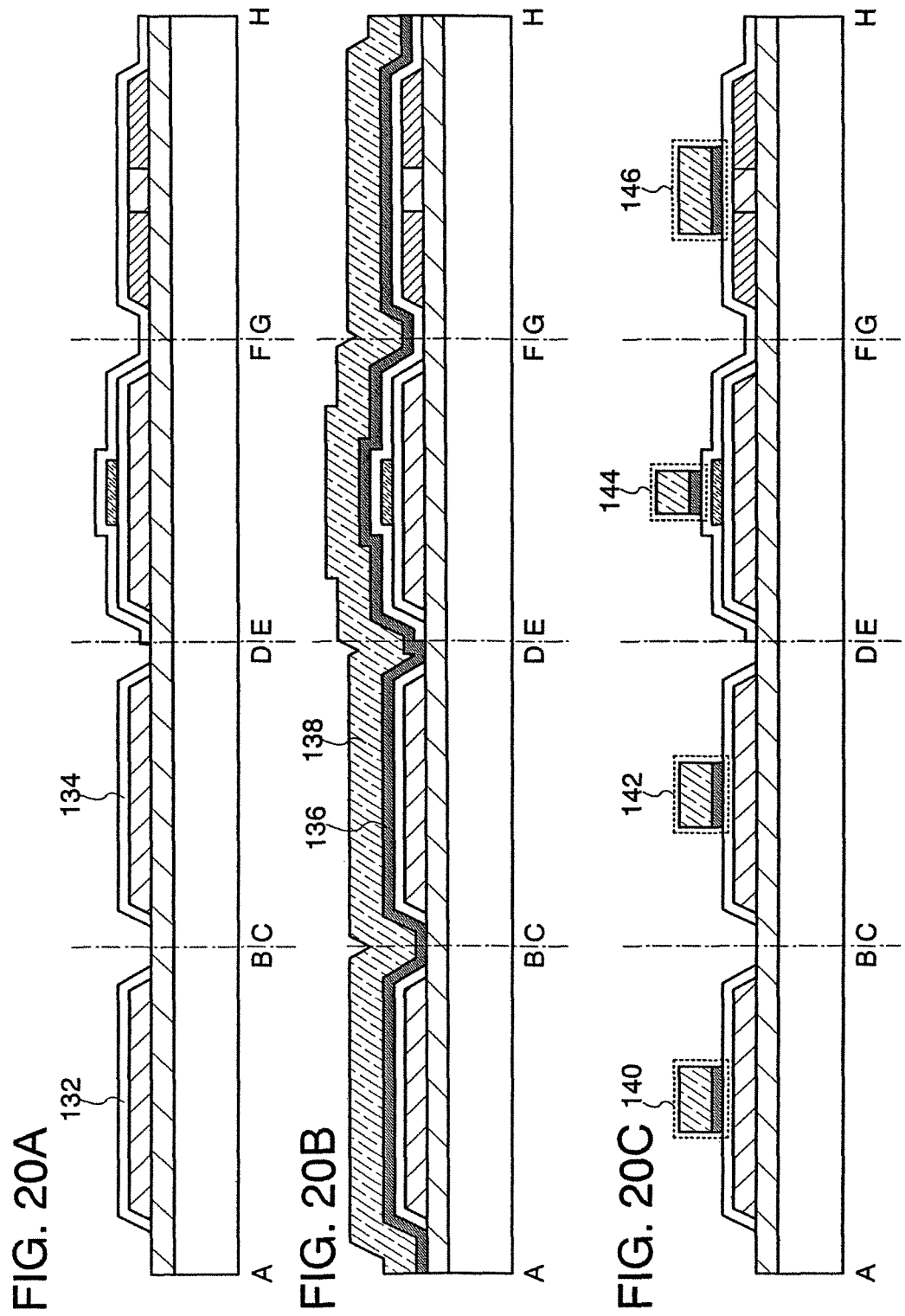

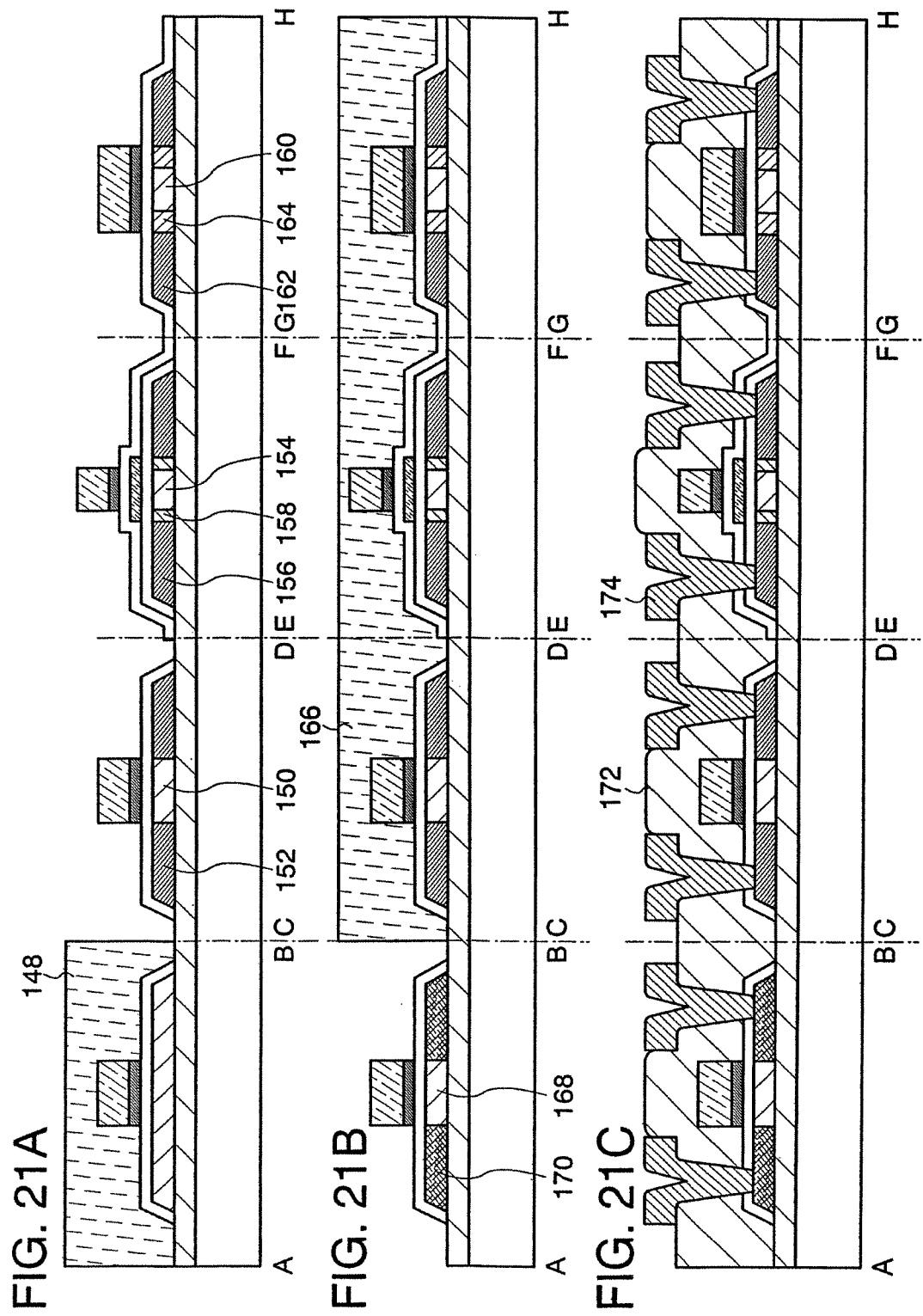

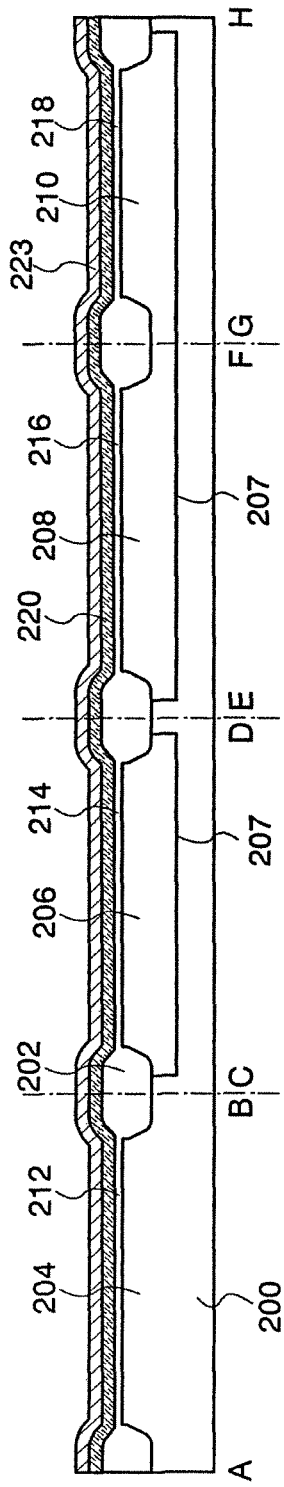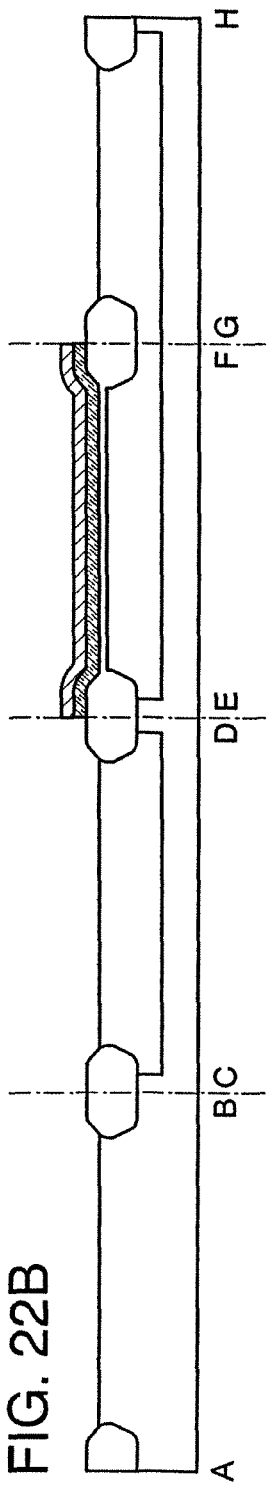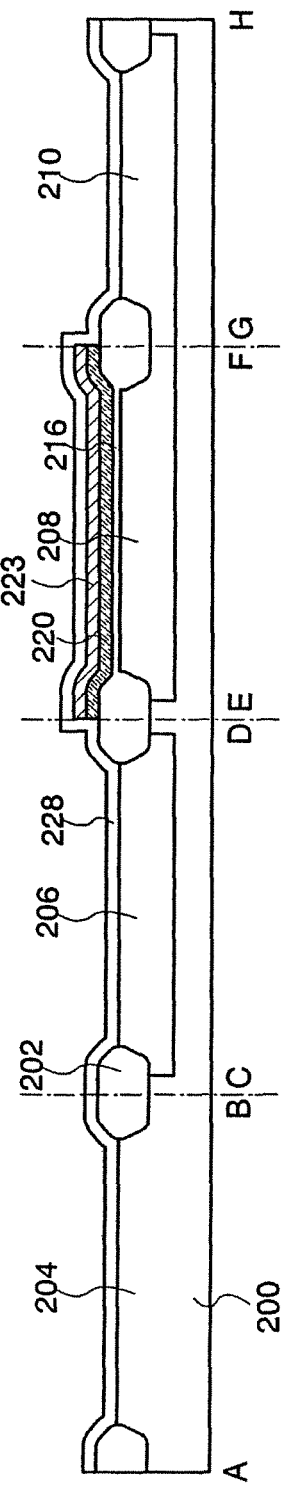

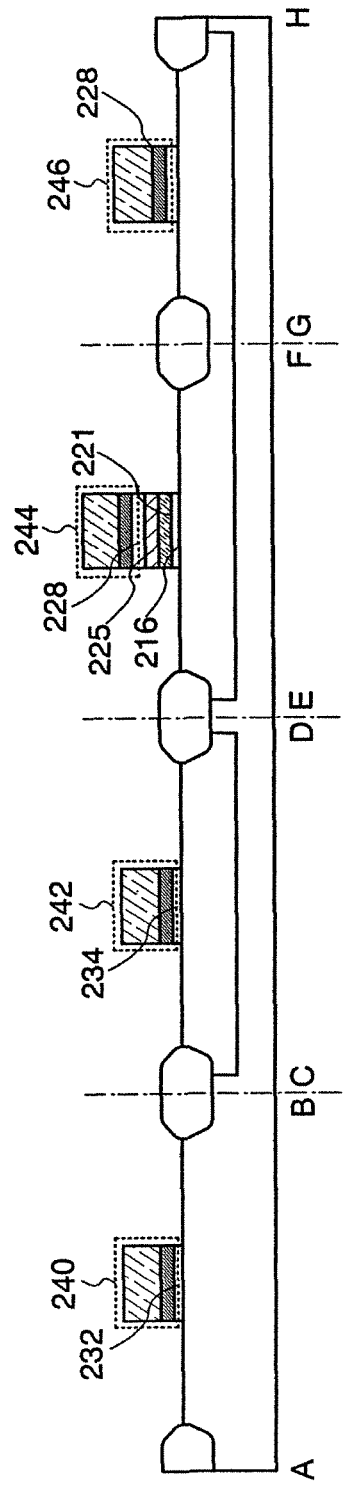
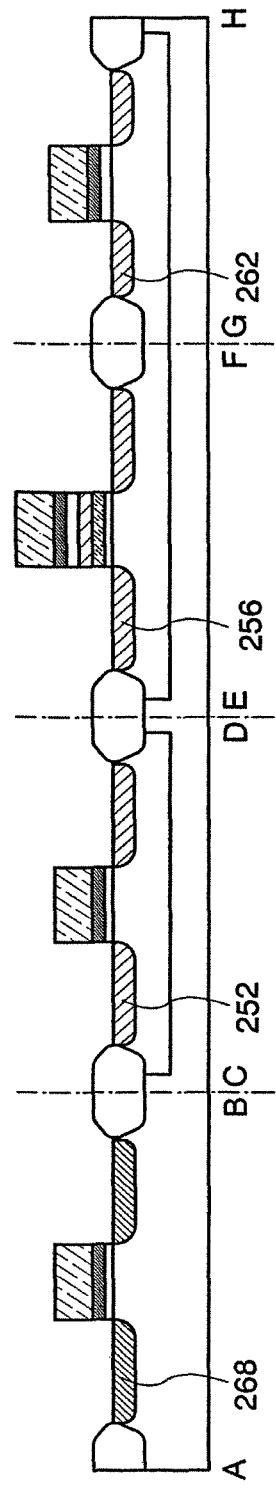
FIG. 24A
FIG. 24B

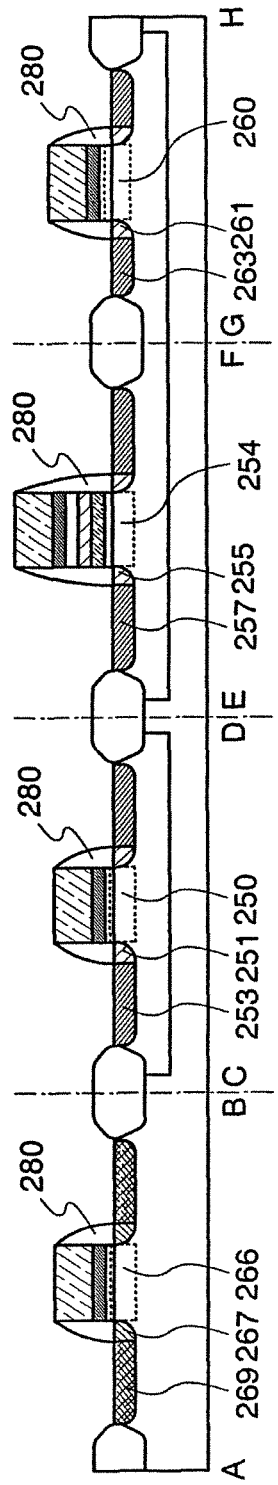
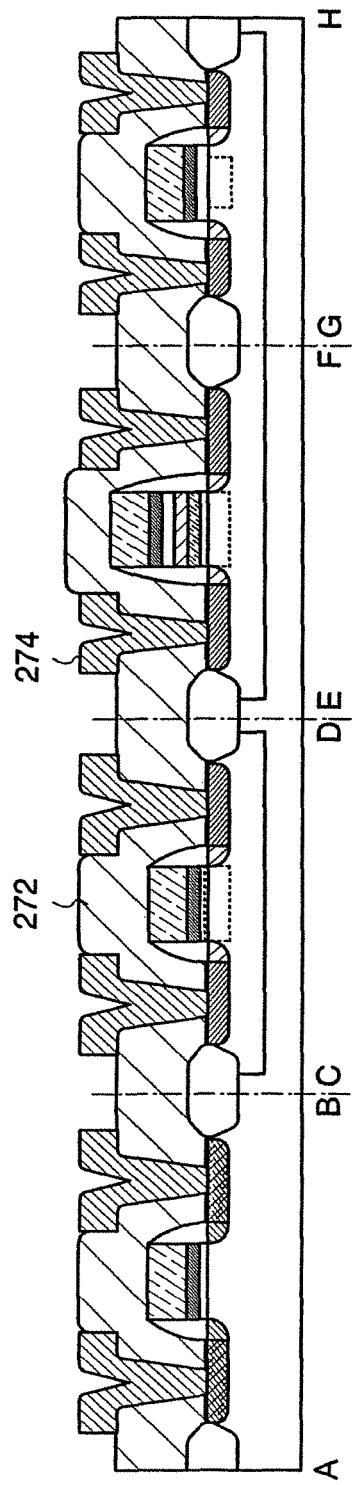
FIG. 25A
FIG. 25B

NONVOLATILE SEMICONDUCTOR MEMORY DEVICE AND MANUFACTURING METHOD THEREOF, SEMICONDUCTOR DEVICE AND MANUFACTURING METHOD THEREOF, AND MANUFACTURING METHOD OF INSULATING FILM

TECHNICAL FIELD

The present invention relates to an insulating film and a manufacturing method thereof. Moreover, the present invention relates to a semiconductor device or a nonvolatile semiconductor memory device and a manufacturing method thereof.

BACKGROUND ART

In recent years, miniaturization of elements has been advanced along with the development of integrated circuits and various high-performance elements. Accordingly, thinning of a gate insulating film of a transistor used as a switching element or the like has been considered.

However, when the gate insulating film is thinned, defects may occur such as leakage current flowing between a gate electrode and a semiconductor film or a semiconductor substrate, which lowers the reliability of a semiconductor device. Therefore, an insulating film with a high withstand voltage has been demanded.

For example, Patent Document 1 discloses a technique to increase the withstand voltage of an oxide film by implanting oxygen ions at the time of forming the oxide film and then by performing heat treatment thereon.

Moreover, it is known that in a general process of forming an oxide film, the oxide film easily takes in hydrogen. By the hydrogen taken into the oxide film, O—H bonds are easily generated, which are the cause of deterioration since the O—H bonds in the oxide film become electron traps to lower the withstand voltage of the oxide film, make a threshold value of an MIS (Metal Insulator Semiconductor) type electric field effect transistor (FET: Field Effect Transistor) vary, and so on. Therefore, the gate insulating film needs to be a film with few electron traps.

[Patent Document 1] Japanese Published Patent Application H5-55200

DISCLOSURE OF INVENTION

It is an object of the present invention to provide a technique to manufacture an insulating film with excellent film characteristics.

It is another object of the present invention to provide a technique to manufacture a dense insulating film with a high withstand voltage.

It is another object of the present invention to provide a technique to manufacture an insulating film with few electron traps.

It is another object of the present invention to provide a technique to manufacture a highly reliable semiconductor device or nonvolatile semiconductor memory device with high yield.

In the present invention, plasma treatment is performed on an insulating film including oxygen by using plasma excited at a high frequency such as by microwave. Specifically, the plasma treatment is performed by using plasma which is excited at a high frequency and which has an electron density of $1\times10^{11}$ cm$^{-3}$ or more and an electron temperature of 1.5 eV or less.

The insulating film including oxygen is formed by a CVD method, a sputtering method, a thermal oxidation method, or the like. For example, as the insulating film including oxygen, a film including silicon oxide, silicon oxynitride ($SiO_xN_y$, x>y>0), silicon nitride oxide ($SiN_xO_y$, x>y>0), aluminum oxide ($Al_xO_y$), tantalum oxide ($Ta_xO_y$), hafnium oxide ($HfO_x$), or the like can be used.

Moreover, in the present invention, plasma treatment is performed on an insulating film including oxygen and hydrogen by using plasma excited at a high frequency such as by microwave. Specifically, the plasma treatment is performed under the conditions where a high frequency is used, the electron density is $1\times10^{11}$ cm$^{-3}$ or more, and the electron temperature is 1.5 eV or less.

The insulating film including oxygen and hydrogen can be formed by a CVD method, a sputtering method, a thermal oxidation method, or the like. When these methods are used, the film easily takes in hydrogen during the formation process. Therefore, for example, when a film including silicon oxide, silicon oxynitride ($SiO_xN_y$, x>y>0), silicon nitride oxide ($SiN_xO_y$, x>y>0), aluminum oxide ($Al_xO_y$), tantalum oxide ($Ta_xO_y$), hafnium oxide ($HfO_x$), or the like is formed by a CVD method, a sputtering method, or a thermal oxidation method, the film can be formed to include hydrogen.

The plasma treatment is performed by using plasma excited at a high frequency such as by microwave. Specifically, the plasma treatment is performed under the conditions where a high frequency is used, the electron density is $1\times10^{11}$ cm$^{-3}$ or more, and the electron temperature is 1.5 eV or less. More specifically, the plasma treatment is preferably performed by using plasma which is excited at a high frequency such as by microwave (typically, 2.45 GHz) and which has an electron density of $1\times10^{11}$ cm$^{-3}$ to $1\times10^{13}$ cm$^{-3}$ and an electron temperature of 0.5 eV to 1.5 eV.

The plasma treatment is performed in an atmosphere including at least oxygen. At this time, the atmosphere preferably includes a noble gas (at least one of He, Ne, Ar, Kr, and Xe) in addition to oxygen. It is to be noted that when the plasma treatment is performed in the atmosphere including the noble gas, the insulating film after the plasma treatment may include the noble gas.

In this specification, the plasma treatment performed in the atmosphere including oxygen under the conditions as aforementioned may be hereinafter referred to as "plasma oxidation".

In the present invention, the hydrogen content (hydrogen concentration) of the insulating film including oxygen and hydrogen can be reduced by performing the plasma treatment on that insulating film. For example, when the plasma treatment is performed under the above conditions, the hydrogen concentration of the film after the plasma treatment can be made to be $5\times10^{19}$ atoms/cm$^3$ or less according to a measurement of the hydrogen concentration by secondary ion mass spectrometry (SIMS).

Moreover, the etching rate of the insulating film including oxygen or the insulating film including oxygen and hydrogen after the plasma treatment is slower than that of the insulating film before the plasma treatment, with respect to 0.5 wt % hydrofluoric acid. For example, when the plasma treatment is performed under the above conditions, the etching rate with respect to the 0.5 wt % hydrofluoric acid can be made to be 8 nm/min or less.

According to a specific structure of the present invention, a semiconductor region is formed, a first insulating film including oxygen and hydrogen is formed over the semiconductor region, the first insulating film is subjected to plasma treatment by using plasma excited by microwave in an atmosphere including oxygen to reduce the hydrogen content of the first insulating film, a floating gate electrode is formed over the first insulating film, a second insulating film is formed over the floating gate electrode, the second insulating film is subjected to plasma treatment by using plasma excited by microwave in an atmosphere including oxygen, a control gate electrode is formed over the second insulating film, and an impurity element is added by using the control gate electrode as a mask to form a pair of impurity regions in the semiconductor region.

According to another structure of the present invention, a semiconductor region is formed, a gate insulating film including oxygen and hydrogen is formed over the semiconductor region, the gate insulating film is subjected to plasma treatment by using plasma excited by microwave in an atmosphere including oxygen to reduce the hydrogen content of the gate insulating film, a gate electrode is formed over the gate insulating film, and an impurity element is added by using the gate electrode as a mask to form a pair of impurity regions in the semiconductor region.

According to another structure of the present invention, an insulating film including oxygen and hydrogen is formed, and the insulating film is subjected to plasma treatment by using plasma excited by microwave in an atmosphere including oxygen to reduce the hydrogen content of the insulating film.

In the above structures, the insulating film including oxygen and hydrogen can be formed by any of a CVD method, a sputtering method, and a thermal oxidation method. Moreover, the insulating film including oxygen and hydrogen can be formed using an insulating film including, for example, silicon oxide, silicon oxynitride, silicon nitride oxide, aluminum oxide, tantalum oxide, or hafnium oxide.

In the above structures, the plasma treatment can be performed on the first insulating film, the second insulating film, the gate insulating film, or the insulating film including oxygen and hydrogen in an atmosphere including a noble gas in addition to oxygen.

Further, another structure of the present invention is a nonvolatile semiconductor memory device including a semiconductor region having a channel formation region between a pair of impurity regions formed apart from each other, a floating gate electrode provided over the semiconductor region with a first insulating film interposed therebetween, and a control gate electrode provided over the floating gate electrode with a second insulating film interposed therebetween. The first insulating film or the second insulating film has a hydrogen concentration of $5 \times 10^{19}$ atoms/cm$^3$ or less according to a measurement of the hydrogen concentration by secondary ion mass spectrometry (SIMS).

The nonvolatile semiconductor memory device having the above structure can use a film that includes a noble gas (such as at least one of He, Ne, Ar, Kr, and Xe) as the first insulating film or the second insulating film.

The nonvolatile semiconductor memory device having the above structure can use the first insulating film or the second insulating film having an etching rate of 8 nm/min or less with respect to 0.5 wt % hydrofluoric acid.

Another structure of the present invention is a semiconductor device including a semiconductor region having a channel formation region between a pair of impurity regions formed apart from each other and a gate electrode provided over the semiconductor region with a gate insulating film interposed therebetween. The gate insulating film has a hydrogen concentration of $5 \times 10^{19}$ atoms/cm$^3$ or less according to a measurement of the hydrogen concentration by secondary ion mass spectrometry (SIMS).

The semiconductor device having the above structure can use a film including a noble gas (such as at least one of He, Ne, Ar, Kr, and Xe) as the gate insulating film.

The semiconductor device having the above structure can use a gate insulating film with an etching rate of 8 nm/min or less with respect to 0.5 wt % hydrofluoric acid.

It is to be noted that the term "semiconductor region" in this specification refers to a region formed in a semiconductor substrate or a semiconductor film formed over a substrate.

By using the present invention, a dense insulating film with a high withstand voltage can be provided.

By using the present invention, an insulating film with a low hydrogen content can be provided.

Moreover, by using the present invention, a dense gate insulating film with a high withstand voltage can be provided. Therefore, leakage current flowing between a gate electrode and a semiconductor region formed in a semiconductor substrate or a semiconductor region (semiconductor film) formed over a substrate can be reduced.

Further, by using the present invention, a gate insulating film with a low hydrogen content and few electron traps can be provided. Therefore, characteristics of an interface between a gate insulating film and a semiconductor region formed in a semiconductor substrate or a semiconductor region (semiconductor film) formed over a substrate can be made favorable.

In addition, by using the present invention, a semiconductor device or nonvolatile semiconductor memory device having a dense film with a high withstand voltage can be provided. Moreover, a semiconductor device or nonvolatile semiconductor memory device with few electron traps can be provided. Therefore, the yield and reliability of a semiconductor device or nonvolatile semiconductor memory device can be improved.

BRIEF DESCRIPTION OF DRAWINGS

In the accompanying drawings:

FIGS. 18A to 18C show an example of a manufacturing method of a nonvolatile semiconductor memory device of the present invention;

FIGS. 19A to 19C show an example of a manufacturing method of a nonvolatile semiconductor memory device of the present invention;

FIGS. 20A to 20C show an example of a manufacturing method of a nonvolatile semiconductor memory device of the present invention;

FIGS. 21A to 21C show an example of a manufacturing method of a nonvolatile semiconductor memory device of the present invention;

FIGS. 22A to 22C show an example of a manufacturing method of a nonvolatile semiconductor memory device of the present invention;

FIGS. 24A and 24B show an example of a manufacturing method of a nonvolatile semiconductor memory device of the present invention;

FIGS. 25A and 25B show an example of a manufacturing method of a nonvolatile semiconductor memory device of the present invention;

BEST MODE FOR CARRYING OUT THE INVENTION

Figure 1A:
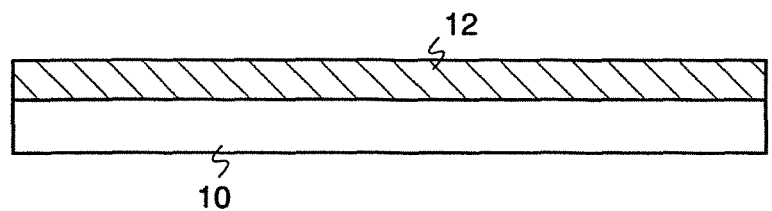
FIGS. 1A to 1C show an example of a manufacturing method of an insulating film of the present invention.

An embodiment mode and embodiments of the present invention are hereinafter explained with reference to the drawings. However, the present invention is not limited to the following description, and it is easily understood by those skilled in the art that the mode and detail can be variously changed without departing from the scope and spirit of the present invention. Therefore, the present invention is not construed as being limited to the description of the embodiment mode and embodiments of the present invention hereinafter shown. It is to be noted that a reference numeral indicating the same part is used in common throughout different drawings in the structures of the present invention hereinafter explained.

Embodiment Mode 1

In the present invention, plasma treatment (plasma oxidation) is performed on an insulating film in an atmosphere including oxygen. Here, an example of performing plasma oxidation on an insulating film formed over a substrate is explained with reference to FIGS. 1A to 1C.

Figure 1B:
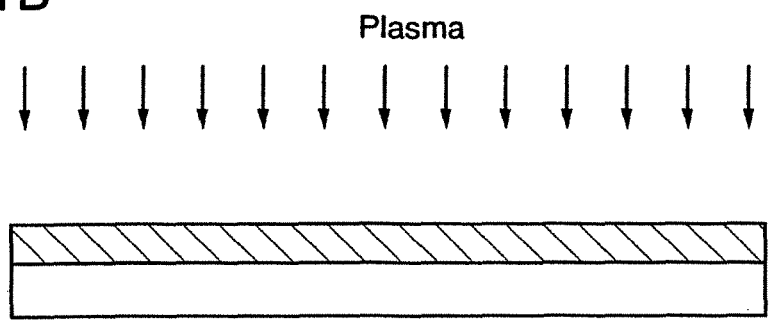
Figure 1C:
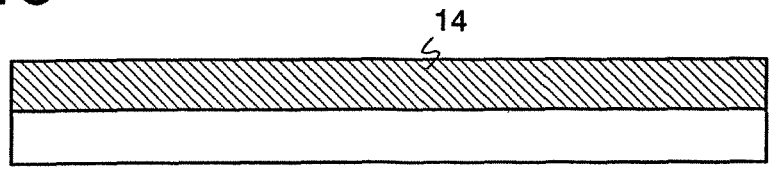

A first insulating film 12 is formed over a substrate 10 (see FIG. 1A). The substrate 10 may be a glass substrate, a quartz substrate, a sapphire substrate, a ceramic substrate, a metal substrate, or the like. Moreover, these substrates may be provided with a component of a general semiconductor device, such as an insulating film, a semiconductor film, or a gate electrode. In addition, a semiconductor substrate such as a Si substrate, or a semiconductor substrate provided with a component of a general semiconductor device may be used. Further, a plastic substrate made of polyethylene terephthalate (PET), polyethylene naphthalate (PEN), polyether sulfone (PES), acrylic, or the like, or a plastic substrate provided with a component of a general semiconductor device may be used.

The first insulating film 12 is a film which is subjected to plasma oxidation after it has been formed. As the first insulating film 12, a film including at least oxygen is formed. Specifically, a film including silicon oxide, silicon oxynitride ($SiO_xN_y$, x>y>0), silicon nitride oxide ($SiN_xO_y$, x>y>0), aluminum oxide ($Al_xO_y$), tantalum oxide ($Ta_xO_y$), hafnium oxide ($HfO_x$), or the like may be formed. Moreover, the first insulating film 12 can be formed by a CVD method (such as a plasma CVD method or an LPCVD method), a sputtering method, a thermal oxidation method, or the like.

Figure 3:
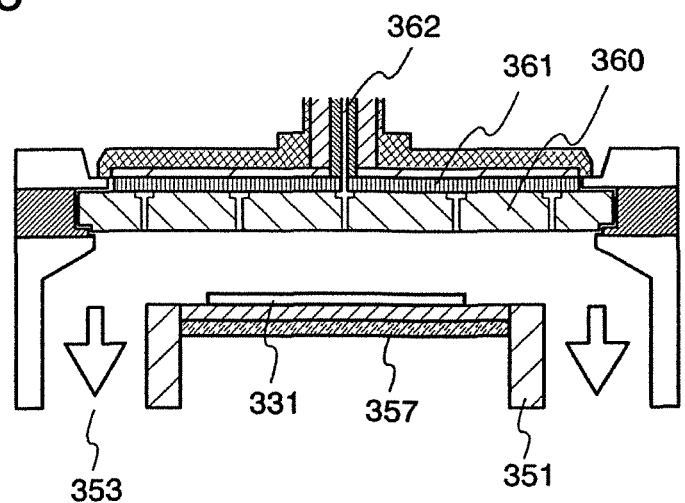
FIG. 3 shows an example of an apparatus for manufacturing an insulating film of the present invention.

As an example, a method for forming the first insulating film 12 by a plasma CVD method is explained. FIG. 3 shows a structure example of an apparatus for forming a film (here corresponding to the first insulating film 12) by a plasma CVD method. The plasma CVD apparatus shown in FIG. 3 has a process chamber provided with a support base 351 for having a substrate 331 to be processed (here corresponding to the substrate 10) set thereon, an electrode plate 360 having small openings through which gas is introduced, a high-frequency electric power introducing portion 361, a gas introducing portion 362, and an evacuation port 353. When the support base 351 is provided with a temperature controlling portion 357, the temperature of the substrate 331 to be processed can be controlled.

A desired film can be formed by introducing into the process chamber, a material gas in accordance with a film to be formed over the substrate 331 to be processed. For example, when a silicon oxynitride film is formed as the first insulating film 12, a silane ($SiH_4$) gas and a nitrogen suboxide ($N_2O$) gas may be introduced into the process chamber.

Next, plasma oxidation is performed on the first insulating film 12 (see FIG. 1B), whereby a second insulating film 14 (see FIG. 1C) is formed. The plasma oxidation is performed by using plasma which is excited at a high frequency such as by microwave (typically, 2.45 GHz) and which has an electron density of $1\times10^{11}$ cm$^{-3}$ or more and an electron temperature of 1.5 eV or less. More specifically, plasma with an electron density of $1\times10^{11}$ cm$^{-3}$ to $1\times10^{13}$ cm$^{-3}$ and an electron temperature of 0.5 eV to 1.5 eV is preferably used. Moreover, the atmosphere in which the plasma oxidation is performed includes at least oxygen and may include a noble gas (at least one of He, Ne, Ar, Kr, and Xe) in addition to oxygen. As the noble gas, for example, Ar can be used. Moreover, a mixed gas of Ar and Kr can be used as the noble gas.

When the plasma oxidation is performed on the first insulating film 12 in the atmosphere including a noble gas, the first insulating film 12 may include the noble gas (at least one of He, Ne, Ar, Kr, and Xe) used for the plasma treatment. For example, when Ar is used as the noble gas, the second insulating film 14 formed by plasma oxidation may include Ar.

Figure 2:
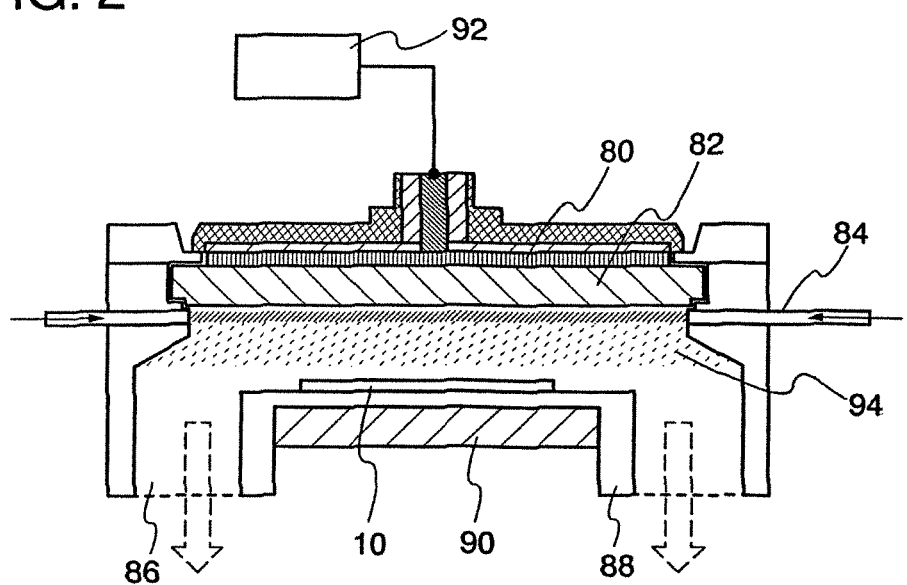
FIG. 2 shows an example of a manufacturing method of an insulating film of the present invention.

FIG. 2 shows a structure example of an apparatus for performing plasma oxidation. The plasma treatment apparatus shown in FIG. 2 has a support base 88 for having the substrate 10 provided with a film on which the plasma oxidation is performed (corresponding to the substrate 10 provided with the first insulating film 12, which is shown in FIG. 1A) set thereon, a gas supplying portion 84 for introducing gas, an evacuation port 86 which is connected to a vacuum pump for evacuating gas, an antenna 80, a dielectric plate 82, and a microwave supplying portion 92 for supplying a microwave to generate plasma. Moreover, when the support base 88 is provided with a temperature controlling portion 90, the temperature of the substrate 10 can be controlled.

A specific example of performing the plasma oxidation on the first insulating film 12 by using the plasma treatment apparatus shown in FIG. 2 is hereinafter explained. First, the process chamber of the plasma treatment apparatus shown in FIG. 2 is drawn to vacuum. Then, gas for the plasma treatment, which includes at least oxygen, is introduced through the gas supplying portion 84. The substrate 10 is kept at room temperature or heated at 100° C. to 550° C. by the temperature controlling portion 90. The distance between the substrate 10 and the dielectric plate 82 (hereinafter also called electrode interval) ranges from about 20 mm to 80 mm (preferably from 20 mm to 60 mm). Next, microwave (frequency of 2.45 GHz) is supplied from the microwave supplying portion 92 to the antenna 80. Then, the microwave is introduced from the antenna 80 into the process chamber through the dielectric plate 82, whereby plasma 94 is generated. When the plasma is excited by the introduction of the microwave, the plasma can be generated to have a low electron temperature (3 eV or less, preferably 1.5 eV or less) and a high electron density ($1\times10^{11}$ cm$^{-3}$ or more). It is to be noted that, in this specification, the plasma generated to have the low electron temperature and the high electron density by the introduction of the microwave may be called high-density plasma. The first insulating film 12 is oxidized by an oxygen radical (hereinafter may be referred to as (O*)) produced by this high-density plasma. At this time, when a noble gas such as argon is mixed with the gas for the plasma treatment, the oxygen radical can be produced efficiently because of an excited species of the noble gas. In this method, oxidation by a solid-phase reaction at a low temperature of 500° C. or lower is possible by efficiently using an active radical excited by the plasma.

For example, description is made of a case of performing plasma treatment in an atmosphere including an oxygen gas ($O_2$) and an argon gas (Ar) by using the plasma treatment apparatus shown in FIG. 2. From the oxygen gas ($O_2$) and the argon gas (Ar) introduced into the plasma treatment apparatus, high-density plasma in which the oxygen gas and the argon gas are mixed is generated by the microwave. In the high-density plasma in which the oxygen gas and the argon gas are mixed, the argon gas is excited by the introduced microwave to produce an argon radical (hereinafter also referred to as (Ar*)), and an oxygen radical (O*) is produced by collision between the argon radical (Ar*) and an oxygen molecule. Then, the produced oxygen radical (O*) and the first insulating film 12 formed over the substrate 10 are reacted with each other to form the second insulating film 14.

The second insulating film 14 is a dense film with a high withstand voltage, which is obtained by performing plasma treatment on the first insulating film 12 in an atmosphere including oxygen. Moreover, the second insulating film 14 can be manufactured by a lower temperature process than in a conventional thermal oxidation method. By using the present invention, a film with favorable film characteristics can be formed even over a substrate made of glass or the like which is sensitive to heat.

For example, the second insulating film 14 obtained by performing the plasma treatment on the first insulating film 12 in the atmosphere including oxygen can have an etching rate of 8 nm/min or less with respect to 0.5 wt % hydrofluoric acid.

When the first insulating film 12 is formed by a CVD method, a sputtering method, or a thermal oxidation method such as wet oxidation, the film includes hydrogen. However, when the plasma oxidation is performed, the hydrogen content of the film can be reduced. By using the present invention, hydrogen causing generation of electron traps in the insulating film can be decreased.

For example, the second insulating film 14 obtained by performing the plasma treatment on the first insulating film 12 in the atmosphere including oxygen can have a hydrogen concentration of $5\times10^{19}$ atoms/cm$^3$ or less according to a measurement of the hydrogen concentration by secondary ion mass spectrometry (SIMS).

Here, estimated structures of the insulating film before and after the plasma oxidation treatment are explained.

As aforementioned, when a film including oxygen is formed by a CVD method, a sputtering method, or a thermal oxidation method such as wet oxidation, the film easily takes in hydrogen. At this time, some of the hydrogen taken into the film including oxygen is considered to form O—H bonds with oxygen in the film.

When the plasma oxidation is performed on the film including hydrogen such as O—H bonds, hydrogen desorption due to an oxygen radical or a substitution reaction between hydrogen and oxygen occurs so that the hydrogen content of the film is considered to be reduced.

In this manner, the hydrogen in the film is desorbed by an oxygen radical, or a substitution reaction between hydrogen and oxygen occurs, whereby the O—H bonds in the film decrease. Accordingly, electron traps due to the O—H bonds in the insulating film can be decreased.

Moreover, it is considered that a dense film with a high withstand voltage can be formed by desorption of hydrogen in the film due to an oxygen radical or by a substitution reaction between hydrogen and oxygen in the film, which causes hydrogen in the film to decrease.

As thus described, by using the present invention, a dense insulating film with a high withstand voltage can be formed. Moreover, an insulating film with few electron traps can be formed by reducing the hydrogen content of the film. Therefore, an insulating film with excellent film characteristics can be provided.

Embodiment 1

In this embodiment, an example of a manufacturing method of a semiconductor device using the present invention is explained. Here, description is made of a case of manufacturing a gate insulating film of a thin film transistor (hereinafter also called TFT) by using the present invention. In the structure of the present invention hereinafter explained, a reference numeral indicating the same element is used in common in different drawings, and the description of such an element may be omitted.

Figure 4A:
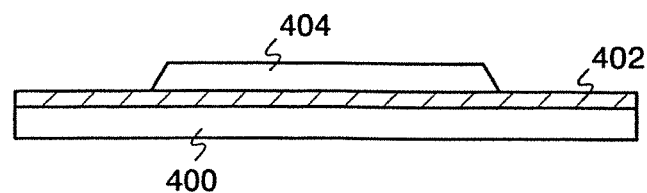
FIGS. 4A to 4D show an example of a manufacturing method of a semiconductor device of the present invention.

First, a base insulating film 402 is formed over a substrate 400 (see FIG. 4A). The substrate 400 may be a glass substrate, a quartz substrate, a sapphire substrate, a ceramic substrate, a metal substrate, or the like. Moreover, a plastic substrate made of polyethylene terephthalate, polyethylene naphthalate, polyether sulfone, acrylic, or the like can also be used. In addition, a substrate which can withstand at least heat generated in the process can be used. In this embodiment, a glass substrate is used as the substrate 400.

The base insulating film 402 is formed of an insulating material such as silicon oxide, silicon nitride, silicon oxynitride ($SiO_xN_y$, x>y>0), or silicon nitride oxide ($SiN_xO_y$, x>y>0). The base insulating film 402 may have either a single-layer or multilayer structure. A method of forming the base insulating film 402 is not limited in particular, and a CVD method, a sputtering method, or the like can be used. By providing the base insulating film 402, impurity diffusion from the substrate can be prevented. If unevenness of the substrate 400 and impurity diffusion do not cause any problems, the base insulating film 402 does not have to be provided. In this embodiment, the base insulating film 402 is formed using a silicon nitride oxide film as a first layer and a silicon oxynitride film as a second layer by a plasma CVD method.

Next, an island-like semiconductor film 404 is formed over the base insulating film 402 (see FIG. 4A). The island-like semiconductor film 404 can be formed in such a way that an amorphous semiconductor film is formed of a material including silicon (Si) as its main component (such as Si or the amorphous semiconductor film is crystallized, and then the crystallized semiconductor film is selectively etched. The amorphous semiconductor film can be formed by a CVD method, a sputtering method, or the like. The amorphous semiconductor film is not necessarily crystallized. When the amorphous semiconductor film is not crystallized, the amorphous semiconductor film is selectively etched to form the island-like semiconductor film 404 including the amorphous semiconductor film.

When the amorphous semiconductor film is crystallized, a laser crystallization method, a thermal crystallization method using RTA or an annealing furnace, a thermal crystallization method using a metal element promoting crystallization, a method in which any of these methods is combined with another, or the like can be used.

When the semiconductor film is crystallized or recrystallized by laser irradiation, a semiconductor laser (LD) pumped continuous wave (CW) laser ($YVO_4$, second harmonic (wavelength 532 nm)) can be used as a light source of laser light. It is not necessary to limit to the second harmonic in particular; however, the second harmonic is superior to other higher harmonics in terms of energy efficiency. When a semiconductor film is irradiated with a CW laser, the semiconductor film can receive energy continuously. Therefore, once the semiconductor film is melted, the melted state can be continued. Moreover, a solid-liquid interface of the semiconductor film can be moved by scanning a CW laser, and a crystal grain which is long in one direction along this moving direction can be formed. In addition, a solid-state laser is used because highly stable output and stable processing are expected as compared with a gas laser and the like. It is to be noted that not only a CW laser but also a pulsed laser with a repetition rate of 10 MHz or more can be used. With a pulsed laser having a high repetition rate, when a period for the melted semiconductor film to solidify is shorter than the pulse interval of the laser, the semiconductor film can remain melted constantly, which enables the semiconductor film to have a crystal grain that is long in one direction by the movement of the solid-liquid interface. Other CW lasers and pulsed lasers with repetition rates of 10 MHz or more can be used. For example, an Ar laser, a Kr laser, a $CO_2$ laser, or the like can be used as a gas laser. Moreover, a metal vapor laser such as a helium-cadmium laser is given as a gas laser. A YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like can be used as a solid-state laser. Moreover, among the solid-state lasers, a YAG laser, a $Y_2O_3$ laser, a $GdVO_4$ laser, a $YVO_4$ laser, or the like can also be used as a ceramic laser. It is preferable to emit laser light with $TEM_{00}$ (single transverse mode) from a laser oscillator because a linear beam spot on a surface to be irradiated can have more homogeneous energy. Besides those above, a pulsed excimer laser may be used.

Figure 4B:
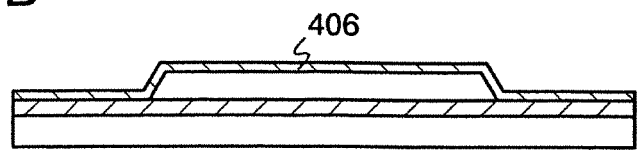

Next, a first insulating film 406 is formed over the semiconductor film 404 (see. FIG. 4B). A film including at least oxygen is formed as the first insulating film 406. For example, the first insulating film 406 is formed of silicon oxide, silicon oxynitride ($SiO_xN_y$, x>y>0), silicon nitride oxide ($SiN_xO_y$, x>y>0), aluminum oxide ($Al_xO_y$), tantalum oxide ($TaO_x$), or the like. In addition, a material with high dielectric constant such as hafnium oxide ($HfO_x$) can be used. The first insulating film 406 is formed by a CVD method, a sputtering method, or the like. For example, when silicon oxide or silicon oxynitride is used, the film thickness preferably ranges from 1 nm to 100 nm, more preferably, from 1 nm to 40 nm.

When a silicon oxynitride film is formed as the first insulating film 406, the first insulating film 406 can be formed by a plasma CVD method using a silane ($SiH_4$) gas and a nitrogen suboxide ($N_2O$) gas as a material gas. An example of conditions of forming the silicon oxynitride film at this time is shown below.

The gas mass flow rate of the material gas is set to $SiH_4$: $N_2O$=1:800 (sccm). The gas mass flow rate in this specification refers to a rate of gas mass flow (sccm) between the $SiH_4$ gas and the $N_2O$ gas which are supplied to a film-forming chamber. The high-frequency electric power is set to 150 W at a frequency of 60 MHz, the film-forming temperature (substrate temperature) is set to 400° C., the pressure in the process chamber is set to 40 Pa, and the electrode interval is set to 28 mm.

Figure 4C:
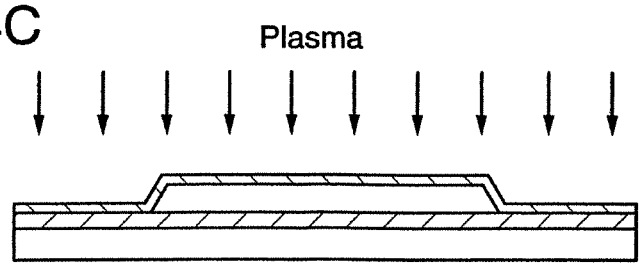
Figure 4D:
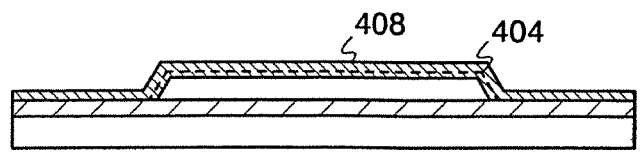

The first insulating film 406 is subjected to plasma oxidation (see FIG. 4C), whereby a second insulating film 408 is formed (see FIG. 4D). The plasma oxidation is performed by using plasma which is excited at a high frequency such as by microwave (typically, 2.45 GHz) and which has an electron density of $1\times10^{11}$ cm$^{-3}$ or more and a plasma electron temperature of 1.5 eV or less. Specifically, plasma with an electron density of $1\times10^{11}$ cm$^{-3}$ to $1\times10^{13}$ cm$^{-3}$ and a plasma electron temperature of 0.5 eV to 1.5 eV is preferably used.

Moreover, the plasma oxidation time performed on the first insulating film 406 is preferably 60 seconds or longer.

The plasma oxidation is performed in an atmosphere including at least oxygen. For example, the atmosphere preferably includes oxygen ($O_2$); oxygen ($O_2$) and a noble gas (at least one of He, Ne, Ar, Kr, and Xe); or oxygen ($O_2$), a noble gas (at least one of He, Ne, Ar, Kr, and Xe), and hydrogen ($H_2$). When the atmosphere includes hydrogen ($H_2$), the amount of hydrogen is preferably less than that of oxygen and the noble gas.

In this embodiment, the plasma oxidation is performed in an atmosphere including oxygen ($O_2$) and argon (Ar). Specifically, a mixed gas of oxygen and argon is introduced as a gas for the plasma treatment into the process chamber of the plasma treatment apparatus as shown in FIG. 2. For example, the oxygen may be introduced at 0.1 to 100 sccm, and the argon may be introduced at 100 to 5000 sccm. Here, an oxygen gas is introduced at 5 sccm, and an argon gas is introduced at 900 sccm. The substrate temperature is set to 400° C., and the pressure in the process chamber is set to 106.67 Pa. Moreover, microwave with a frequency of 2.45 GHz is used for the plasma excitation.

The plasma oxidation in the present invention is performed under the conditions where the plasma electron density is high at $1\times10^{11}$ cm$^{-3}$ or more and the electron temperature is low in the vicinity of the first insulating film 406, which is an object to be processed; therefore, it is possible to prevent the second insulating film 408 from being damaged due to the plasma. Moreover, since the plasma electron density is high at $1\times10^{11}$ cm$^{-3}$ or more, a film (here, the second insulating film 408) formed by performing the plasma oxidation on the object to be processed (here, the first insulating film 406) can be made to be a dense film with a high withstand voltage as compared with a film formed by a CVD method, a sputtering method, or the like. Moreover, since the plasma electron temperature is low at 1.5 eV or less, the oxidation treatment can be performed on the object to be processed at lower temperature than in a conventional plasma treatment or thermal oxidation method. For example, plasma oxidation at 100° C. or more below the distortion point of the glass substrate can be used to perform oxidation treatment sufficiently.

By the plasma oxidation under the aforementioned conditions, the dense film with a high withstand voltage can be obtained. Moreover, the film with a reduced hydrogen content can be obtained by performing the plasma oxidation on an insulating film including hydrogen formed by a CVD method or a sputtering method.

In this embodiment, the plasma oxidation is performed on the first insulating film 406 formed over the semiconductor film 404. At this time, the surface of the semiconductor film 404 that is in contact with the first insulating film 406 is also oxidized depending on the film thickness of the first insulating film 406. For example, when the first insulating film 406 has a thickness of 40 nm or less, the surface of the semiconductor film 404 that is in contact with the first insulating film 406 may also be oxidized. Therefore, the film thickness of the semiconductor film 404 may decrease after the plasma treatment performed on the first insulating film 406 (FIG. 4D).

This is because when the first insulating film 406 is thin, an oxygen radical transmits through the first insulating film 406 sufficiently. The oxygen radical transmitted through the first insulating film 406 oxidizes the surface of the semiconductor film 404. The oxidized surface of the semiconductor film 404 serves as a part of the second insulating film 408. As a result, the film thickness of the semiconductor film 404 decreases so that the second insulating film 408 becomes thicker than the first insulating film 406. FIG. 4D shows an example in which the semiconductor film 404 becomes thinner after the plasma treatment and an outer edge of the semiconductor film 404 before the plasma treatment is shown with a dotted line.

Here, results of measuring the film thicknesses of the semiconductor film and the insulating film formed over the semiconductor film before and after the plasma oxidation treatment are shown in Chart 1. The measurement was conducted by spectroscopic ellipsometry using a sample in which a crystalline silicon film and a silicon oxide film were stacked over a glass substrate. As a measurement apparatus, "spectroscopic ellipsometer UVISEL" manufactured by HORIBA, Ltd. was used. The silicon oxide film was obtained by forming a silicon oxide film by a CVD method and then performing plasma oxidation on the silicon oxide film. The plasma oxidation was performed under the following conditions: the flow rate of $O_2$ was 5 sccm, the flow rate of Ar was 900 sccm, the flow rate of $H_2$ was 5 sccm, the pressure in the process chamber was 106.67 Pa, the high-frequency electric power was 3800 W (2.45 GHz), and the substrate temperature was 400° C.

CHART 1

|  | Before the plasma oxidation | After the plasma oxidation | Film thickness change |
|---|---|---|---|
| Film thickness of $SiO_2$ (nm) | 10.68 | 15.95 | 5.27 |
| Film thickness of Si (nm) | 60.23 | 57.78 | −2.45 |

As shown in Chart 1, the film thickness of the silicon oxide ($SiO_2$) film increased by 5.27 nm and that of the crystalline silicon (Si) film decreased by 2.45 nm after the plasma oxidation. Accordingly, it was understood that the crystalline silicon film became thinner and the silicon oxide film became thicker by the plasma oxidation. Moreover, it is considered that the crystalline silicon film becomes thinner because an oxygen radical, which is produced by high-density plasma, transmits through the silicon oxide film to oxidize the surface of the crystalline silicon film.

When the plasma oxidation is performed on the first insulating film 406 in an atmosphere including a noble gas, the first insulating film 406 may include the noble gas used in the plasma treatment (at least one of He, Ne, Ar, Kr, and Xe). For example, when Ar is used as the noble gas, the second insulating film 408 formed by the plasma oxidation may include Ar.

The second insulating film 408 formed by the above steps functions as a gate insulating film of a transistor. Therefore, the gate insulating film can be formed to be dense and have a high withstand voltage. Moreover, the gate insulating film can have a reduced hydrogen content and few electron traps as compared with a film formed by a CVD method, a sputtering method, or the like.

Figure 5A:
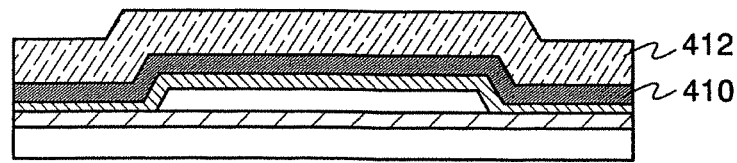
FIGS. 5A to 5D show an example of a manufacturing method of a semiconductor device of the present invention.

Subsequently, a conductive film is formed over the second insulating film 408 (see FIG. 5A). Here, an example of stacking a conductive film 410 and a conductive film 412 is shown. It is needless to say that the conductive film may be formed as a single layer or a stack of three or more layers, as well.

The conductive films 410 and 412 can be formed of an element selected from tantalum (Ta), tungsten (W), titanium (Ti), molybdenum (Mo), aluminum (Al), copper (Cu), chromium (Cr), niobium (Nb), and the like, or an alloy or compound material including any of these elements as its main component. In addition, the conductive films 410 and 412 can be formed using a metal nitride film obtained by nitriding any of these elements. Moreover, a semiconductor material typified by polycrystalline silicon doped with an impurity element such as phosphorus can be used. The conductive films 410 and 412 can be formed using these materials by a CVD method, a sputtering method, or the like.

Here, the conductive film 410 is formed of tantalum nitride, and the conductive film 412 is formed of tungsten over the conductive film 410. In addition, the conductive film 410 can be formed as a single layer or a stack of layers using a material selected from tungsten nitride, molybdenum nitride, and titanium nitride, and the conductive film 412 can be formed as a single layer or a stack of layers using a material selected from tantalum, molybdenum, and titanium.

Next, the conductive film 410 and the conductive film 412 are selectively etched so that the conductive film 410 and the conductive film 412 remain over a part of the semiconductor film 404. Thus, a conductive film 414 and a conductive film 416 which form a gate electrode 418 are formed (see FIG. 5B). Although end portions of the conductive film 414 and the conductive film 416 of the gate electrode 418 approximately match with each other in this embodiment, the present invention is not limited to this. For example, the width of the conductive film 414 formed below (the width in a direction approximately parallel to a direction where carriers flow in a channel formation region (a direction connecting a source region and a drain region)) may be larger than the width of the conductive film 416.

Next, an impurity element is added by using the gate electrode 418 as a mask, whereby a pair of impurity regions 422 and a channel formation region 420 between the pair of impurity regions 422 (see FIG. 5C) are formed. The impurity regions 422 formed here each function as a source or drain region of a transistor. As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is added as the impurity element.

Subsequently, an insulating film is formed so as to cover the second insulating film 408 and the gate electrode 418 (the conductive films 416 and 414) (see FIG. 5D). Here, an example in which a third insulating film 424 and a fourth insulating film 426 are stacked as the insulating film is shown. The present invention is not limited in particular, and the insulating film can be formed as a single layer or a stack of three or more layers, as well.

The third insulating film 424 and the fourth insulating film 426 can be formed using an insulating film including oxygen or nitrogen, such as silicon oxide, silicon nitride, silicon oxynitride ($SiO_xN_y$, x>y>0), or silicon nitride oxide ($SiN_xO_y$, x>y>0); a film including carbon such as DLC (diamond-like carbon); or a film including a siloxane material such as a siloxane resin or an organic material such as epoxy, polyimide, polyamide, polyvinylphenol, benzocyclobutene, or acrylic. The siloxane material corresponds to a material including a Si—O—Si bond. Siloxane has a skeletal structure including a bond of silicon (Si) and oxygen (O). For a substituent, an organic group including at least hydrogen (such as an alkyl group or aromatic hydrocarbon) is used. A fluoro group can also be used for a substituent. In addition, an organic group including at least hydrogen and a fluoro group may be used for a substituent. The third insulating film 424 and the fourth insulating film 426 can be formed of these materials by a CVD method, a sputtering method, a coating method, or the like. When the insulating film is formed of an organic material or a siloxane material, the step due to the semiconductor film, the gate electrode, and the like can be flattened. However, a film formed of an organic material or a siloxane material easily absorbs and transmits moisture. Therefore, if the semiconductor film, the gate insulating film, the gate electrode, and the like were formed in contact with the film formed of an organic material or a siloxane material, the electrical characteristics of a completed transistor would be adversely affected. Accordingly, a film formed of an inorganic material having a high blocking effect against moisture is preferably formed in contact with the semiconductor film, the gate insulating film, the gate electrode, and the like. In particular, a film including silicon nitride, silicon nitride oxide, or the like is preferable because of having a high blocking effect against moisture. Here, the third insulating film 424 is formed using a film including an inorganic material and the fourth insulating film 426 is formed using a film including an organic material or a siloxane material over the third insulating film 424.

Subsequently, openings reaching the impurity regions 422 formed in the semiconductor film 404 are provided in the third insulating film 424 and the fourth insulating film 426. Then, a conductive film 428 electrically connected to the impurity regions 422 formed in the semiconductor film 404 is formed (see FIG. 5D). Although an example of forming the conductive film 428 as a single layer is shown here, the conductive film 428 may be formed as a stack of two or more layers. The conductive film 428 functions as a source or drain wiring of a transistor.

The conductive film 428 can be formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy or compound material including any of these elements as its main component, by a CVD method, a sputtering method, or the like. For example, as an alloy material including aluminum as its main component, the following can be used: a material including aluminum as its main component and also including nickel; or a material including aluminum as its main component and also including nickel and one or both of carbon and silicon. As the conductive film 428, for example, a stacked structure of a barrier film, an aluminum-silicon (Al—Si) film, and another barrier film, or a stacked structure of a barrier film, an aluminum-silicon (Al—Si) film, a titanium nitride (TiN) film, and another barrier film is preferably employed. It is to be noted that the barrier film corresponds to a thin film of titanium, titanium nitride, molybdenum, or molybdenum nitride. Since aluminum and aluminum silicon have low resistance and are inexpensive, they are suitable for forming the conductive film 428. When barrier layers are formed as an upper layer and a lower layer, the generation of a hillock in aluminum and aluminum silicon can be prevented. Moreover, when the barrier film is formed of titanium, which is an element with a high reducing property, even if a thin natural oxide film is formed over the crystalline semiconductor film, favorable contact with the crystalline semiconductor film can be made by reducing this natural oxide film.

In accordance with these steps, a semiconductor device of the present invention can be manufactured. The structure of the transistor shown in this embodiment is just an example, and various known structures can be employed. For example, an LDD region may be formed in the semiconductor film, and a side surface of the gate electrode may be provided with a sidewall. Moreover, a multigate structure (a structure having a semiconductor film including at least two channel formation regions connected serially to each other, and at least two gate electrodes for applying an electric field to the channel formation regions, respectively) or a dual gate structure (a structure in which a semiconductor film is sandwiched between upper and lower gate electrodes) may be applied.

By using the present invention, the dense gate insulating film which is relatively thin and has a high withstand voltage can be achieved. Moreover, the gate insulating film having favorable film characteristics can be achieved without performing high-temperature heat treatment. In addition, when the gate insulating film is formed by performing the plasma oxidation on an insulating film formed by a CVD method or a sputtering method, the semiconductor film can be covered sufficiently. Therefore, it is possible to prevent defects such as leakage current or short-circuiting between the gate electrode and the channel formation region of the semiconductor film due to a defect in withstand voltage (also referred to as decrease in withstand voltage) of the gate insulating film or a defect in coverage of the gate insulating film, whereby a highly reliable semiconductor device can be manufactured.

Moreover, the film thickness of the gate insulating film which is dense and which has a high withstand voltage and favorable coverage can be decreased; therefore, further miniaturization and higher precision of the semiconductor device can be achieved, which leads to higher performance of the semiconductor device. In addition, since defects due to a defective shape of such a film are decreased, the semiconductor devices can be produced with high yield in a manufacturing process thereof and the reliability of the semiconductor device to be completed can be improved.

When the gate insulating film is formed by the present invention, the hydrogen content can be decreased as compared with an insulating film formed by a CVD method or a sputtering method; thus, the gate insulating film can have fewer electron traps. Therefore, defects such as the variation in threshold voltage of a transistor or the decrease in sub-threshold coefficient can be prevented; therefore, a highly reliable semiconductor device can be manufactured.

This embodiment can be appropriately combined with the embodiment mode or any of the other embodiments shown in this specification.

Embodiment 2

In this embodiment, a case will be explained in which an insulating film (hereinafter also referred to as a sidewall) is provided at a side surface of the gate electrode in the structure shown in Embodiment 1, with reference to FIGS. 8A to 8E. It is to be noted that the same reference numeral is used to indicate the same part as that in Embodiment 1, and the description of such a part is omitted.

Figure 5B:
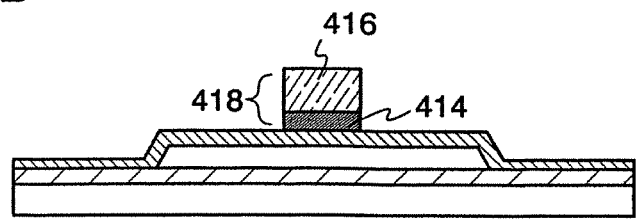
Figure 5C:
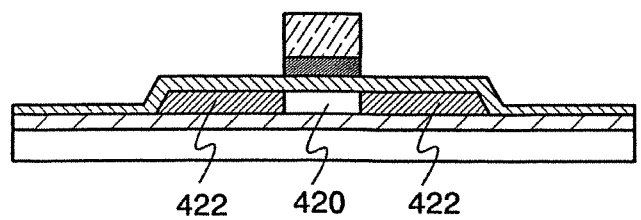
Figure 5D:
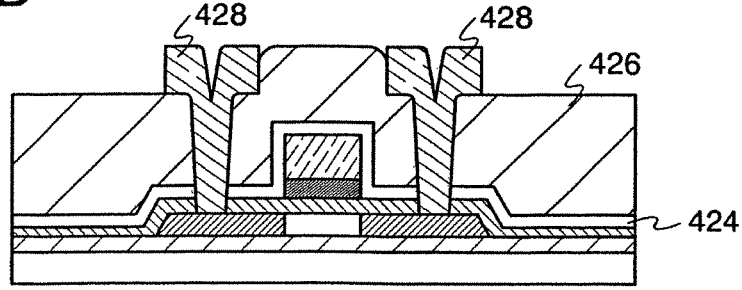
Figure 8A:
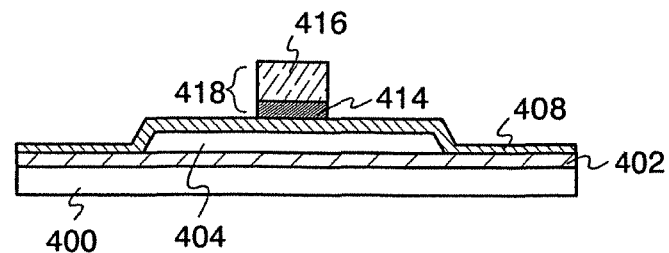
FIGS. 8A to 8E show an example of a manufacturing method of a semiconductor device of the present invention.
Figure 8B:
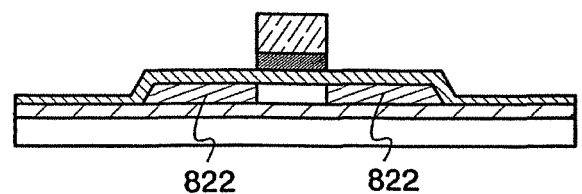

The steps up to the step shown in FIG. 5B and described in Embodiment 1 are performed (see FIG. 8A).

Next, an impurity element is added to the semiconductor film 404 by using the gate electrode 418 as a mask, whereby a pair of first impurity regions 822 is formed. The impurity regions 822 formed here function as low-concentration impurity regions (also called LDD regions) of a transistor to be completed later. As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used (see FIG. 8B).

Figure 8C:
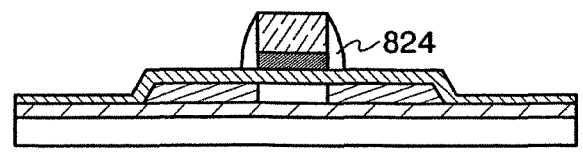
Figure 8D:
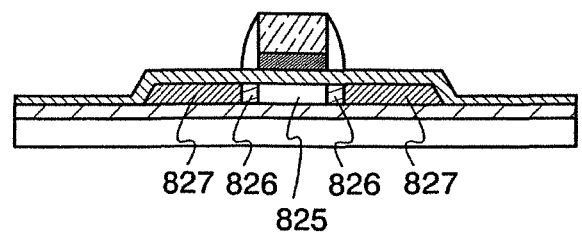
Figure 8E:
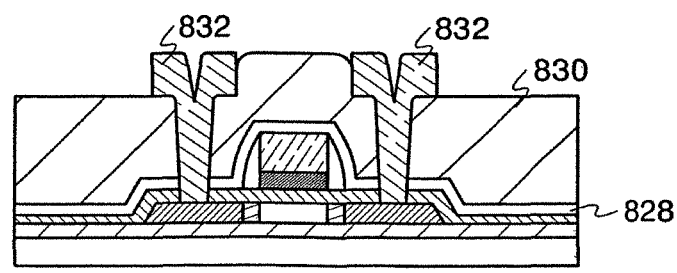

Subsequently, a third insulating film 824 which is in contact with a side surface of the gate electrode 418 is formed (see FIG. 8C). The third insulating film 824 which is in contact with the side surface of the gate electrode 418 is also called a sidewall.

The third insulating film 824 can be formed by forming an insulating film so as to cover the second insulating film 408 and the gate electrode 418 and then selectively etching the insulating film by anisotropic etching mainly in a perpendicular direction. The insulating film (the third insulating film 824 formed later) can be formed of silicon oxide, silicon oxynitride, or the like as a single layer or a stack of layers by a CVD method or a sputtering method.

Moreover, the third insulating film 824 is preferably subjected to plasma oxidation. The plasma oxidation may be performed similarly to the treatment performed on the first insulating film 406 when the second insulating film 408 is formed. That is, plasma which is excited at a high frequency such as by microwave (typically, 2.45 GHz) and which has an electron density of $1 \times 10^{11}$ cm$^{-3}$ or more and a plasma electron temperature of 1.5 eV or less can be used. More specifically, plasma with an electron density of $1 \times 10^{11}$ cm$^{-3}$ to $1 \times 10^{13}$ cm$^{-3}$ and a plasma electron temperature of 0.5 eV to 1.5 eV is preferably used. The plasma oxidation time is preferably 60 seconds or longer. By performing the plasma oxidation on the insulating film functioning as the sidewall, a dense film with a high withstand voltage can be obtained.

When the insulating film functioning as the sidewall is formed by a CVD method, a sputtering method, or the like, the insulating film easily absorbs moisture. However, as shown in the present invention, the hydrogen content of the insulating film can be decreased by performing the plasma oxidation on the insulating film functioning as the sidewall.

The plasma oxidation is performed in an atmosphere including at least oxygen. For example, the atmosphere preferably includes oxygen ($O_2$); oxygen ($O_2$) and a noble gas (at least one of He, Ne, Ar, Kr, and Xe); or oxygen ($O_2$), a noble gas (at least one of He, Ne, Ar, Kr, and Xe), and hydrogen ($H_2$). When the atmosphere includes hydrogen, the amount of hydrogen is preferably less than that of oxygen and the noble gas.

Subsequently, an impurity element is added to the semiconductor film 404 by using the gate electrode 418 and the third insulating film 824 as masks, whereby a channel formation region 825, a pair of second impurity regions 826, and a pair of third impurity regions 827 (see FIG. 8D) are formed. The impurity element is added here at a higher concentration than the impurity element added when the first impurity regions 822 (see FIG. 8B) are formed. Therefore, the third impurity regions 827 are regions where the impurity element is added at a higher concentration than in the second impurity regions 826. Moreover, the third impurity regions 827 each function as a source or drain region and the second impurity regions 826 function as low-concentration impurity regions (LDD regions). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used.

Next, an insulating film is formed to cover the second insulating film 408, the third insulating film 824, and the gate electrode 418. Here, the insulating film is formed as a stack of a fourth insulating film 828 and a fifth insulating film 830. It is needless to say that the present invention is not limited to this, and the insulating film may be formed as a single layer or a stack of three or more layers, as well. Then, a conductive film 832 is formed to be electrically connected to the third impurity regions 827 formed in the semiconductor film 404 (see FIG. 8E).

The fourth insulating film 828 and the fifth insulating film 830 can be formed using an insulating film including oxygen or nitrogen, such as silicon oxide, silicon nitride, silicon oxynitride ($SiO_xN_y$, x>y>0), or silicon nitride oxide ($SiN_xO_y$, x>y>0); a film including carbon such as DLC (diamond-like carbon); or a film including a siloxane material such as a siloxane resin or an organic material such as epoxy, polyimide, polyamide, polyvinylphenol, benzocyclobutene, or acrylic. The siloxane material corresponds to a material including a Si—O—Si bond. Siloxane has a skeletal structure including a bond of silicon (Si) and oxygen (O). For a substituent, an organic group including at least hydrogen (such as an alkyl group or aromatic hydrocarbon) is used. A fluoro group can also be used for a substituent. In addition, an organic group including at least hydrogen and a fluoro group may be used for a substituent. The fourth insulating film 828 and the fifth insulating film 830 can be formed of these materials by a CVD method, a sputtering method, a coating method, or the like. When the insulating film is formed of an organic material or a siloxane material, the step due to the semiconductor film, the gate electrode, and the like can be flattened. However, a film formed of an organic material or a siloxane material easily absorbs and transmits moisture. Therefore, if the semiconductor film, the gate insulating film, the gate electrode, and the like were formed in contact with the film formed of an organic material or a siloxane material, the electrical characteristics of a completed transistor might be adversely affected. Accordingly, a film using an inorganic material having a high blocking effect against moisture is preferably formed in contact with the semiconductor film, the gate insulating film, the gate electrode, and the like. In particular, a film including silicon nitride, silicon nitride oxide, or the like is preferable because of having a high blocking effect against moisture. Here, the fourth insulating film 828 is formed using a film including an inorganic material and the fifth insulating film 830 is formed using a film including an organic material or a siloxane material over the fourth insulating film 828.

The conductive film 832 can be formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy or compound material including any of these elements as its main component, by a CVD method, a sputtering method, or the like. For example, as an alloy material including aluminum as its main component, the following can be used: a material including aluminum as its main component and also including nickel; or a material including aluminum as its main component and also including nickel and one or both of carbon and silicon. As the conductive film 832, for example, a stacked structure of a barrier film, an aluminum-silicon (Al—Si) film, and another barrier film or a stacked structure of a barrier film, an aluminum-silicon (Al—Si) film, a titanium nitride (TiN) film, and another barrier film is preferably employed. It is to be noted that the barrier film corresponds to a thin film of titanium, titanium nitride, molybdenum, or molybdenum nitride. Since aluminum and aluminum silicon have low resistance and are inexpensive, they are suitable for forming the conductive film 832. When barrier layers are formed as an upper layer and a lower layer, the generation of a hillock in aluminum and aluminum silicon can be prevented. Moreover, when the barrier film is formed of titanium, which is an element with a high reducing property, even if a thin natural oxide film is formed over the crystalline semiconductor film, favorable contact with the crystalline semiconductor film can be made by reducing this natural oxide film.

In accordance with these steps, a semiconductor device of the present invention can be manufactured. The structure of the transistor shown in this embodiment is just an example, and various known structures can be employed. For example, a multigate structure (a structure having a semiconductor film including at least two channel formation regions connected serially to each other, and at least two gate electrodes for applying an electric field to the channel formation regions, respectively) or a dual gate structure (a structure in which a semiconductor film is sandwiched between upper and lower gate electrodes) may be applied.

By applying the present invention, the dense insulating film (sidewall) with a high withstand voltage can be formed at the side surface of the gate electrode. Therefore, defects such as local leakage current flowing through the sidewall from the side surface of the gate electrode can be prevented, and a semiconductor device with higher reliability can be manufactured.

Although the thin film transistor having the island-like semiconductor film over the substrate is explained in this embodiment, the present invention is not limited to this. For example, the present invention can also be applied to a sidewall of a transistor having a channel formation region in a semiconductor substrate.

This embodiment can be appropriately combined with the embodiment mode or any of the other embodiments shown in this specification.

Embodiment 3

In this embodiment, an example of a manufacturing method of a nonvolatile memory element, which is a nonvolatile semiconductor memory device, will be explained with reference to FIGS. 9A to 9C and 10A to 10C. Here, a nonvolatile memory element using a semiconductor film formed over a substrate is described.

A nonvolatile semiconductor memory device typified by a nonvolatile memory or the like has a similar structure to that of a MOSFET (Metal Oxide Semiconductor Field Effect Transistor), which has a feature in that a region capable of accumulating charges for a long period of time is provided over a channel formation region. This charge accumulating region is formed over an insulating film and insulated from its periphery; therefore, it is also referred to as a floating gate electrode. A control gate electrode is formed over the floating gate electrode with another insulating film interposed therebetween. Such a structure is a so-called floating gate type nonvolatile semiconductor memory device.

The nonvolatile semiconductor memory device having the aforementioned structure accumulates charges in the floating gate electrode and releases the charges, based on the voltage applied to the control gate electrode. That is to say, the nonvolatile semiconductor memory device has a mechanism of storing data by taking charges into and out of the floating gate electrode. Specifically, the injection and extraction of the charges to and from the floating gate electrode are performed by applying a high voltage between the control gate electrode and the semiconductor film provided with the channel formation region. It is said that Fowler-Nordheim type (F-N type) tunneling current (NAND-type) or a thermal electron (NOR-type) flows through the insulating film over the channel formation region at this time. Accordingly, the insulating film formed over the channel formation region is also called a tunnel insulating film. This embodiment will explain an example of a manufacturing method of such a floating gate type nonvolatile memory element.

First, an island-like semiconductor film 904 is formed over a substrate 900 with a base insulating film 902 interposed therebetween. Then, a first insulating film 906 is formed over the semiconductor film 904 (see FIG. 9A).

The substrate 900 may be a glass substrate, a quartz substrate, a sapphire substrate, a ceramic substrate, a metal substrate, or the like. Moreover, a plastic substrate made of polyethylene terephthalate, polyethylene naphthalate, polyether sulfone, acrylic, or the like can also be used. In addition, a substrate which can withstand at least heat generated in the process can be used. In this embodiment, the substrate 900 is a glass substrate.

The base insulating film 902 is formed of an insulating material such as silicon oxide, silicon nitride, silicon oxynitride ($SiO_xN_y$, x>y>0), or silicon nitride oxide ($SiN_xO_y$, x>y>0). Moreover, the base insulating film 902 may be a single layer or a stack of layers. A method for forming the base insulating film 902 is not particularly limited, and a CVD method, a sputtering method, or the like can be used. By providing the base insulating film 902, impurity diffusion from the substrate can be prevented. When unevenness and impurity diffusion of the substrate 900 do not cause any problems, the base insulating film 902 does not have to be provided. In this embodiment, a silicon nitride oxide film is formed by a plasma CVD method as the base insulating film 902.

The island-like semiconductor film 904 can be formed in such a way that an amorphous semiconductor film is formed of a material including silicon (Si) as its main component (such as Si or $Si_xGe_{1-x}$), the amorphous semiconductor film is crystallized, and then the crystallized semiconductor film is selectively etched. The amorphous semiconductor film can be formed by a CVD method, a sputtering method, or the like. The amorphous semiconductor film is not necessarily crystallized. When the amorphous semiconductor film is not crystallized, the amorphous semiconductor film is selectively etched to form the island-like semiconductor film 904 including the amorphous semiconductor film.

The amorphous semiconductor film can be crystallized by a laser crystallization method, a thermal crystallization method using RTA or an annealing furnace, a thermal crystallization method using a metal element promoting crystallization, a method in which any of these methods is combined with another, or the like.

When the semiconductor film is crystallized or recrystallized by laser irradiation, an LD-pumped continuous wave (CW) laser ($YVO_4$, second harmonic (wavelength of 532 nm)) can be used as a light source of laser light. It is not necessary to limit to the second harmonic, in particular; however, the second harmonic is superior to other higher harmonics in terms of energy efficiency. When a semiconductor film is irradiated with a CW laser, the semiconductor film can receive energy continuously. Therefore, once the semiconductor film is melted, the melted state can be continued. Moreover, a solid-liquid interface of the semiconductor film can be moved by scanning a CW laser, and a crystal grain which is long in one direction along this moving direction can be formed. In addition, a solid-state laser is used because highly stable output and stable processing are expected as compared with a gas laser and the like. It is to be noted that not only a CW laser but also a pulsed laser with a repetition rate of 10 MHz or more can be used. With a pulsed laser having a high repetition rate, when a period for the melted semiconductor film to solidify is shorter than the pulse interval of the laser, the semiconductor film can remain melted constantly, which enables the semiconductor film to have a crystal grain that is long in one direction by the movement of the solid-liquid interface. Other CW lasers and pulsed lasers with repetition rates of 10 MHz or more can also be used. For example, an Ar laser, a Kr laser, a $CO_2$ laser, or the like can be used as a gas laser. Moreover, a metal vapor laser such as a helium-cadmium laser can be used as a gas laser. A YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like can be used as a solid-state laser. Moreover, among the solid-state lasers, a YAG laser, a $Y_2O_3$ laser, a $GdVO_4$ laser, a $YVO_4$ laser, or the like can be used as a ceramic laser. It is preferable to emit laser light with $TEM_{00}$ (single transverse mode) from a laser oscillator because a linear beam spot on a surface to be irradiated can have more homogeneous energy. Besides those above, a pulsed excimer laser may be used.

The first insulating film 906 can be formed of an insulating material such as silicon oxide, silicon oxynitride ($SiO_xN_y$, x>y>0), or silicon nitride oxide ($SiN_xO_y$, x>y>0) by a CVD method, a sputtering method, or the like. Moreover, aluminum oxide ($Al_xO_y$), tantalum oxide ($Ta_xO_y$), hafnium oxide ($HfO_x$), or the like may be used. The first insulating film 906 preferably has a film thickness of 1 nm to 20 nm, more preferably, from 1 nm to 10 nm.

Next, plasma oxidation is performed on the first insulating film 906, whereby a second insulating film 907 is formed. A charge accumulating film 908 is then formed over the second insulating film 907 (see FIG. 9B). Here, the second insulating film 907 functions as a tunnel insulating film and the charge accumulating film 908 functions as a floating gate electrode in the nonvolatile semiconductor memory device to be completed later.

The plasma oxidation performed on the first insulating film 906 uses plasma which is excited at a high frequency such as by microwave (typically, 2.45 GHz) and which has an electron density of $1 \times 10^{11}$ cm$^{-3}$ or more and a plasma electron temperature of 1.5 eV or less. More specifically, the electron density preferably ranges from $1 \times 10^{11}$ cm$^{-3}$ to $1 \times 10^{13}$ cm$^{-3}$, and the plasma electron temperature preferably ranges from 0.5 eV to 1.5 eV. The plasma oxidation time of the first insulating film 906 is preferably 60 seconds or longer.

The plasma oxidation is performed in an atmosphere including at least oxygen (for example, an oxygen atmosphere; an atmosphere including oxygen ($O_2$) or nitrogen suboxide ($N_2O$) and a noble gas (at least one of He, Ne, Ar, Kr, and Xe); or an atmosphere including oxygen or nitrogen suboxide, hydrogen ($H_2$), and a noble gas). When the atmosphere includes hydrogen, the amount of hydrogen is preferably less than that of oxygen or nitrogen suboxide and the noble gas.

As the noble gas, for example, Ar can be used. A gas including a mixture of Ar and Kr may be used. When the plasma oxidation is performed in a noble gas atmosphere, the second insulating film 907 formed by plasma oxidation may include the noble gas used in the plasma treatment (at least one of He, Ne, Ar, Kr, and Xe). For example, when Ar is used as the noble gas in the plasma oxidation, the second insulating film 907 may include Ar.

The plasma oxidation in the present invention is performed under the conditions where the plasma electron density is high at $1 \times 10^{11}$ cm$^{-3}$ or more and the plasma electron temperature is low in the vicinity of the first insulating film 906, which is an object to be processed; therefore, it is possible to prevent the second insulating film 907 from being damaged due to the plasma. Moreover, since the plasma electron density is high at $1\times10^{11}$ cm$^{-3}$ or more, a film (here, the second insulating film 907) formed by performing plasma oxidation on the object to be processed (here, the first insulating film 906) can be made to be a dense film with a high withstand voltage as compared with a film formed by a CVD method, a sputtering method, or the like. Moreover, since the plasma electron temperature is low at 1.5 eV or less, the oxidation treatment can be performed on the object to be processed at a lower temperature than in a conventional plasma treatment or thermal oxidation method. For example, plasma oxidation at 100° C. or more below the distortion point of the glass substrate can be used to perform oxidation treatment sufficiently.

When an insulating film including hydrogen formed by a CVD method, a sputtering method, or the like is subjected to the plasma oxidation, the film can have a reduced hydrogen content.

In this embodiment, a mixed gas of oxygen ($O_2$) and argon (Ar) is introduced at the time of the plasma oxidation of the object to be processed. The mixed gas used here may include oxygen at 0.1 sccm to 100 sccm and argon at 100 sccm to 5000 sccm. For example, the oxygen may be introduced at 5 sccm and the argon may be introduced at 900 sccm.

In this embodiment, the second insulating film 907 formed by performing the plasma oxidation on the first insulating film 906 functions as a tunnel insulating film in the nonvolatile semiconductor memory device to be completed later. Therefore, the thinner the second insulating film 907 is, the more easily tunneling current flows, which enables the memory to operate at high speed. In addition, when the second insulating film 907 is thinner, the floating gate electrode to be formed later can accumulate charges at a lower voltage. Therefore, the power consumption of the semiconductor device can be reduced. Accordingly, the second insulating film 907 is preferably formed to be thin.

As a general method for forming a thin insulating film over a semiconductor film, a thermal oxidation method is given. When a substrate whose melting point is not sufficiently high, such as a glass substrate, is used as the substrate 900, it is very difficult to form an insulating film over a semiconductor film by a thermal oxidation method. Moreover, an insulating film formed by a CVD method or a sputtering method does not have sufficient film quality because defects are included inside the film. Moreover, a thin insulating film formed by a CVD method or a sputtering method has problems in that the withstand voltage is low and a defect such as a pin hole easily occurs. In addition, an insulating film formed by a CVD method or a sputtering method does not cover an end portion of the semiconductor film sufficiently, in particular, which may cause short-circuiting between the semiconductor film and the conductive film and the like that constitute the floating gate electrode to be formed later. Therefore, when the first insulating film 906 formed by a CVD method or a sputtering method is used as a tunnel insulating film without any change, a defect is very likely to occur.

Consequently, when the second insulating film 907 is formed by performing the plasma oxidation on the first insulating film 906 as shown in this embodiment, the second insulating film 907 can be denser and have a higher withstand voltage than an insulating film formed by a CVD method, a sputtering method, or the like. Moreover, even when the end portion of the semiconductor film 904 cannot be covered sufficiently at the time of forming the first insulating film 906, it can be covered sufficiently with the second insulating film 907 by performing the plasma oxidation. As a result, a memory can operate at high speed and the charge holding characteristic of a memory can be improved.

Moreover, the nonvolatile semiconductor memory device to be completed later stores information by injecting electrons through the tunnel insulating film. At this time, when hydrogen causing electron traps exists in the tunnel insulating film, the voltage fluctuates in the course of repeating writing and erasing, which causes the memory to deteriorate. Thus, the hydrogen content of the tunnel insulating film which causes electron traps is preferably low. When the second insulating film 907 is formed by performing the plasma oxidation on the first insulating film 906 as shown in this embodiment, the hydrogen content of the film can be made lower than that of an insulating film formed by a CVD method, a sputtering method, or the like. Accordingly, the performance of a memory can be improved.

The charge accumulating film 908 can be formed as a single layer or a stack of two or more layers. Specifically, the charge accumulating film 908 can be formed of an element selected from silicon (Si), germanium (Ge), tungsten (W), titanium (Ti), tantalum (Ta), molybdenum (Mo), and the like; an alloy material including any of these elements as its main component; or a compound material including any of these elements as its main component (such as a nitride or an oxide of the element). For example, as the compound of the element, silicon nitride, silicon nitride oxide, silicon carbide, silicon germanium including germanium at less than 10 atomic %, tantalum nitride, tantalum oxide, tungsten nitride, titanium nitride, titanium oxide, tin oxide, or the like can be used. Moreover, a silicide of the element (such as tungsten silicide, titanium silicide, or nickel silicide) can be used. When silicon is used, an impurity such as phosphorus or boron may be added. Here, the charge accumulating film 908 is formed using a film including germanium as its main component with a thickness of 1 nm to 20 nm, preferably, from 5 nm to 10 nm, by a plasma CVD method in an atmosphere including a germanium element (such as $GeH_4$).

Figure 9A:
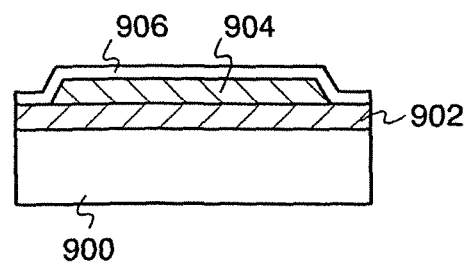
FIGS. 9A to 9C show an example of a manufacturing method of a nonvolatile semiconductor memory device of the present invention.
Figure 9B:
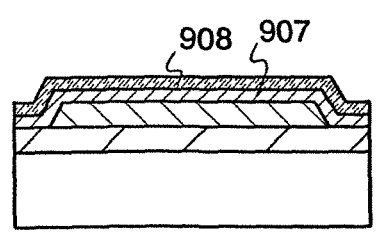
Figure 9C:
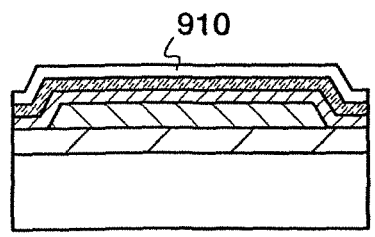

Next, a third insulating film 910 is formed over the charge accumulating film 908 (see FIG. 9C). The third insulating film 910 can be formed of an insulating material such as silicon oxide, silicon oxynitride ($SiO_xN_y$, x>y>0), or silicon nitride oxide ($SiN_xO_y$, x>y>0) by a CVD method, a sputtering method, or the like. Moreover, aluminum oxide ($Al_xO_y$), tantalum oxide ($Ta_xO_y$), hafnium oxide ($HfO_x$), or the like can be used. The third insulating film 910 is preferably formed with a thickness of 1 nm to 100 nm, more preferably, from 20 nm to 60 nm, by a CVD method, a sputtering method, or the like.

Figure 10A:
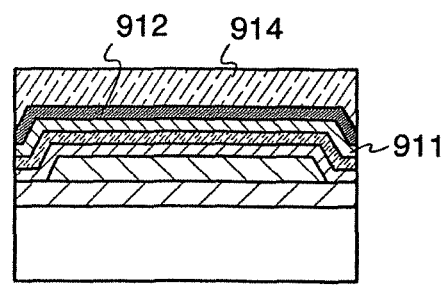
FIGS. 10A to 10C show an example of a manufacturing method of a nonvolatile semiconductor memory device of the present invention.
Figure 10B:
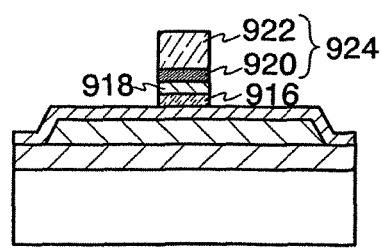

Subsequently, a fourth insulating film 911 is formed by performing plasma oxidation on the third insulating film 910, and then a conductive film is formed over the fourth insulating film 911 (see FIG. 10A). Here, an example in which a conductive film 912 and a conductive film 914 are sequentially stacked as the conductive film is shown. Alternatively, the conductive film may be either a single layer or a stack of three or more layers. Moreover, the plasma oxidation may be preformed by a method shown as the method of forming the second insulating film.

The conductive films 912 and 914 can be formed of an element selected from tantalum (Ta), tungsten (W), titanium (Ti), molybdenum (Mo), aluminum (Al), copper (Cu), chromium (Cr), niobium (Nb), and the like, or an alloy or compound material including any of these elements as its main component. Moreover, the conductive films 912 and 914 can be formed using a metal nitride film obtained by nitriding any of these elements. In addition, a semiconductor material typified by polycrystalline silicon doped with an impurity element such as phosphorus can be used.

Next, a stack of the conductive films 912 and 914 is selectively etched away so that the conductive films 912 and 914 remain over a part of the semiconductor film 904. Thus, conductive films 920 and 922 constituting a gate electrode 924 are formed (see FIG. 10B). Moreover, in this embodiment, a surface of the second insulating film 907 which does not overlap with the gate electrode 924 is exposed.

Specifically, parts of the fourth insulating film 911 and the charge accumulating film 908 formed under the gate electrode 924 that do not overlap with the gate electrode 924 are selectively removed so that end portions of the gate electrode 924, a fourth insulating film 918, and a charge accumulating film 916 approximately match with each other.

In this case, the part of the insulating film and the like that does not overlap with the gate electrode 924 (the conductive films 920 and 922) may be removed at the same time as the formation of the gate electrode 924 or may be removed by using a resist remaining after forming the gate electrode 924 or by using the gate electrode 924 as a mask. It is to be noted that the charge accumulating film 916 functions as a floating gate electrode, the fourth insulating film 918 functions as a control insulating film, and the gate electrode 924 functions as a control gate electrode. In this specification, the term "control insulating film" refers to an insulating film provided between an electrode functioning as a floating gate electrode and an electrode functioning as a control gate electrode.

Figure 10C:
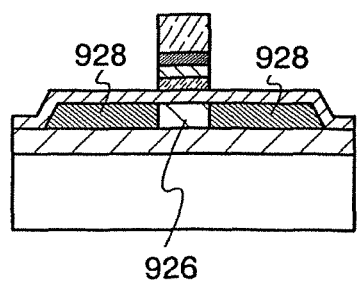

Subsequently, an impurity element is added by using the gate electrode 924 as a mask, whereby a pair of impurity regions 928 and a channel formation region 926 between the pair of impurity regions 928 are formed (see FIG. 10C). As the impurity element, an impurity element imparting n-type conductivity or an impurity element imparting p-type conductivity is used. As the impurity element imparting n-type conductivity, phosphorus (F), arsenic (As), or the like can be used. As the impurity element imparting p-type conductivity, boron (B), aluminum (Al), gallium (Ga), or the like can be used.

In accordance with the above steps, a nonvolatile memory element which is a nonvolatile semiconductor memory device of the present invention can be manufactured. The structure of the nonvolatile memory element shown in this embodiment is just an example, and it is needless to say that various known structures can be applied.

By using the present invention, a dense and relatively thin tunnel insulating film with a high withstand voltage can be achieved. Moreover, a tunnel insulating film with favorable film characteristics can be achieved without high-temperature heat treatment. Moreover, when the tunnel insulating film is formed by performing plasma oxidation on an insulating film formed by a CVD method or a sputtering method, the semiconductor film can be sufficiently covered. Therefore, it is possible to prevent defects such as leakage current and short-circuiting between the floating gate electrode and the semiconductor film due to a defect in withstand voltage of the tunnel insulating film or a defect in coverage of the tunnel insulating film, whereby a memory can operate at high speed and the charge holding characteristic of a memory can be improved. As a result, a highly reliable semiconductor memory device can be manufactured.

Moreover, by using the present invention, the tunnel insulating film with fewer electron traps can be achieved. Since the nonvolatile semiconductor memory device of the present invention stores information by injecting electrons through the tunnel insulating film, the highly reliable nonvolatile semiconductor memory device can be manufactured by providing the tunnel insulating film with fewer electron traps.

Furthermore, by using the present invention, a dense control insulating film with a high withstand voltage can also be achieved. Thus, the charge holding characteristic of a memory can be improved, and the highly reliable semiconductor memory device can be manufactured.

This embodiment can be appropriately combined with the embodiment mode or any of the other embodiments shown in this specification.

Embodiment 4

In this embodiment, an example of a manufacturing method of a nonvolatile memory element, which is different from that in Embodiment 3, will be explained with reference to FIGS. 6A to 6D and 7A to 7C. Here, an example of a manufacturing method of a nonvolatile memory element using a semiconductor substrate is explained.

Figure 6A:
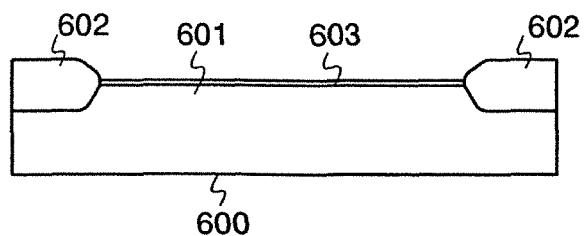
FIGS. 6A to 6D show an example of a manufacturing method of a nonvolatile semiconductor memory device of the present invention.

First, a region 601 in which elements are separated (the region will also be referred to as an element separation region 601, hereinafter) is formed in a semiconductor substrate 600, and a first insulating film 603 is formed on a surface of the region 601 (see FIG. 6A). The region 601 provided in the semiconductor substrate 600 is separated by an insulating film 602 (also referred to as a field oxide film).

The semiconductor substrate 600 can be used without particular limitation as long as it is a semiconductor substrate. For example, a single-crystal Si substrate having n-type or p-type conductivity, a compound semiconductor substrate (such as a GaAs substrate, an InP substrate, a GaN substrate, a SiC substrate, a sapphire substrate, or a ZnSe substrate), an SOI (Silicon On Insulator) substrate manufactured by a bonding method or a SIMOX (Separation by Implanted Oxygen) method, or the like can be used.

The element separation region 601 can be formed by appropriately using a selective oxidation method (such as a LOCOS (Local Oxidation of Silicon) method), a trench separation method, or the like.

In this embodiment, a single-crystal Si substrate having n-type conductivity is used as the semiconductor substrate 600. When a semiconductor substrate having n-type conductivity is used, a p well may be formed in the element separation region 601 by introducing an impurity element imparting p-type conductivity. As the impurity element imparting p-type conductivity, boron (B), gallium (Ga), or the like can be used. On the other hand, when a semiconductor substrate having p-type conductivity is used as the semiconductor substrate 600, an n well may be formed in the element separation region by introducing an impurity element imparting n-type conductivity. As the impurity element imparting n-type conductivity, phosphorus (P) or arsenic (As) can be used.

The first insulating film 603 can be formed using a silicon oxide film by oxidizing a surface of the region 601 provided in the semiconductor substrate 600 by a thermal oxidation method. Here, the first insulating film 603 is formed with a thickness of 1 nm to 20 nm, preferably, from 1 nm to 10 nm.

The first insulating film 603 is preferably formed in such a way that plasma oxidation is further performed on the silicon oxide film formed by oxidizing the surface of the region 601 provided in the substrate 600 by a thermal oxidation method. This is because the insulating film formed by a thermal oxidation method such as wet oxidation includes hydrogen and the plasma oxidation can reduce the hydrogen content of the film.

The plasma oxidation uses plasma which is excited at a high frequency such as by microwave (typically, 2.45 GHz) and which has an electron density of $1\times10^{11}$ cm$^{-3}$ or more and a plasma electron temperature of 1.5 eV or less. More specifically, plasma with an electron density of $1\times10^{11}$ cm$^{-3}$ to $1\times10^{13}$ cm$^{-3}$ and a plasma electron temperature of 0.5 eV to 1.5 eV is preferably used. Moreover, the plasma oxidation time performed on the insulating film is preferably 60 seconds or longer.

The plasma oxidation is performed in an atmosphere including at least oxygen (such as an oxygen atmosphere; an atmosphere including oxygen ($O_2$) or nitrogen suboxide ($N_2O$) and a noble gas (at least one of He, Ne, Ar, Kr, and Xe); or an atmosphere including oxygen or nitrogen suboxide, hydrogen ($H_2$), and a noble gas). When the atmosphere includes hydrogen, the amount of hydrogen is preferably less than that of oxygen or nitrogen suboxide and the noble gas.

As the noble gas, for example, Ar can be used. Moreover, a mixed gas of Ar and Kr may be used. When the plasma oxidation is performed in a noble gas atmosphere, the first insulating film 603 formed by plasma oxidation may include the noble gas used in the plasma treatment (at least one of He, Ne, Ar, Kr, and Xe). For example, when Ar is used as the noble gas in the plasma oxidation, the first insulating film 603 may include Ar.

The plasma oxidation in the present invention is performed under the conditions where the plasma electron density is high at $1\times10^{11}$ cm$^{-3}$ or more and the electron temperature is low in the vicinity of the insulating film, which is an object to be processed; therefore, it is possible to prevent the first insulating film 603 from being damaged due to the plasma.

The first insulating film 603 formed on the region 601 functions as a tunnel insulating film of a nonvolatile memory element to be completed later. Thus, when the first insulating film 603 is thinner, a floating gate electrode to be formed later can accumulate charges at a lower voltage. Therefore, the power consumption of a nonvolatile semiconductor memory device can be reduced. Accordingly, the first insulating film 603 is preferably formed to be thin.

Figure 6B:
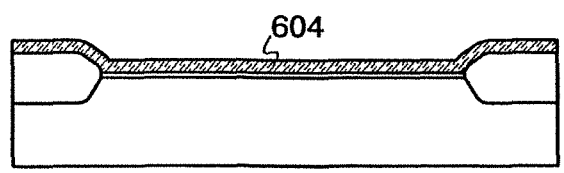
Figure 6C:
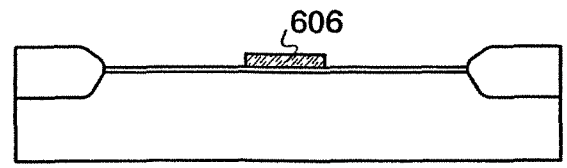

Subsequently, a charge accumulating film 604 is formed over the first insulating film 603 (see FIG. 6B). Then, the charge accumulating film 604 is selectively etched away to form a gate electrode 606 (see FIG. 6C). The gate electrode 606 functions as a floating gate electrode of a nonvolatile semiconductor memory device to be completed later.

The charge accumulating film 604 can be formed as a single layer or a stack of two or more layers. Specifically, the charge accumulating film 604 can be formed of an element selected from silicon (Si), germanium (Ge), tungsten (W), titanium (Ti), tantalum (Ta), molybdenum (Mo), and the like; an alloy material including any of these elements as its main component; or a compound material including any of these elements as its main component (such as a nitride or an oxide of the element). For example, as the compound of the element, silicon nitride, silicon nitride oxide, silicon carbide, silicon germanium including germanium at less than 10 atomic %, tantalum nitride, tantalum oxide, tungsten nitride, titanium nitride, titanium oxide, tin oxide, or the like can be used. Moreover, a silicide of the element (such as tungsten silicide, titanium silicide, or nickel silicide) can be used. Moreover, when a silicon film is used, an impurity such as phosphorus or boron may be added. Here, the charge accumulating film 604 can be formed using a film including germanium as its main component with a thickness of 1 nm to 20 nm, preferably, from 5 nm to 10 nm, by a plasma CVD method in an atmosphere including a germanium element (such as $GeH_4$).

Figure 6D:
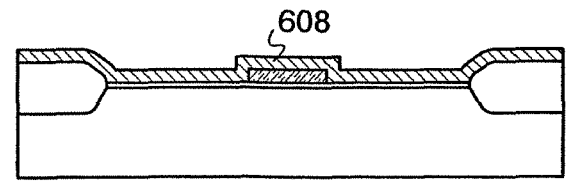

Next, a second insulating film 608 is formed over the gate electrode 606 (see FIG. 6D).

The second insulating film 608 is formed by performing plasma oxidation on an insulating film formed by a CVD method, a sputtering method, a thermal oxidation method, or the like. The insulating film is preferably formed with a thickness of 1 nm to 100 nm, more preferably, from 20 nm to 60 nm. The plasma oxidation may be performed by the method shown to form the first insulating film 603. When the plasma oxidation is performed in a noble gas atmosphere, the second insulating film 608 formed by the plasma oxidation may include the noble gas (at least one of He, Ne, Ar, Kr, and Xe) used in the plasma oxidation.

The second insulating film 608 formed by the plasma oxidation can be denser and have a higher withstand voltage than a film formed by a CVD method, a sputtering method, or the like.

Moreover, the second insulating film 608 formed by the plasma oxidation can have a reduced hydrogen content as compared with a film formed by a CVD method, a sputtering method, a thermal oxidation method, or the like.

The second insulating film 608 formed here functions as a control insulating film of a nonvolatile memory element to be completed later.

Next, a conductive film is formed over the second insulating film 608. The conductive film can be formed as a single layer or a stack of two or more layers. Here, a conductive film 612 and a conductive film 614 are stacked to form the conductive film (see FIG. 7A).

The conductive film 612 and the conductive film 614 can be formed of an element selected from tantalum (Ta), tungsten (W), titanium (Ti), molybdenum (Mo), aluminum (Al), copper (Cu), chromium (Cr), niobium (Nb), and the like, or an alloy or compound material including any of these elements as its main component. Moreover, a metal nitride film formed by nitriding the element can be used. In addition, a semiconductor material typified by polycrystalline silicon doped with an impurity element such as phosphorus can be used.

Here, the conductive film 612 is formed of tantalum nitride and the conductive film 614 is formed of tungsten over the conductive film 612. In addition, the conductive film 612 can be formed of a material selected from tungsten nitride, molybdenum nitride, and titanium nitride as a single layer or a stack of layers, and the conductive film 614 can be formed of a material selected from tantalum, molybdenum, and titanium as a single layer or a stack of layers.

Figure 7A:
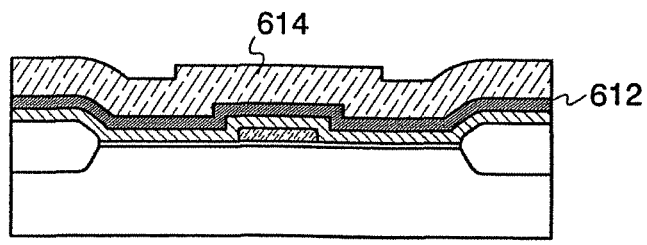
FIGS. 7A to 7C show an example of a manufacturing method of a nonvolatile semiconductor memory device of the present invention.
Figure 7B:
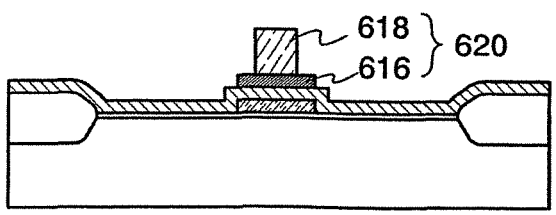

Next, the stack of the conductive films 612 and 614 is selectively etched away so that the conductive films 612 and 614 remain over a part of the region 601, whereby a gate electrode 620 is formed (see FIG. 7B). Here, the gate electrode 620 is formed using conductive films 616 and 618 which are the remaining portions. Moreover, in this embodiment, the gate electrode 620 is formed in such a way that the width of the conductive film 616 formed below (the width in a direction approximately parallel to a direction where carriers flow in a channel formation region (a direction connecting a source region and a drain region)) is larger than the width of the conductive film 618. The gate electrode 620 functions as a control gate electrode of a nonvolatile memory element to be completed later.

The present invention is not limited in particular, and the conductive film 616 and the conductive film 618 may be formed so that their end portions approximately match with each other. Moreover, the conductive film 616 and the conductive film 618 may have their end portions approximately match with the end portion of the gate electrode 606. In addition, an insulating film (sidewall) may be formed in contact with a side surface of the gate electrode 620.

Figure 7C:
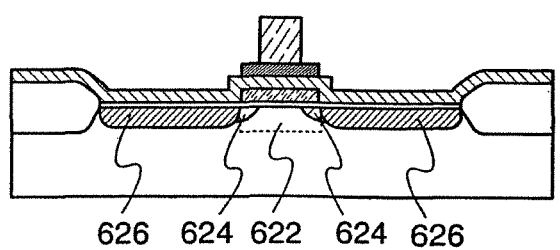

Subsequently, an impurity element is added by using the gate electrode 620 as a mask, whereby a channel formation region 622, a pair of first impurity regions 624, and a pair of second impurity regions 626 are formed (see FIG. 7C). Here, since the conductive film 618 and the gate electrode 606 functioning as a floating gate electrode exist over the first impurity regions 624, the first impurity regions 624 have lower impurity concentrations than the second impurity regions 626. The first impurity regions 624 function as low-concentration impurity regions (LDD regions), while the second impurity regions 626 each function as a source or drain region.

As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used.

In accordance with the above steps, the nonvolatile memory element of the present invention can be manufactured. It is to be noted that the structure of the nonvolatile memory element shown in this embodiment is just an example, and various known structures can be employed.

By using the present invention, a dense tunnel insulating film with a high withstand voltage can be achieved. Therefore, for example, defects such as leakage current flowing between the floating gate electrode and the channel formation region of the semiconductor film caused by a defect in withstand voltage of the tunnel insulating film can be prevented, and a memory can operate at high speed and the charge holding characteristic of a memory can be improved. As a result, the highly reliable nonvolatile semiconductor memory device can be manufactured.

Moreover, by using the present invention, the tunnel insulating film with fewer electron traps can be achieved. Since the nonvolatile semiconductor memory device can store information by injecting electrons through the tunnel insulating film, the highly reliable nonvolatile semiconductor memory device can be manufactured by providing the tunnel insulating film with fewer electron traps.

In addition, by using the present invention, a dense control insulating film with a high withstand voltage can also be achieved. Accordingly, the charge holding characteristic of a memory can be improved, and the highly reliable nonvolatile semiconductor memory device can be manufactured.

This embodiment can be appropriately combined with the embodiment mode or any of the other embodiments shown in this specification.

Embodiment 5

Nonvolatile semiconductor memory devices of various modes can be obtained by using the nonvolatile memory element described in Embodiment 3 or 4.

The aforementioned nonvolatile memory element of a so-called floating gate electrode type accumulates and releases charges (carriers) in and out of the floating gate electrode by applying voltage to the control gate electrode. That is to say, data is stored by taking in and out the charges to and from the floating gate electrode. Specifically, the injection and extraction of the charges to and from the floating gate electrode are performed by applying a high voltage between the channel formation region of the semiconductor film and the control gate electrode or between the channel formation region of the semiconductor substrate and the control gate electrode. At this time, it is said that Fowler-Nordheim (F-N) type tunneling current (NAND-type) or a thermal electron (NOR-type) flows through the insulating film (tunnel insulating film) over the channel formation region. The electrons are injected to the floating gate electrode by the method using a thermal electron or the method using F-N type tunneling current. In the case of using a thermal electron, a positive voltage is applied to the control gate electrode and a high voltage is applied to the drain to generate the thermal electron. Accordingly, the thermal electron can be injected to the floating gate electrode. In the case of using F-N type tunneling current, a positive voltage is applied to the control gate electrode to inject the electrons from the channel formation region of the semiconductor film or the channel formation region of the semiconductor substrate to the floating gate electrode by the F-N tunneling current.

Figure 11:
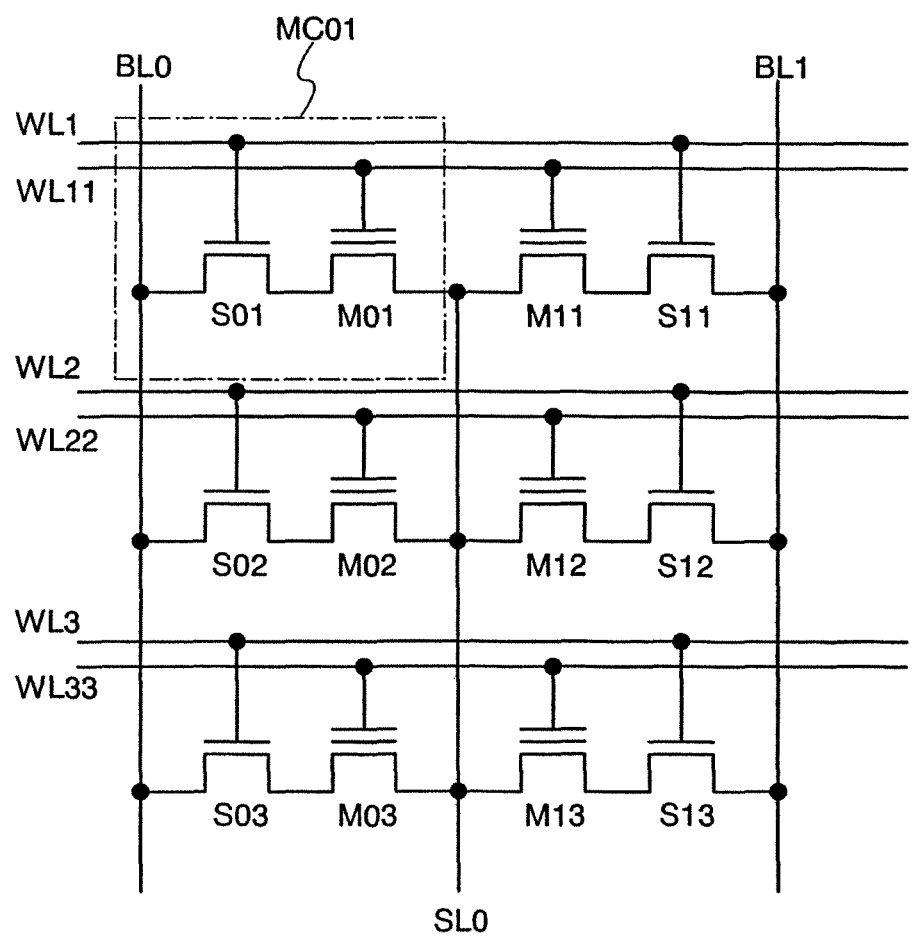
FIG. 11 shows an example of an equivalent circuit of a nonvolatile memory cell array.

FIG. 11 shows an example of an equivalent circuit of a nonvolatile memory cell array. A memory cell MC (MC01, MC02, . . . ) that stores one-bit data is formed by a selecting transistor S(S01, S02, . . . ) and a nonvolatile memory element M (M01, M02, . . . ). For example, a memory cell MC01 specified a bit line BL0 and word lines WL1 and WL11 constitutes a selecting transistor S01 and a nonvolatile memory element M01. The selecting transistor S is inserted serially between the bit line BL0 and the nonvolatile memory element M01, and has its gate connected to the word line WL1. A gate of the nonvolatile memory element M01 is connected to the word line WL11. One of a source and drain of the nonvolatile memory element M01 is connected to one of a source and drain of the selecting transistor S01, and the other of the source and drain of the nonvolatile memory element M01 is connected to a source line SL0. In a case of writing data in the nonvolatile memory element M01, when a high voltage is applied to the word line WL11 with the word line WL1 and the bit line BL0 set at an H level and a bit line BL1 set at an L level, charges are accumulated in the floating gate electrode. In a case of erasing data, a high voltage of negative polarity may be applied to the word line WL11 with the word line WL1 and the bit line BL0 set at an H level.

In a case of a structure in which each of the selecting transistor and the nonvolatile memory element has a semiconductor film formed over an insulating surface, and a channel formation region formed in the semiconductor film in FIG. 11, for example in the memory cell MC01, when each of the selecting transistor S01 and the nonvolatile memory element M01 is formed using a semiconductor film formed separately to have an island-like shape over an insulating surface, it is possible to prevent interference with another selecting transistor or another nonvolatile memory element without particularly providing an element separation region. In addition, since the selecting transistor S01 and the nonvolatile memory element M01 in the memory cell MC01 are both n-channel type, a wiring for connecting these two elements can be omitted by forming the both elements with the use of one island-like semiconductor film.

Figure 12:
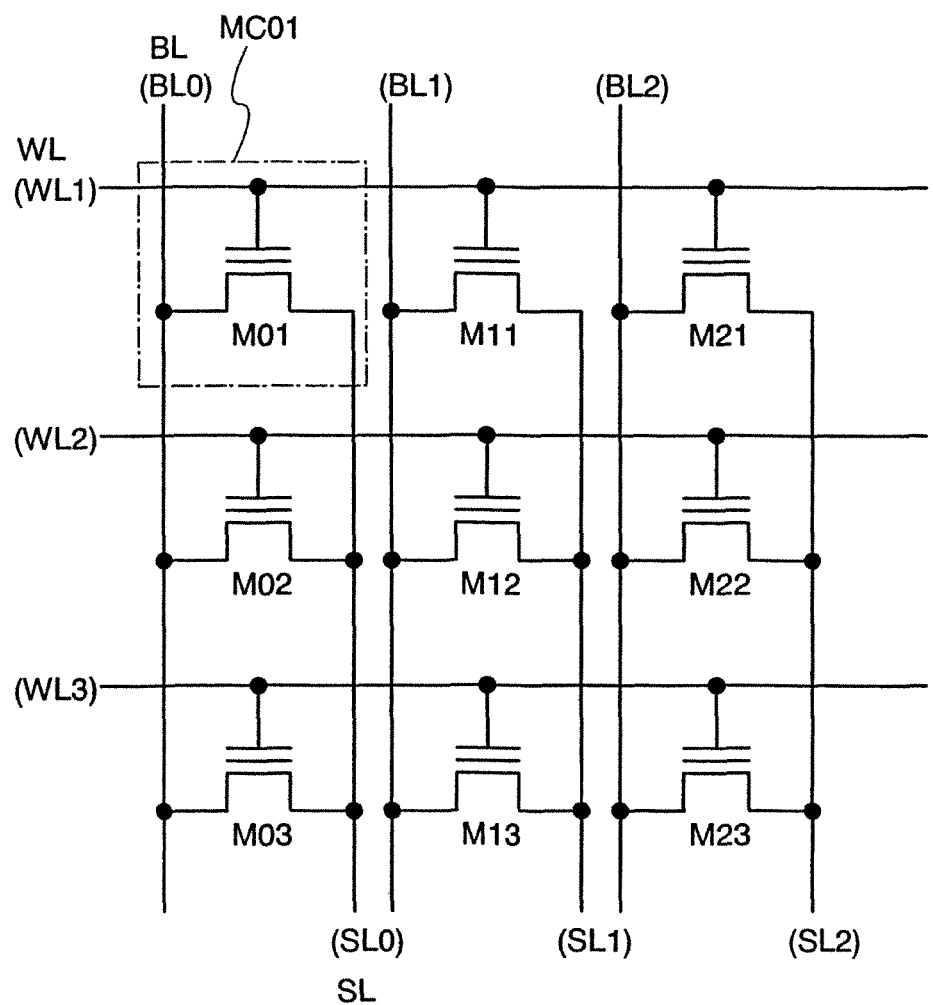
FIG. 12 shows an example of an equivalent circuit of a NOR-type nonvolatile memory cell array.

FIG. 12 shows a NOR-type equivalent circuit in which the nonvolatile memory element is directly connected to the bit line. In this memory cell array, word lines WL (WL1, WL2, WL3, . . . ) and bit lines BL (BL0, BL1, BL2, . . . ) intersect with each other and the nonvolatile memory element is provided at each intersection. In the NOR-type, a drain of each nonvolatile memory element is connected to the bit line BL. A source line SL (SL0, SL1, SL2, . . . ) is commonly connected to sources of the nonvolatile memory elements.

In a case of a structure in which the nonvolatile memory element has a semiconductor film formed over an insulating surface and a channel formation region formed in the semiconductor film in FIG. 12, for example in the memory cell MC01, when the nonvolatile memory element M01 is formed using a semiconductor film formed separately to have an island-like shape over an insulating surface, it is possible to prevent interference with another nonvolatile memory element without particularly providing an element separation region. In addition, when a plurality of nonvolatile memory elements (for example, M01 to M23 shown in FIG. 12) are treated as one block and these nonvolatile memory elements are formed of one island-like semiconductor film, an erasure operation can be performed per unit of block.

An operation of the NOR-type is, for example, as follows. The data writing is carried out in such a way that a voltage of 0 V is applied to the source line SL, a high voltage is applied to the word line WL selected for the data writing, and a potential in accordance with data "0" or "1" is given to the bit line BL. For example, potentials of an H level and an L level corresponding to "0" and "1" respectively are applied to the bit lines BL. In the nonvolatile memory element to which the H level is applied, hot electrons are generated near the drain, and the hot electrons are injected to a floating gate electrode. Such electron injection does not occur in a case of data "1".

In the memory cell to which data "0" is given, hot electrons are generated near the drain due to a strong lateral electric field between the drain and the source and injected to a floating gate electrode. The state where the electrons are injected to the floating gate electrode and threshold voltage is increased is "0". In the case of data "1", hot electrons are not generated and electrons are not injected to the floating gate electrode, whereby a state where threshold voltage is low, i.e., an erasing state is held.

In order to erase data, a positive voltage of about 10 V is applied to the source line SL and the bit line BL is made in a floating state. Then, a high voltage of negative polarity is applied to the word line (by applying a high voltage of negative polarity to the control gate) to extract electrons from the floating gate electrode. This produces a state of erasing data "1."

In order to read out data, a voltage of 0 V is applied to the source line SL and a voltage of about 0.8 V is applied to the bit line BL. Then, a readout voltage which is set at an intermediate value between threshold values of the data "0" and "1" is applied to the selected word line WL. Then, whether or not current is led in the nonvolatile memory element is judged by a sense amplifier connected to the bit line BL.

Figure 13:
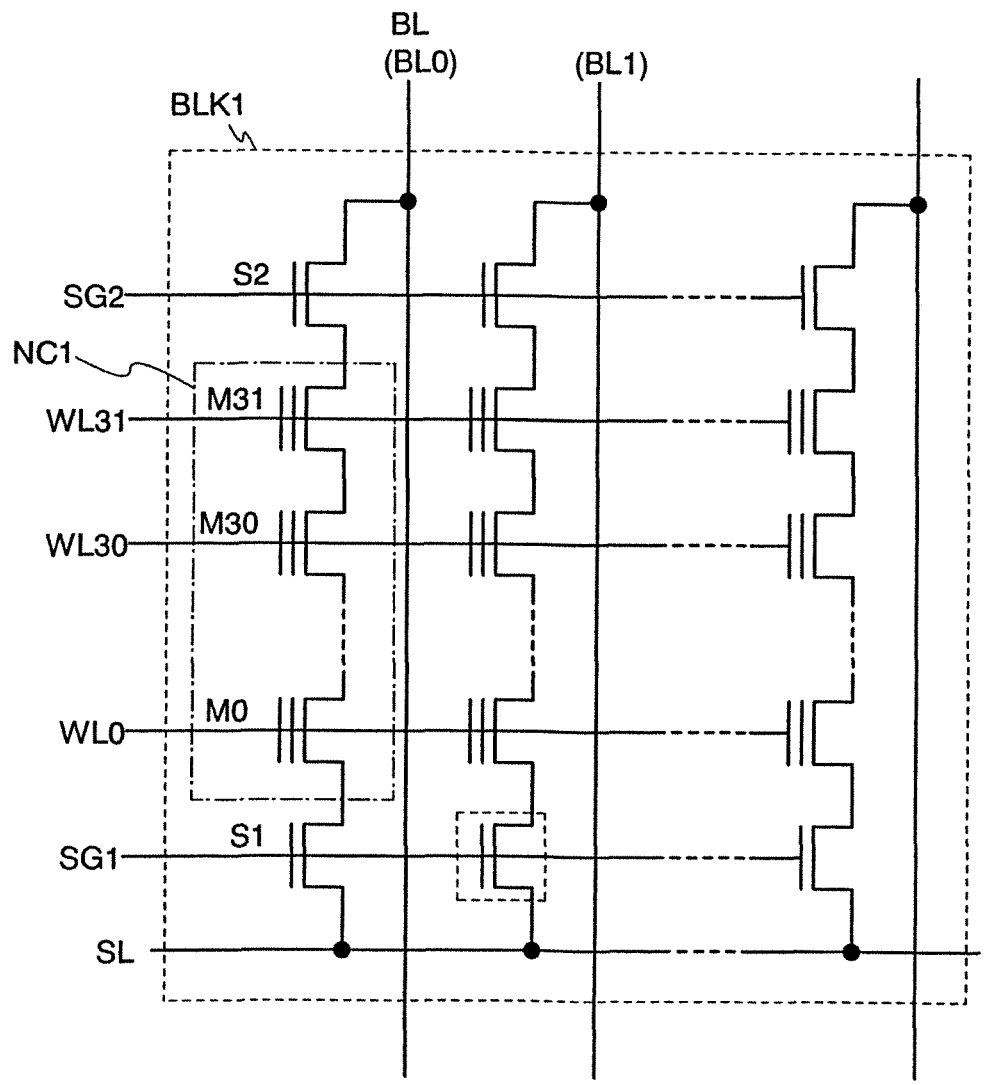
FIG. 13 shows an example of an equivalent circuit of a NAND-type nonvolatile memory cell array.

FIG. 13 shows an equivalent circuit of a NAND-type memory cell array. The bit line BL has a NAND cell NC1 connected thereto, the NAND cell NC1 having a plurality of nonvolatile memory elements serially connected to each other. A plurality of the NAND cells gather to form a block BLK. A block BLK1 shown in FIG. 13 has 32 word lines (word lines WL0 to WL31). The nonvolatile memory elements positioned in the same row of the block BLK1 are commonly connected to the word line corresponding to this row.

In a case of a structure in which each of the selecting transistor and the nonvolatile memory element has a semiconductor film formed over an insulating surface and a channel formation region formed in the semiconductor film in FIG. 13, since selecting transistors S1 and S2 and nonvolatile memory elements M0 to M31 are serially connected to each other, these may be treated as one group formed of one semiconductor film. Accordingly, wirings connecting the nonvolatile memory elements to each other can be omitted, which achieves high integration. Moreover, separation between the adjacent NAND cells can be carried out easily. In addition, the semiconductor film of the selecting transistors S1 and S2 may be formed separately from the semiconductor film of the NAND cell. In an erasure operation by extracting charges from floating gates of the nonvolatile memory elements M0 to M31, the erasure operation can be performed per unit of NAND cell. The nonvolatile memory elements commonly connected to one word line (for example in the row of M30) may be formed of one semiconductor film.

A writing operation is carried out after the NAND cell NC1 is in an erasure state, i.e., a state in which the threshold value of each nonvolatile memory element of the NAND cell NC1 is a negative voltage. The writing is carried out in order from the memory element M0 on the source line SL side. Brief description is hereinafter made on an example of the writing to the memory element M0.

Figure 14A:
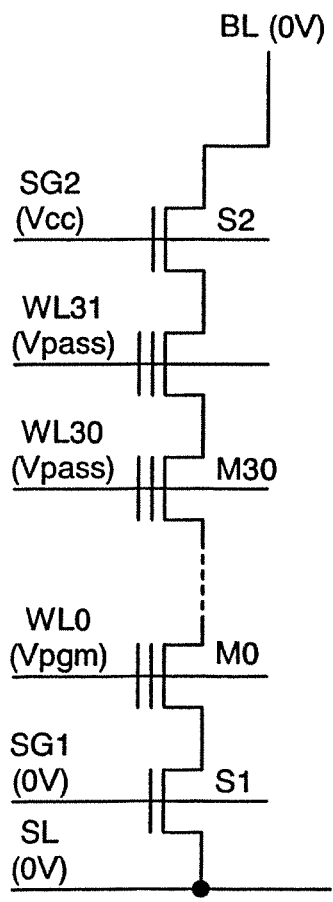
FIGS. 14A and 14B are used to explain a writing operation of a NAND-type nonvolatile memory.

In FIG. 14A, in a case of writing "0", for example, a voltage of Vcc (power source voltage) is applied to a selecting gate line SG2 to turn on the selecting transistor S2 as well as applying a voltage of 0 V (grounding voltage) to the bit line BL0. A voltage of 0 V is, applied to a selecting gate line SG1 and the selecting transistor S1 is turned off. Next, a high voltage of Vpgm (about 20 V) is applied to the word line WL0 of the memory cell M0, and an intermediate voltage of Vpass (about 10 V) is applied to the other word lines. Since a voltage of 0 V is applied to the bit line BL, the potential of the channel formation region of the selected memory cell M0 becomes 0 V. Since the potential difference between the word line WL0 and the channel formation region is large, electrons are injected to the floating gate electrode of the memory cell M0 by the F-N tunneling current. Accordingly, the threshold voltage of the memory cell M0 becomes a positive state (a state in which "0" is written).

Figure 14B:
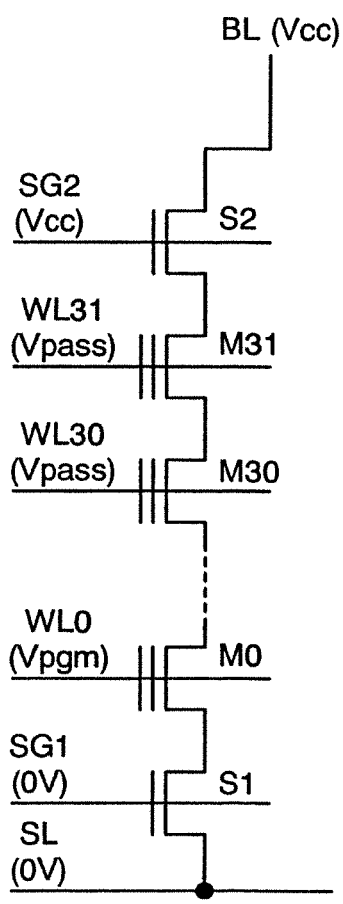

On the other hand, in the case of writing "1", for example, a voltage of Vcc (power source voltage) is applied to the bit line BL as shown in FIG. 14B. Since the selecting gate line SG2 has a voltage of Vcc, the selecting transistor S2 is in a blocked state (cut off). That is to say, the channel formation region of the memory cell M0 becomes a floating state. Next, when a high voltage of Vpgm (20 V) is applied to the word line WL0 and an intermediate voltage of Vpass (10 V) is applied to the other word lines, the voltage of the channel formation region rises from Vcc-Vth to, for example, 8 V due to capacitance coupling between each word line and the channel formation region. Since the voltage of the channel formation region is boosted to be a high voltage, the potential difference between the word line WL0 and the channel formation region is small, unlike the case of writing "0". Therefore, electron injection by the F-N tunneling current does not occur in the floating gate electrode of the memory cell M0. Accordingly, the threshold value of the memory cell M0 is kept in a negative state (a state in which "1" is written).

Figure 15A:
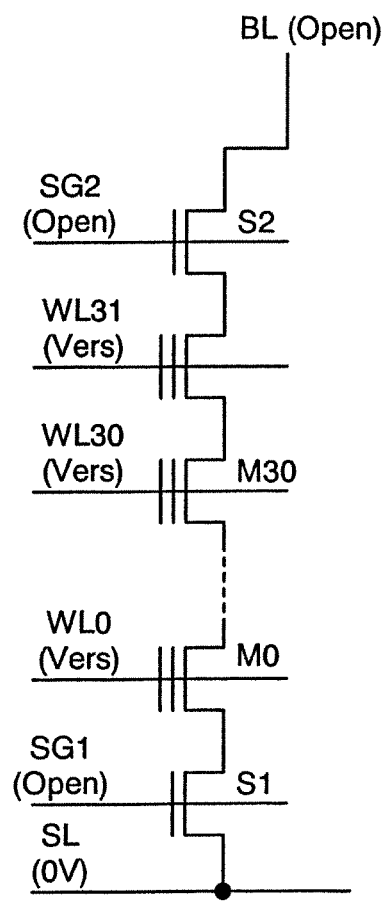
FIGS. 15A and 15B are used to explain erasing and reading operations of a NAND-type nonvolatile memory.

In the case of the erasing operation, as shown in FIG. 15A, a high voltage of negative polarity (Vers) is applied to all the word lines in the selected block. The bit line BL and the source line SL are made in a floating state. Thus, electrons in the floating gate electrode in all the memory cells in the block are released to the semiconductor film or the semiconductor substrate by the tunneling current. Consequently, the threshold voltage of each of these memory cells is shifted to a negative direction.

Figure 15B:
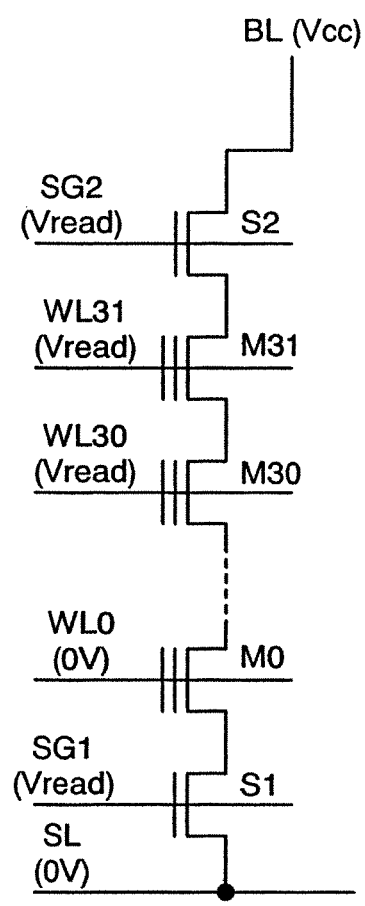
Figure 16:
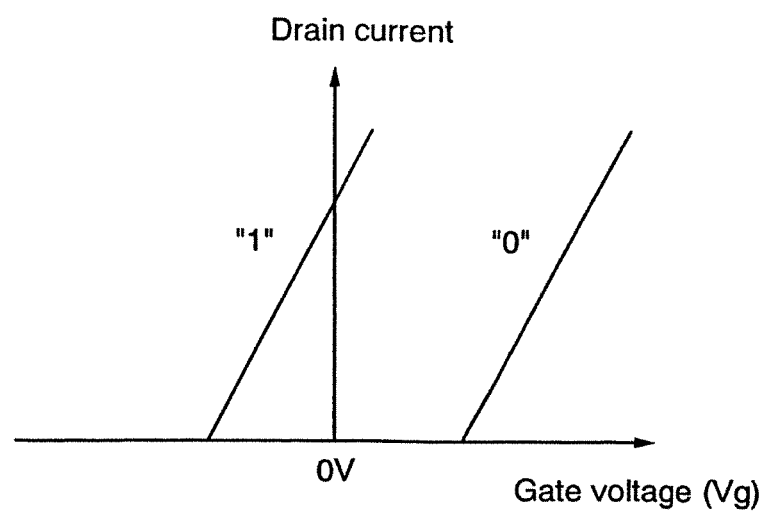
FIG. 16 shows a change in threshold voltage of a nonvolatile memory in a case of "0" in which charges are accumulated and in a case of "1" in which the charges are erased.

In the reading operation shown in FIG. 15B, a voltage of Vr (for example, 0 V) is applied to the word line WL0 of the memory cell M0 which is selected to be read, whereas an intermediate voltage of Vread for reading which is slightly higher than power source voltage is applied to the word lines WL1 to WL31 and the selecting gate lines SG1 and SG2 of the memory cells which are not selected. That is, as shown in FIG. 16, the memory elements other than the selected memory element each function as a transfer transistor. Accordingly, it is detected whether current flows in the memory cell M0 which is selected to be read. In other words, when data stored in the memory cell M0 is "0", the memory cell M0 is off and the bit line BL does not discharge electricity. On the other hand, when data stored in the memory cell M0 is "1", the memory cell M0 is on and the bit line BL discharges electricity.

Figure 17:
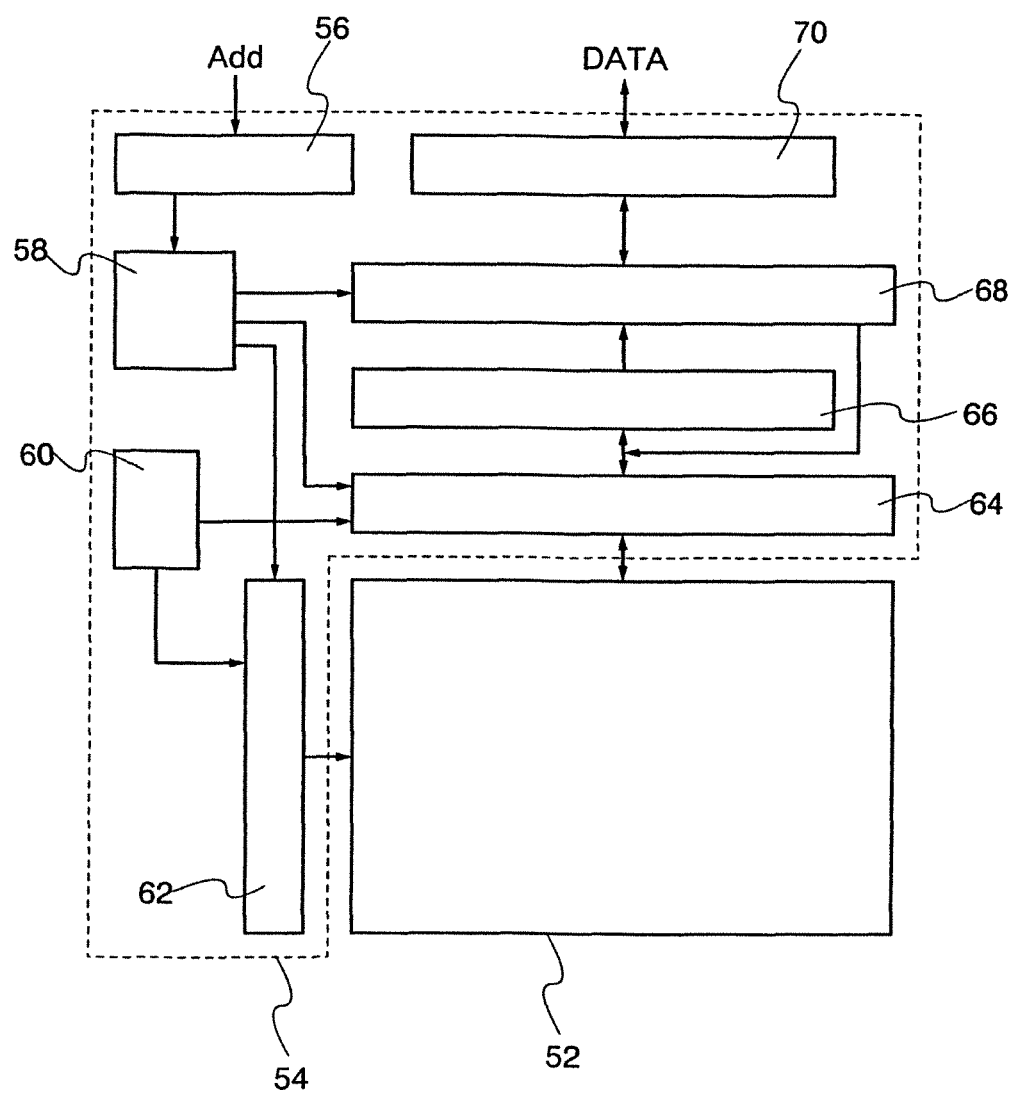
FIG. 17 shows an example of a circuit block diagram of a nonvolatile semiconductor memory device.

FIG. 17 shows an example of a circuit block diagram of a nonvolatile semiconductor memory device. In the nonvolatile semiconductor memory device, a memory cell array 52 and a peripheral circuit 54 are formed over one substrate. The memory cell array 52 has a structure as shown in any of FIGS. 11 to 13. The peripheral circuit 54 has the following structure.

A row decoder 62 for selecting a word line and a column decoder 64 for selecting a bit line are provided in the periphery of the memory cell array 52. An address is transmitted to a controlling circuit 58 through an address buffer 56, and an internal row address signal and an internal column address signal are transferred to the row decoder 62 and the column decoder 64, respectively.

A power source potential is increased to be used for data writing and data erasing. Therefore, a boosting circuit 60, which is controlled by the controlling circuit 58 depending on the operation mode, is provided. The output of the boosting circuit 60 is supplied to the word line WL or the bit line BL through the row decoder 62 or the column decoder 64. Data outputted from the column decoder 64 is inputted to a sense amplifier 66. The data which is read by the sense amplifier 66 is held in a data buffer 68, and the data is accessed randomly by the control of the controlling circuit 58 and outputted through a data input/output buffer 70. Data to be written is once held in the data buffer 68 through the data input/output buffer 70 and transferred to the column decoder 64 by the control of the controlling circuit 58.

In such a nonvolatile semiconductor memory device, data writing and erasing are carried out through the tunnel insulating film. Therefore, the film characteristics of the tunnel insulating film are very important in the nonvolatile semiconductor memory device.

Consequently, by using the present invention, the dense tunnel insulating film with a high withstand voltage can be achieved. Moreover, the semiconductor film can be covered sufficiently with the tunnel insulating film. Therefore, since a defect in withstand voltage of the tunnel insulating film, a defect in coverage of the tunnel insulating film, and the like can be prevented, a highly reliable nonvolatile semiconductor memory device can be provided.

Moreover, the tunnel insulating film with few electron traps can be achieved by using the present invention. Therefore, a highly reliable nonvolatile semiconductor memory device can be provided.

Embodiment 6

This embodiment will explain an example of a nonvolatile semiconductor memory device. In the nonvolatile semiconductor memory device, a nonvolatile memory element included in a memory portion and an element such as a transistor included in a logic portion, which is provided over the same substrate as the memory portion and controls the memory portion or the like, are formed at the same time.

FIG. 11 is a schematic view of the memory portion in the nonvolatile semiconductor memory device.

The memory portion shown in this embodiment includes a plurality of memory cells each having a selecting transistor S and a nonvolatile memory element M. In FIG. 11, the selecting transistor S01 and the nonvolatile memory element M01 form one memory cell MC01. Similarly, a pair of a selecting transistor S02 and a nonvolatile memory element M02, a pair of a selecting transistor S03 and a nonvolatile memory element M03, a pair of a selecting transistor S11 and a nonvolatile memory element M11, a pair of a selecting transistor S12 and a nonvolatile memory element M12, and a pair of a selecting transistor S13 and a nonvolatile memory element M13 each form a memory cell.

A gate electrode of the selecting transistor S01 is connected to the word line WL1, one of a source and a drain thereof is connected to a bit line BL0, and the other is connected to a source or a drain of the nonvolatile memory element M01. Further, a gate electrode of the nonvolatile memory element M01 is connected to a word line WL11, one of a source and a drain thereof is connected to the source or the drain of the selecting transistor S01, and the other is connected to a source line SL.

The selecting transistor provided in the memory portion has high drive voltage compared to the transistor provided in the logic portion. Therefore, a gate insulating film and the like of the transistor provided in the memory portion and those of the transistor provided in the logic portion are preferably formed with different thicknesses. For example, when low drive voltage and low variation in threshold voltage are desired, the transistor preferably has a thin gate insulating film, whereas, when high drive voltage and high withstanding voltage of a gate insulating film are demanded, the transistor preferably has a thick gate insulating film.

Therefore, with reference to drawings, this embodiment will hereinafter explain the case where a thin insulating film is formed in the transistor in the logic portion in which low drive voltage and low variation in threshold voltage are desired, and a thick insulating film is formed in the transistor in the memory portion in which high drive voltage and high withstanding voltage of a gate insulating film are demanded. In FIGS. 18A to 21C, the transistors provided in the logic portion are shown between A-B and between C-D, the nonvolatile memory element provided in the memory portion is shown between E-F, and the transistor provided in the memory portion is shown between G-H. In addition, this embodiment will explain the case where the transistor provided between A-B is a p-channel type, the transistors provided between C-D and between G-H are each an n-channel type, and electrons are used for carrier transition in the nonvolatile memory element provided between E-F. However, the nonvolatile semiconductor memory device of the present invention is not limited thereto.

First, island-like semiconductor films 104, 106, 108, and 110 are formed over a substrate 100 with a base insulating film 102 interposed therebetween. First insulating films 112, 114, 116, and 118 are formed so as to cover the island-like semiconductor films 104, 106, 108, and 110, respectively. Then, a charge accumulating film 120 is formed so as to cover the first insulating films 112, 114, 116, and 118 (see FIG. 18A). The island-like semiconductor films 104, 106, 108, and 110 can be provided as follows: an amorphous semiconductor film is formed of a material including silicon (Si) as its main component (such as $Si_xGe_{1-x}$) or the like by a sputtering method, an LPCVD method, a plasma CVD method, or the like over the base insulating film 102 which is formed over the substrate 100 in advance, and the amorphous semiconductor film is crystallized and then selectively etched. Alternatively, the amorphous semiconductor film may be selectively etched without being crystallized, so that the island-like semiconductor films 104, 106, 108, and 110 are formed using the amorphous semiconductor film.

The amorphous semiconductor film can be crystallized by a laser crystallization method, a thermal crystallization method using RTA or an annealing furnace, a thermal crystallization method using a metal element which promotes crystallization, a method in which any of these methods is combined with another, or the like.

When crystallization or recrystallization of the semiconductor film is performed by laser irradiation, an LD-pumped continuous wave (CW) laser (YVO$_4$, the second harmonic (wavelength: 532 nm)) can be used as a light source of laser light. The wavelength is not necessarily limited to the second harmonic in particular; however, the second harmonic is superior to other higher harmonics in terms of energy efficiency. When the semiconductor film is irradiated with a CW laser, the semiconductor film continuously receives energy; therefore, once the semiconductor film is melted, the melted state can be continued. Moreover, it is possible to move a solid-liquid interface of the semiconductor film by scanning a CW laser and to form a crystal grain which is long in one direction along this moving direction. A solid-state laser is used because highly stable output and stable processing are expected as compared with a gas laser and the like. Not only a CW laser but also a pulsed laser with a repetition rate of 10 MHz or more can be used. With a pulsed laser having a high repetition rate, when a period for the melted semiconductor film to solidify is shorter than the pulse interval of the laser, the semiconductor film can remain melted constantly, which enables the semiconductor film to have a crystal grain that is long in one direction by the movement of the solid-liquid interface. Other CW lasers and pulsed lasers with repetition rates of 10 MHz or more can also be used. For example, an Ar laser, a Kr laser, a CO$_2$ laser, or the like can be used as a gas laser. Moreover, a metal vapor laser such as a helium-cadmium laser can be used as a gas laser. A YAG laser, a YLF laser, a YAlO$_3$ laser, a GdVO$_4$ laser, a KGW laser, a KYW laser, an alexandrite laser, a Ti:sapphire laser, a Y$_2$O$_3$ laser, a YVO$_4$ laser, or the like can be used as a solid-state laser. Moreover, among the solid-state lasers, a YAG laser, a Y$_2$O$_3$ laser, a GdVO$_4$ laser, a YVO$_4$ laser, or the like can be used as a ceramic laser. It is preferable to emit laser light with TEM$_{00}$ (single transverse mode) from a laser oscillator because a linear beam spot on a surface to be irradiated can have more homogeneous energy. Besides those above, a pulsed excimer laser may be used.

As the substrate 100, a glass substrate, a quartz substrate, a ceramic substrate, a metal substrate (such as a stainless steel substrate), or the like can be used. In addition, as a plastic substrate, a substrate formed of polyethylene terephthalate (PET), polyethylene naphthalate (PEN), polyether sulfone (PES), acrylic, or the like can be used.

The base insulating film 102 is formed by a CVD method, a sputtering method, or the like using an insulating material such as silicon oxide, silicon nitride, silicon oxynitride (SiO$_x$N$_y$, x>y>0), or silicon nitride oxide (SiN$_x$O$_y$, x>y>0). For example, in the case of the base insulating film 102 having a two-layer structure, a silicon nitride oxide film may be formed as a first insulating film, and a silicon oxynitride film may be formed as a second insulating film. Alternatively, a silicon nitride film may be formed as the first insulating film, and a silicon oxide film may be formed as the second insulating film. By the formation of the base insulating film 102 functioning as a blocking layer, an element formed over the substrate can be prevented from being adversely affected by alkali metal such as Na or alkaline earth metal from the substrate 100. When the substrate 100 is a quartz substrate, the base insulating film 102 may be omitted.

The first insulating films 112, 114, 116, and 118 are preferably formed by performing plasma oxidation on an insulating film formed by a CVD method, a sputtering method, or the like. For example, the first insulating films 112, 114, 116, and 118 are formed by forming an insulating film including silicon oxide, silicon oxynitride, aluminum oxide (Al$_x$O$_y$), tantalum oxide (Ta$_x$O$_y$), hafnium oxide (HfO$_x$), or the like by a CVD method or a sputtering method and performing plasma oxidation on the insulating film. The insulating film is preferably formed with a thickness of 1 nm to 20 nm, more preferably, from 1 nm to 10 nm.

The plasma oxidation uses plasma which is excited at a high frequency such as by microwave (typically, 2.45 GHz) and which has an electron density of $1\times10^{11}$ cm$^{-3}$ or more and a plasma electron temperature of 1.5 eV or less. More specifically, plasma with an electron density of $1\times10^{11}$ cm$^{-3}$ to $1\times10^{13}$ cm$^{-3}$ and a plasma electron temperature of 0.5 eV to 1.5 eV is preferably used. Moreover, the plasma oxidation time performed on the insulating film is preferably 60 seconds or longer.

The plasma oxidation is performed in an atmosphere including at least oxygen (such as an oxygen atmosphere; an atmosphere including oxygen (O$_2$) or nitrogen suboxide (N$_2$O) and a noble gas (at least one of He, Ne, Ar, Kr, and Xe); or an atmosphere including oxygen or nitrogen suboxide, hydrogen (H$_2$), and a noble gas). When the atmosphere includes hydrogen, the amount of hydrogen is preferably less than that of oxygen or nitrogen suboxide and the noble gas.

As the noble gas, for example, Ar can be used. Moreover, a mixed gas of Ar and Kr may be used. In the case of performing the plasma oxidation in a noble gas atmosphere, the first insulating films 112, 114, 116, and 118 formed by the plasma oxidation may include the noble gas used in the plasma treatment (at least one of He, Ne, Ar, Kr, and Xe). For example, when Ar is used as the noble gas in the plasma oxidation, the first insulating films 112, 114, 116, and 118 may include Ar.

The plasma oxidation in the present invention is performed under the conditions where the plasma electron density is high at $1\times10^{11}$ cm$^{-3}$ or more and the plasma electron temperature is low in the vicinity of the insulating film, which is an object to be processed; therefore, it is possible to prevent the first insulating films 112, 114, 116, and 118 from being damaged due to the plasma. Moreover, since the plasma electron density is high at $1\times10^{11}$ cm$^{-3}$ or more, a film formed by performing plasma oxidation on the object to be processed (here, the first insulating films 112, 114, 116, and 118) can be denser and have a higher withstand voltage than a film formed by a CVD method, a sputtering method, or the like. Moreover, since the plasma electron temperature is low at 1.5 eV or less, oxidation treatment can be performed on the object to be processed at lower temperature than in conventional plasma treatment and thermal oxidation method. For example, plasma oxidation at 100° C. or more below the distortion point of the glass substrate can be used to perform oxidation treatment sufficiently.

When the insulating film including hydrogen formed by a CVD method, a sputtering method, or the like is subjected to the plasma oxidation, the film can have a reduced hydrogen content.

In this embodiment, a mixed gas of oxygen (O$_2$) and argon (Ar) is introduced at the plasma oxidation of the object to be processed. The mixed gas used here may include oxygen at 0.1 sccm to 100 sccm and argon at 100 sccm to 5000 sccm. For example, oxygen, hydrogen, and argon may be introduced at 5 sccm, 5 sccm, and 900 sccm, respectively.

In this embodiment, the first insulating film 116 formed over the semiconductor film 108 in the memory portion functions as a tunnel insulating film in the nonvolatile memory element to be completed later. Therefore, the thinner the first insulating film 106 is, the more easily tunneling current flows, which enables a memory to operate at high speed. In addition, when the first insulating film 116 is thinner, a floating gate electrode to be formed later can accumulate charges at lower voltage. Therefore, the power consumption of the nonvolatile semiconductor memory device can be reduced. Accordingly, the first insulating films 112, 114, 116, and 118 are preferably formed to be thin.

As a general method for forming a thin insulating film over a semiconductor film, a thermal oxidation method is given. When a substrate whose melting point is not sufficiently high, such as a glass substrate, is used as the substrate 100, it is very difficult to form the first insulating films 112, 114, 116, and 118 by a thermal oxidation method. Moreover, an insulating film formed by a CVD method or a sputtering method does not have sufficient film quality because defects are included inside the film. Moreover, a thin insulating film formed by a CVD method or a sputtering method has a problem of a defect such as a pin hole. In addition, an insulating film formed by a CVD method or a sputtering method does not cover an end portion of the semiconductor film sufficiently in particular, which may cause short-circuiting between the semiconductor film and the charge accumulating film and the like that are later formed over the first insulating film 116. Therefore, as shown in this embodiment, when the first insulating films 112, 114, 116, and 118 are formed by plasma oxidation, the insulating films can be denser and have a higher withstand voltage than an insulating film formed by a CVD method, a sputtering method, or the like. Moreover, the end portions of the semiconductor films 104, 106, 108, and 110 can be covered with the first insulating films 112, 114, 116, and 118 sufficiently. Accordingly, the memory can operate at high speed and the charge holding characteristic of the memory can be improved.

The nonvolatile semiconductor memory device to be completed later stores information by injecting electrons through the first insulating film 116 which is formed over the semiconductor film 108 in the memory portion and which functions as the tunnel insulating film. At this time, when hydrogen causing electron traps exists in the tunnel insulating film, voltage varies in the course of repeating writing and erasing, which causes the memory to deteriorate. Therefore, the hydrogen content is preferably low in the tunnel insulating film. As shown in this embodiment, when the first insulating film 116 is formed by plasma oxidation, the hydrogen content of the film can be reduced as compared with an insulating film formed by a CVD method, a sputtering method, or the like. As a result, the performance of the memory can be improved.

The charge accumulating film 120 can be formed as a single layer or a stack of two or more layers. Specifically, the charge accumulating film 120 can be formed of an element selected from silicon (Si), germanium (Ge), tungsten (W), titanium (Ti), tantalum (Ta), molybdenum (Mo), and the like, an alloy material including the element as its main component, or a compound material including the element as its main component (such as a nitride or an oxide of the element). As the compound of the element, silicon nitride, silicon nitride oxide, silicon carbide, silicon germanium including germanium at less than 10 atomic %, tantalum nitride, tantalum oxide, tungsten nitride, titanium nitride, titanium oxide, tin oxide, or the like can be used. Moreover, a silicide of the element (such as tungsten silicide, titanium silicide, or nickel silicide) can be used. Moreover, in a case of using silicon, an impurity such as phosphorus or boron may be added. Here, the charge accumulating film 120 can be formed using a film including germanium as its main component with a thickness of 1 nm to 20 nm, preferably 5 nm to 10 nm, by a plasma CVD method in an atmosphere including a germanium element (such as $GeH_4$). The charge accumulating film 120 formed over the semiconductor film 108 in the memory portion functions as a floating gate electrode in the nonvolatile semiconductor memory device to be completed later. For example, when the semiconductor film is formed of a material including Si as its main component, and a conductive film including germanium with a smaller energy gap than Si functioning as the floating gate electrode is provided over the semiconductor film with the first insulating film functioning as the tunnel insulating film interposed therebetween, a second barrier formed using the insulating film against the charge of the floating gate electrode is higher in energy than a first barrier formed using the insulating film against the charge of the semiconductor film. Therefore, the charges can be easily injected from the semiconductor film to the floating gate electrode, whereby the charges can be prevented from disappearing from the floating gate electrode. That is to say, in the case of operating a memory, highly efficient writing is possible at low voltage and the charge holding characteristic can be improved.

Next, the first insulating films 112, 114, and 118 and the charge accumulating film 120 formed over the semiconductor films 104, 106, and 110 are removed selectively, so that the first insulating film 116 and the charge accumulating film 120 that are formed over the semiconductor film 108 remain. Here, the semiconductor film 108, the first insulating film 116, and the charge accumulating film 120 in the memory portion are selectively covered with a resist, and the first insulating films 112, 114, and 118 and the charge accumulating film 120 formed over the semiconductor films 104, 106, and 110 are etched away selectively (see FIG. 18B).

Next, a resist 122 is formed so as to cover the semiconductor films 104, 106, and 110 and a part of the charge accumulating film 120 that is formed over the semiconductor film 108, and the other part of the charge accumulating film 120 that is not covered with the resist 122 is selectively etched away. Thus, the charge accumulating film 120 is partially left behind to form a charge accumulating film 121 (see FIG. 18C).

Next, an impurity region is formed in a particular region of the semiconductor film 110. Here, after removing the resist 122, a resist 124 is formed so as to cover the semiconductor films 104, 106, and 108 and a part of the semiconductor film 110, and an impurity element is introduced in the other part of the semiconductor film 110 that is not covered with the resist 124, whereby impurity regions 126 are formed (see FIG. 19A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is introduced in the semiconductor film 110 as the impurity element.

Subsequently, a second insulating film 128 is formed so as to cover the semiconductor films 104, 106, and 110, and the first insulating film 116 and the charge accumulating film 121 which are formed over the semiconductor film 108 (see FIG. 19B).

The second insulating film 128 is preferably formed by performing plasma oxidation on an insulating film formed by a CVD method, a sputtering method, or the like. For example, an insulating film is formed of silicon oxide, silicon oxynitride, silicon nitride oxide, aluminum oxide ($Al_xO_y$), tantalum oxide ($Ta_xO_y$), hafnium oxide ($HfO_x$), or the like by a CVD method or a sputtering method and plasma oxidation is performed on the insulating film, whereby the second insulating film 128 is formed. The second insulating film 128 is preferably formed with a thickness of 1 nm to 100 nm, more preferably, from 20 nm to 60 nm.

The plasma oxidation uses plasma which is excited at a high frequency such as by microwave (typically, 2.45 GHz) and which has an electron density of $1\times10^{11}$ cm$^3$ or more and a plasma electron temperature of 1.5 eV or less. More specifically, plasma with an electron density of $1\times10^{11}$ cm$^{-3}$ to $1\times10^{13}$ cm$^{-3}$ and a plasma electron temperature of 0.5 eV to 1.5 eV is preferably used. Moreover, the plasma oxidation time performed on the insulating film is preferably 60 seconds or longer.

The plasma oxidation is performed in an atmosphere including at least oxygen (such as an oxygen atmosphere; an atmosphere including oxygen ($O_2$) or nitrogen suboxide ($N_2O$) and a noble gas (at least one of He, Ne, Ar, Kr, and Xe); or an atmosphere including oxygen or nitrogen suboxide, hydrogen ($H_2$), and a noble gas). When the atmosphere includes hydrogen, the amount of hydrogen is preferably less than that of oxygen or nitrogen suboxide and the noble gas.

As the noble gas, for example, Ar can be used. Moreover, a mixed gas of Ar and Kr may be used. In the case of performing the plasma oxidation in a noble gas atmosphere, the second insulating film 128 formed by the plasma oxidation may include the noble gas used in the plasma treatment (at least one of He, Ne, Ar, Kr, and Xe). For example, when Ar is used as the noble gas in the plasma oxidation, the second insulating film 128 may include Ar.

The plasma oxidation in the present invention is performed under the conditions where the plasma electron density is high at $1\times10^{11}$ cm$^{-3}$ or more and the plasma electron temperature is low in the vicinity of the insulating film, which is an object to be processed; therefore, it is possible to prevent the second insulating film 128 from being damaged due to the plasma. Moreover, since the plasma electron density is high at $1\times10^{11}$ cm$^{-3}$ or more, a film (here, the second insulating film 128) formed by performing plasma oxidation on the object to be processed can be denser and have a higher withstand voltage than a film formed by a CVD method, a sputtering method, or the like. Moreover, since the plasma electron temperature is low at 1.5 eV or less, oxidation treatment can be performed on the object to be processed at lower temperature than in conventional plasma treatment and thermal oxidation method. For example, plasma oxidation at 100° C. or more below the distortion point of the glass substrate can be used to perform oxidation treatment sufficiently.

When the insulating film including hydrogen formed by a CVD method, a sputtering method, or the like is subjected to the plasma oxidation, the film can have a reduced hydrogen content.

In this embodiment, a mixed gas of oxygen ($O_2$) and argon (Ar) is introduced at the plasma oxidation of the object to be processed. The mixed gas used here may include oxygen at 0.1 sccm to 100 sccm and argon at 100 sccm to 5000 sccm. For example, oxygen, hydrogen, and argon may be introduced at 5 sccm, 5 scan, and 900 sccm, respectively.

In this embodiment, the second insulating film 128 formed over the semiconductor film 108 in the memory portion will function as a control insulating film in the nonvolatile memory element to be completed later. The second insulating film 128 formed over the semiconductor film 110 will function as a gate insulating film in the transistor to be completed later. Therefore, when the second insulating film 128 is dense and has a high withstand voltage, a nonvolatile memory element to be completed later can have improved charge holding characteristic. Moreover, a defect such as leakage current of the transistor to be completed later can be prevented.

The second insulating film 128 can be formed of an insulating material such as silicon oxide, silicon nitride, silicon oxynitride x>y>0), or silicon nitride oxide ($SiN_xO_y$, x>y>0) as a single layer or a stack of layers. For example, when the second insulating film 128 is formed as a single layer, a silicon oxynitride film or a silicon nitride oxide film is formed by a CVD method with a thickness of 5 nm to 50 nm. When the second insulating film 128 is formed as a stack of three layers, a silicon oxynitride film is formed as a first insulating film, a silicon nitride film is formed as a second insulating film, and a silicon oxynitride film is formed as a third insulating film. In addition, a material such as germanium oxide or germanium nitride may be used for the second insulating film 128.

Next, a resist 130 is selectively formed so as to cover the second insulating film 128 formed over the semiconductor films 108 and 110. Then, the second insulating film 128 formed over the semiconductor films 104 and 106 is selectively removed (see FIG. 19C).

Next, third insulating films 132 and 134 are formed to cover the semiconductor films 104 and 106 (see FIG. 20A).

The third insulating films 132 and 134 are formed by any of the methods shown to form the first insulating films 112, 114, 116, and 118. For example, an insulating film is formed of silicon oxide, silicon oxynitride, silicon nitride oxide, aluminum oxide ($Al_xO_y$), tantalum oxide ($Ta_xO_y$), hafnium oxide ($HfO_x$), or the like by a CVD method or a sputtering method and the insulating film is then subjected to plasma oxidation; thus, the third insulating films 132 and 134 are formed over the semiconductor films 104 and 106, respectively. The insulating films are preferably formed with a thickness of 1 nm to 20 nm, more preferably, from 1 nm to 10 nm. The third insulating films 132 and 134 formed over the semiconductor films 104 and 106 function as gate insulating films in the transistors to be completed later.

Next, a conductive film is formed to cover the third insulating films 132 and 134 formed over the semiconductor films 104 and 106, and the second insulating film 128 formed over the semiconductor films 108 and 110 (see FIG. 20B). Here, an example of stacking conductive films 136 and 138 in order as the conductive film is shown. It is needless to say that the conductive film may be formed as a single layer or a stack of three or more layers.

The conductive films 136 and 138 can be formed of an element selected from tantalum (Ta), tungsten (W), titanium (Ti), molybdenum (Mo), aluminum (Al), copper (Cu), chromium (Cr), niobium (Nb), and the like, or an alloy or compound material including any of these elements as its main component. Moreover, a metal nitride film formed by nitriding the element can be used. In addition, a semiconductor material typified by polycrystalline silicon doped with an impurity element such as phosphorus can be used.

Here, the conductive film 136 is formed of tantalum nitride and the conductive film 138 is formed of tungsten over the conductive film 136. Alternatively, the conductive film 136 may be formed of tungsten nitride, molybdenum nitride, or titanium nitride as a single layer or a stack of layers, and the conductive film 138 may be formed of tantalum, molybdenum, or titanium as a single layer or a stack of layers.

Next, a stack of the conductive films 136 and 138 is selectively etched away so that the conductive films 136 and 138 remain over parts of the semiconductor films 104, 106, 108, and 110, whereby a gate electrode 140, a gate electrode 142, a gate electrode 144, and a gate electrode 146 are formed (see FIG. 20C). The gate electrode 144 formed over the semiconductor film 108 in the memory portion functions as a control gate electrode in a nonvolatile memory element to be completed later. The gate electrodes 140, 142, and 146 function as gate electrodes of the transistors to be completed later.

Although the etching is performed so that end portions of the remaining conductive films 136 and 138 approximately match with each other when the gate electrodes 140, 142, 144, and 146 are formed in this embodiment, the present invention is not particularly limited. For example, in a case of forming the gate electrode to have a two-layer structure, the width of a lower conductive film (on a side in contact with the second insulating film 128 and the third insulating films 132 and 134) may be larger than the width of an upper conductive film (the width in a direction approximately parallel to a direction where carriers flow in a channel formation region (a direction connecting a source region and a drain region)). Moreover, a sidewall may be formed on a side surface of the gate electrode after forming the gate electrode.

Next, a resist 148 is selectively formed to cover the semiconductor film 104, and an impurity element is introduced in the semiconductor films 106, 108, and 110 by using the resist 148 and the gate electrodes 142, 144, and 146 as masks, whereby impurity regions are formed (see FIG. 21A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is used as the impurity element.

In FIG. 21A, high-concentration impurity regions 152 each forming a source or drain region, and a channel formation region 150 are formed in the semiconductor film 106 by introducing an impurity element. Moreover, in the semiconductor film 108, high-concentration impurity regions 156 each forming a source or drain region, low-concentration impurity regions 158 forming LDD regions, and a channel formation region 154 are formed. Further, in the semiconductor film 110, high-concentration impurity regions 162 each forming a source or drain region, low-concentration impurity regions 164 forming LDD regions, and a channel formation region 160 are formed.

The low-concentration impurity regions 158 in the semiconductor film 108 are formed in such a way that the impurity element introduced in FIG. 21A passes through the charge accumulating film 121 functioning as a floating gate electrode. Therefore, the channel formation region 154 is formed in a region of the semiconductor film 108 that overlaps with both the gate electrode 144 and the charge accumulating film 121, and the low-concentration impurity regions 158 are formed in regions that overlap with the charge accumulating film 121 but do not overlap with the gate electrode 144. Moreover, the high-concentration impurity regions 156 are formed in regions that overlap with neither the charge accumulating film 121 nor the gate electrode 144.

Next, a resist 166 is selectively formed so as to cover the semiconductor films 106, 108, and 110. An impurity element is introduced in the semiconductor film 104 by using the resist 166 and the gate electrode 140 as masks, whereby impurity regions are formed (see FIG. 21B). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, an impurity element (such as boron (B)) having a different conductivity type from the impurity element introduced in the semiconductor films 106, 108, and 110 in FIG. 21A is introduced. As a result, high-concentration impurity regions 170 each forming a source or drain region and a channel formation region 168 are formed in the semiconductor film 104.

Subsequently, an insulating film 172 is formed so as to cover the second insulating film 128, the third insulating films 132 and 134, and the gate electrodes 140, 142, 144, and 146. Then, a conductive film 174 which is electrically connected to the impurity regions 152, 156, 162, and 170 formed in the semiconductor films 104, 106, 108, and 110 respectively is formed over the insulating film 172 (see FIG. 21C).

The insulating film 172 can be formed as a single layer or a stack of layers by a CVD method, a sputtering method, or the like using an insulating film including oxygen or nitrogen, such as silicon oxide, silicon nitride, silicon oxynitride ($SiO_xN_y$, x>y>0), or silicon nitride oxide ($SiN_xO_y$, x>y>0); a film including carbon such as DLC (diamond-like carbon); or a film including a siloxane material such as a siloxane resin, or an organic material such as epoxy, polyimide, polyamide, polyvinylphenol, benzocyclobutene, or acrylic. The siloxane material corresponds to a material including a Si—O—Si bond. Siloxane has a skeletal structure including a bond of silicon (Si) and oxygen (O). For a substituent, an organic group including at least hydrogen (such as an alkyl group or aromatic hydrocarbon) is used. A fluoro group can also be used for a substituent. In addition, an organic group including at least hydrogen, and a fluoro group may be used for a substituent.

The conductive film 174 is formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy or compound material including any of these elements as its main component, as a single layer or a stack of layers by a CVD method, a sputtering method, or the like. For example, as an alloy material including aluminum as its main component, the following can be used: a material including aluminum as its main component and also including nickel; or a material including aluminum as its main component and also including nickel and one or both of carbon and silicon. As the conductive film 174, for example, a stacked structure of a barrier film, an aluminum-silicon (Al—Si) film, and another barrier film, or a stacked structure of a barrier film, an aluminum-silicon (Al—Si) film, a titanium nitride (TiN) film, and another barrier film is preferably employed. It is to be noted that the barrier film corresponds to a thin film of titanium, titanium nitride, molybdenum, or molybdenum nitride. Since aluminum and aluminum silicon have low resistance and are inexpensive, they are suitable for forming the conductive film 174. When barrier layers are formed as an upper layer and a lower layer, the generation of a hillock in aluminum and aluminum silicon can be prevented. Moreover, when the barrier film is formed of titanium, which is an element with a high reducing property, even if a thin natural oxide film is formed over the crystalline semiconductor film, favorable contact with the crystalline semiconductor film can be made by reducing this natural oxide film.

This embodiment can be combined with any of other embodiment mode and embodiments shown in this specification.

Embodiment 7

This embodiment will explain an example of a nonvolatile semiconductor memory device, which is different from that in Embodiment 6, with reference to drawings. Note that in FIGS. 22A to 25B, transistors provided in a logic portion are shown between A-B and between C-D; a nonvolatile memory element provided in a memory portion is shown between E-F; and a transistor provided in the memory portion is shown between G-H. In addition, although description in this embodiment is made of the case where the transistor provided between A-B is a p-channel type, the transistors provided between C-D and between G-H are each an n-channel type, and electrons are used for carrier transition in the nonvolatile memory element provided between E-F, the nonvolatile semiconductor memory device of the present invention is not limited to this.

First, regions 204, 206, 208, and 210 in each of which elements are separated are formed in a substrate 200, and first insulating films 212, 214, 216, and 218 are formed on surfaces of the regions 204, 206, 208, and 210, respectively. Then, a charge accumulating film functioning as a floating gate electrode in the nonvolatile memory element to be completed later is formed so as to cover the first insulating films 212, 214, 216, and 218 (see FIG. 22A). Here, the charge accumulating film functioning as a floating gate electrode is formed as a stack of a charge accumulating film 220 and a charge accumulating film 223. The regions 204, 206, 208, and 210 provided in the substrate 200 are separated by an insulating film 202 (also called a field oxide film). Moreover, a single-crystal Si substrate having n-type conductivity is used as the substrate 200 here, and p wells 207 are provided in the regions 206, 208, and 210 in the substrate 200 in this example.

The substrate 200 may be any substrate without particular limitation as long as the substrate is a semiconductor substrate. For example, a single-crystal Si substrate having n-type conductivity or p-type conductivity, a compound semiconductor substrate (such as a GaAs substrate, an InP substrate, a GaN substrate, a SiC substrate, a sapphire substrate, or a ZnSe substrate), an SOI (Silicon On Insulator) substrate manufactured by a bonding method or a SIMOX (Separation by Implanted Oxygen) method, or the like can be used.

The regions 204, 206, 208, and 210 where the elements are separated can be formed by a selective oxidation method (such as a LOCOS (Local Oxidation of Silicon) method), a trench separation method, or the like.

The p wells formed in the regions 206, 208, and 210 in the substrate 200 can be formed by selectively introducing an impurity element imparting p-type conductivity in the substrate 200. As the impurity element imparting p-type conductivity, boron (B), aluminum (Al), gallium (Ga), or the like can be used.

Since the substrate 200 is a semiconductor substrate having n-type conductivity, an impurity element is not introduced in the region 204 in this embodiment; however, an n well may be formed in the region 204 by introducing an impurity element imparting n-type conductivity. As the impurity element imparting n-type conductivity, phosphorus (P), arsenic (As), or the like can be used. On the other hand, in a case of using a semiconductor substrate having p-type conductivity, the structure may be that in which an n well is formed by introducing an impurity element imparting n-type conductivity in the region 204 and an impurity element is not introduced in the regions 206, 208, and 210.

The first insulating films 212, 214, 216, and 218 can be formed using a silicon oxide film obtained by oxidizing surfaces of the regions 204, 206, 208, and 210 provided in the substrate 200 by a thermal oxidation method. The first insulating films 212, 214, 216, and 218 are each preferably formed with a thickness of 1 nm to 20 nm, more preferably, from 1 nm to 10 nm.

Moreover, the first insulating films 212, 214, 216, and 218 are preferably formed in such a way that the silicon oxide film formed by oxidizing the surfaces of the regions 204, 206, 208, and 210 in the substrate 200 by a thermal oxidation method is further subjected to plasma oxidation. This is because an insulating film formed by a thermal oxidation method such as wet oxidation includes hydrogen and the plasma oxidation can reduce the hydrogen content of the film.

The plasma oxidation uses plasma which is excited at a high frequency such as by microwave (typically, 2.45 GHz) and which has an electron density of $1\times10^{11}$ cm$^{-3}$ or more and a plasma electron temperature of 1.5 eV or less. More specifically, plasma with an electron density of $1\times10^{11}$ cm$^{-3}$ to $1\times10^{13}$ cm$^{-3}$ and a plasma electron temperature of 0.5 eV to 1.5 eV is preferably used. Moreover, the plasma oxidation time performed on the insulating film is preferably 60 seconds or longer.

The plasma oxidation is performed in an atmosphere including at least oxygen (such as an oxygen atmosphere; an atmosphere including oxygen ($O_2$) or nitrogen suboxide ($N_2O$) and a noble gas (at least one of He, Ne, Ar, Kr, and Xe); or an atmosphere including oxygen or nitrogen suboxide, hydrogen ($H_2$), and a noble gas). When the atmosphere includes hydrogen, the amount of hydrogen is preferably less than that of oxygen or nitrogen suboxide and the noble gas.

As the noble gas, for example, Ar can be used. Moreover, a mixed gas of Ar and Kr may be used. In the case of performing the plasma oxidation in a noble gas atmosphere, the first insulating films 212, 214, 216, and 218 formed by plasma oxidation may include the noble gas used in the plasma treatment (at least one of He, Ne, Ar, Kr, and Xe). For example, when Ar is used as the noble gas in the plasma oxidation, the first insulating films 212, 214, 216, and 218 may include Ar.

The plasma oxidation in the present invention is performed under the conditions where the plasma electron density is high at $1\times10^{11}$ cm$^{-3}$ or more and the plasma electron temperature is low in the vicinity of the insulating film, which is an object to be processed; therefore, it is possible to prevent the first insulating films 212, 214, 216, and 218 from being damaged due to the plasma.

Here, after forming the silicon oxide film on the surfaces of the regions 204, 206, 208, and 210 by wet oxidation, the first insulating films 212, 214, 216, and 218 are formed by performing plasma oxidation on the silicon oxide film. Here, the plasma oxidation is performed by introducing oxygen ($O_2$) at 5 sccm and argon at 900 sccm.

In this embodiment, the first insulating film 216 formed on the region 208 provided in the memory portion of the substrate 200 functions as a tunnel insulating film in the nonvolatile memory element to be completed later. Therefore, when the first insulating film 216 is thinner, the tunneling current flows more easily, which enables the memory to operate at high speed. Moreover, when the first insulating film 216 is thinner, a floating gate electrode to be formed later can accumulate charges at lower voltage. Therefore, the power consumption of the nonvolatile semiconductor memory device can be reduced. Accordingly, the first insulating films 212, 214, 216, and 218 are preferably formed to be thin.

A nonvolatile semiconductor memory device to be completed later stores information by injecting electrons through the first insulating film 216 which is formed on the region 208 provided in the memory portion and which functions as a tunnel insulating film. At this time, when hydrogen causing electron traps exists in the tunnel insulating film, voltage varies in the course of repeating writing and erasing, which causes the memory to deteriorate. Therefore, the hydrogen content of the tunnel insulating film is preferably low. As shown in this embodiment, when the first insulating film 216 is formed by plasma oxidation, the hydrogen content can be reduced as compared with an insulating film formed by a CVD method, a sputtering method, or the like. As a result, the performance of the memory can be improved.

The charge accumulating film formed over the first insulating film can be formed as a single layer or a stack of two or more layers. Specifically, the charge accumulating film can be formed of an element selected from silicon (Si), germanium (Ge), tungsten (W), titanium (Ti), tantalum (Ta), molybdenum (Mo), and the like; an alloy material including the element as its main component; or compound material including the element as its main component (such as a nitride or an oxide of the element). As the compound of the element, silicon nitride, silicon nitride oxide, silicon carbide, silicon germanium including germanium at less than 10 atomic %, tantalum nitride, tantalum oxide, tungsten nitride, titanium nitride, titanium oxide, tin oxide, or the like can be used. Moreover, a silicide of the element (such as tungsten silicide, titanium silicide, or nickel silicide) can be used. Moreover, in the case of using silicon, an impurity such as phosphorus or boron may be added. In this embodiment, the charge accumulating films 220 and 223 are formed as a stack of a film including germanium (Ge) such as a germanium film or a silicon-germanium alloy film, and a film including silicon (Si). Here, the charge accumulating film 220 is formed using a film including germanium as its main component with a thickness of 1 nm to 20 nm, preferably 1 nm to 10 nm, by a plasma CVD method in an atmosphere including a germanium element (such as $GeH_4$). After that, the charge accumulating film 223 is formed using a film including silicon as its main component with a thickness of 1 nm to 50 nm, preferably 1 nm to 20 nm, by a plasma CVD method in an atmosphere including a silicon element (such as $SiH_4$). For example, when a single-crystal Si substrate is used as the substrate 200 and a conductive film including germanium with a smaller energy gap than Si is provided over a certain region of the Si substrate with the first insulating film functioning as a tunnel insulating film interposed therebetween, a second barrier formed by the insulating film against the charge of the floating gate electrode is higher in energy than a first barrier formed by the insulating film against the charge of the certain region of the Si substrate. As a result, charges can be easily injected from the certain region of the Si substrate to the floating gate electrode, which can prevent the charges from disappearing from the floating gate electrode. That is to say, in the case of operating a memory, highly efficient writing is possible at low voltage and the charge holding characteristic can be improved. It is to be noted that the stacked structure including the charge accumulating film 220 and the charge accumulating film 223 formed over the region 208 in the memory portion of the substrate 200 functions as a floating gate electrode in the nonvolatile memory element to be completed later. Alternatively, a film including germanium and a film including a silicon-germanium alloy may be stacked in order.

Next, the first insulating films 212, 214, and 218 and the charge accumulating films 220 and 223 formed over the regions 204, 206, and 210 in the substrate 200 are removed selectively so that the first insulating film 216 and the stack of the charge accumulating film 220 and the charge accumulating film 223 formed over the region 208 remain. Here, the stacked structure including the region 208, the first insulating film 216, and the charge accumulating films 220 and 223 in the memory portion of the substrate 200 is covered with a resist selectively and the stacked structure including the first insulating films 212, 214, and 218 and the charge accumulating films 220 and 223 over the regions 204, 206, and 210 are etched away (see FIG. 22B).

Next, a second insulating film 228 is formed so as to cover the stacked structure including the regions 204, 206, and 210 in the substrate 200, and the first insulating film 216 and the charge accumulating films 220 and 223 formed over the region 208 (see FIG. 22C).

The second insulating film 228 is preferably formed by forming an insulating film by a CVD method, a sputtering method, a thermal oxidation method, or the like and performing plasma oxidation on the insulating film. For example, an insulating film is formed of silicon oxide, silicon oxynitride, silicon nitride oxide, aluminum oxide ($Al_xO_y$), tantalum oxide ($Ta_xO_y$), hafnium oxide ($HfO_x$), or the like by a CVD method or a sputtering method, and the insulating film is then subjected to plasma oxidation, whereby the second insulating film 228 is formed. The insulating film is preferably formed with a thickness of 1 nm to 100 nm, more preferably, from 20 nm to 60 nm. The plasma oxidation may be performed by the method shown to form the first insulating films.

The second insulating film 228 formed over the region 208 functions as a control insulating film in the nonvolatile memory element to be completed later. The second insulating film 228 formed over the region 210 functions as a gate insulating film in the transistor to be completed later.

Figure 23A:
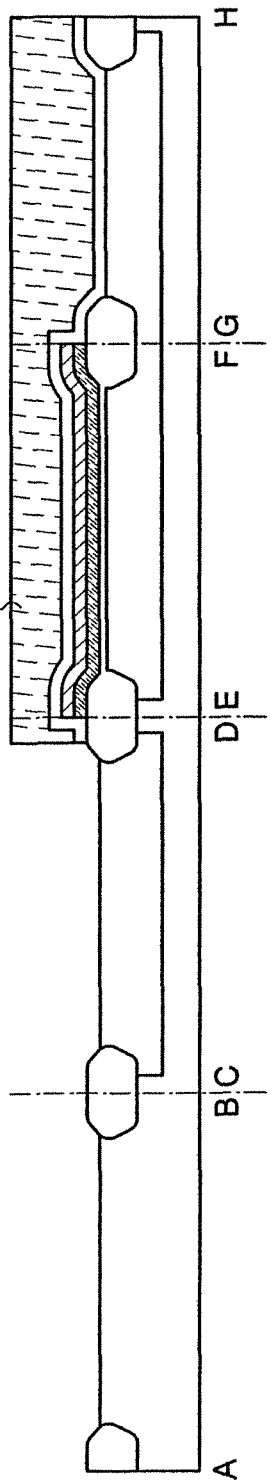
FIGS. 23A to 23C show an example of a manufacturing method of a nonvolatile semiconductor memory device of the present invention.

Next, a resist 230 is selectively formed so as to cover the second insulating film 228 formed over the regions 208 and 210, and the second insulating film 228 formed over the regions 204 and 206 is removed (see FIG. 23A).

Figure 23B:
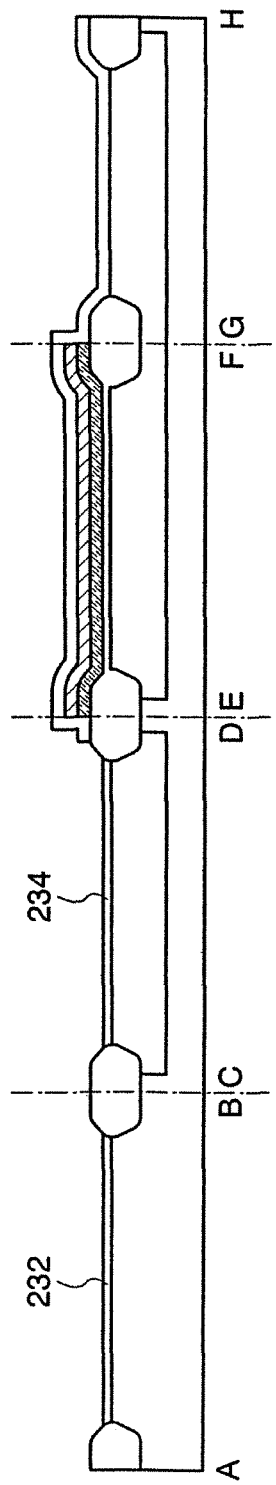

Subsequently, third insulating films 232 and 234 are formed so as to cover the regions 204 and 206 (see FIG. 23B).

The third insulating films 232 and 234 are formed by any of the methods shown to form the first insulating films 212 and 214, and the second insulating film 228. That is, a thermal oxidation method, a CVD method, or a sputtering method can be used. Moreover, the insulating film formed by any of these methods may be subjected to plasma oxidation. The third insulating films 232 and 234 formed over the regions 204 and 206 in the substrate 200 function as gate insulating films for the transistors to be completed later.

Figure 23C:
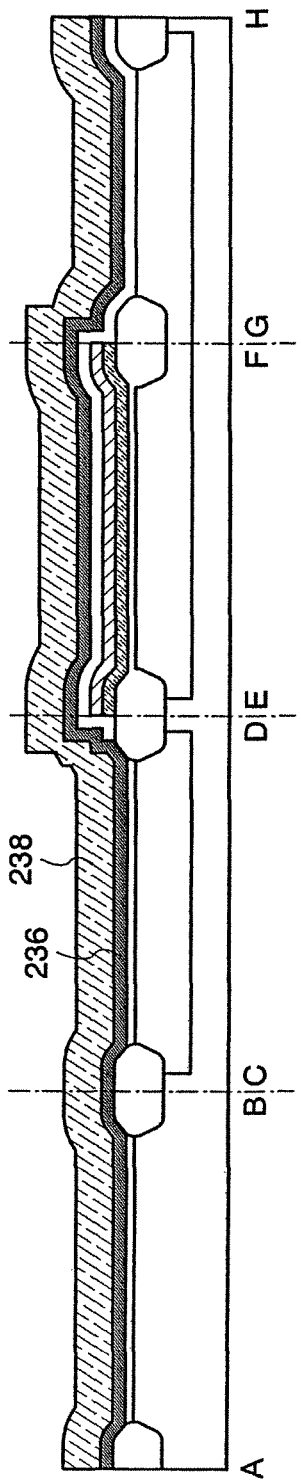

Subsequently, a conductive film is formed so as to cover the third insulating films 232 and 234 formed over the regions 204 and 206 and the second insulating film 228 formed over the regions 208 and 210 (see FIG. 23C). Here, an example of stacking conductive films 236 and 238 in order as the conductive film is shown. The conductive film may be formed as a single layer or a stack of three or more layers.

The conductive films 236 and 238 can be formed of an element selected from tantalum (Ta), tungsten (W), titanium (Ti), molybdenum (Mo), aluminum (Al), copper (Cu), chromium (Cr), niobium (Nb), and the like, or an alloy or compound material including any of these elements as its main component. Moreover, a metal nitride film formed by nitriding the element can be used. In addition, a semiconductor material typified by polycrystalline silicon doped with an impurity element such as phosphorus can be used.

Here, the conductive film 236 is formed of tantalum nitride and the conductive film 238 is formed of tungsten over the conductive film 236. In addition, the conductive film 236 may be formed of tungsten nitride, molybdenum nitride, or titanium nitride as a single layer or a stack of layers, and the conductive film 238 may be formed of tantalum, molybdenum, or titanium as a single layer or a stack of layers.

Next, a stack of the conductive films 236 and 238 is selectively etched away so that the conductive films 236 and 238 remain over parts of the regions 204, 206, 208, and 210, whereby gate electrodes 240, 242, 244, and 246 are formed respectively (see FIG. 24A). Surfaces of parts of the regions 204, 206, 208, and 210 that do not overlap with the gate electrodes 240, 242, 244, and 246 are exposed in this embodiment.

Specifically, a part of the third insulating film 232 formed under the gate electrode 240 that does not overlap with the gate electrode 240 on the region 204 is selectively removed, so that end portions of the gate electrode 240 and the third insulating film 232 approximately match with each other. On the region 206, a part of the third insulating film 234 formed under the gate electrode 242 that does not overlap with the gate electrode 242 is selectively removed, so that end portions of the gate electrode 242 and the third insulating film 234 approximately match with each other. Further, on the region 208, parts of the second insulating film 228, the stack of the charge accumulating films 220 and 223, and the first insulating film 216 formed under the gate electrode 244 that do not overlap with the gate electrode 244 are removed, so that end portions of the gate electrode 244, the second insulating film 228, and a stack of charge accumulating films 221 and 225, and the first insulating film 216 approximately match with each other. Moreover, on the region 210, a part of the second insulating film 228 formed under the gate electrode 246 that does not overlap with the gate electrode 246 is selectively removed, so that end portions of the gate electrode 246 and the second insulating film 228 match with each other.

In this case, at the same time as the formation of the gate electrodes 240, 242, 244, and 246, the parts of the insulating film and the like that do not overlap with them may be removed; alternatively, after forming the gate electrodes 240, 242, 244, and 246, the parts of the insulating film and the like that do not overlap with them may be removed by using the remaining resist or the gate electrodes 240, 242, 244, and 246 as masks. The gate electrode 244 formed over the region 208 in the memory portion of the substrate 200 functions as a control gate electrode in a nonvolatile memory element to be completed later. The gate electrodes 240, 242, and 246 function as gate electrodes of transistors to be completed later.

Next, an impurity element is selectively introduced in the regions 204, 206, and 208 in the substrate 200 (see FIG. 24B). Here, an impurity element imparting n-type conductivity is introduced selectively at a low concentration in the regions 206, 208, and 210 by using the gate electrodes 242, 244, and 246 as masks, and an impurity element imparting p-type conductivity is introduced selectively at a low concentration in the region 204 by using the gate electrode 240 as a mask. As the impurity element imparting n-type conductivity, phosphorus (P), arsenic (As), or the like can be used. As the impurity element imparting p-type conductivity, boron (B), aluminum (Al), gallium (Ga), or the like can be used.

Next, an insulating film 280 (also called a sidewall) is formed in contact with each of side surfaces of the gate electrodes 240, 242, 244, and 246 (see FIG. 25A). Specifically, a film including an inorganic material such as silicon, silicon oxide, or silicon nitride, or a film including an organic material such as an organic resin is formed as a single layer or a stack of layers by a plasma CVD method, a sputtering method, or the like. Then, the insulating film is selectively etched by anisotropic etching mainly in a perpendicular direction, so that the insulating film is formed in contact with each of the side surfaces of the gate electrodes 240, 242, 244, and 246. Moreover, the insulating film 280 may be formed by performing plasma oxidation on the formed insulating film as shown by the above method for forming the second insulating film. The insulating film 280 is used as a mask for doping when forming an LDD (Lightly Doped Drain) region. Here, the insulating film 280 is also formed in contact with each of side surfaces of the insulating films and the charge accumulating films formed under the gate electrodes 240, 242, 244, and 246.

Next, an impurity element is introduced in the regions 204, 206, 208, and 210 in the substrate 200 by using the insulating film 280 and the gate electrodes 240, 242, 244, and 246 as masks, whereby impurity regions each functioning as a source or drain region (see FIG. 25A) are formed. Here, an impurity element imparting n-type conductivity is introduced at a high concentration in the regions 206, 208, and 210 in the substrate 200 by using the insulating film 280 and the gate electrodes 242, 244, and 246 as masks, and an impurity element imparting p-type conductivity is introduced at a high concentration in the region 204 by using the insulating film 280 and the gate electrode 240 as masks.

As a result, impurity regions 269 each forming a source or drain region, low-concentration impurity regions 267 forming LDD regions, and a channel formation region 266 are formed in the region 204 in the substrate 200. In the region 206 in the substrate 200, impurity regions 253 each forming a source or drain region, low-concentration impurity regions 251 forming LDD regions, and a channel formation region 250 are formed. Moreover, in the region 208 in the substrate 200, impurity regions 257 each forming a source or drain region, low-concentration impurity regions 255 forming LDD regions, and a channel formation region 254 are formed. Further, in the region 210 in the substrate 200, impurity regions 263 each forming a source or drain region, low-concentration impurity regions 261 forming LDD regions, and a channel formation region 260 are formed.

It is to be noted that, in this embodiment, the impurity element is introduced in a state that parts of the regions 204, 206, 208, and 210 in the substrate 200 that do not overlap with the gate electrodes 240, 242, 244, and 246 are exposed. Therefore, the channel formation regions 266, 250, 254, and 260 formed in the regions 204, 206, 208, and 210 in the substrate 200 respectively can be formed in a self-aligning manner with the gate electrodes 240, 242, 244, and 246.

Subsequently, an insulating film 272 is formed so as to cover the insulating films, the charge accumulating films, and the like provided over the regions 204, 206, 208, and 210 in the substrate 200, and a conductive film 274, which is electrically connected to the impurity regions 269, 253, 257, and 263 formed in the regions 204, 206, 208, and 210 respectively, is formed over the insulating film 272 (see FIG. 25B).

The insulating film 272 can be formed by a CVD method, a sputtering method, or the like using an insulating film including oxygen or nitrogen, such as silicon oxide, silicon nitride, silicon oxynitride ($SiO_xN_y$, x>y>0), or silicon nitride oxide ($SiN_xO_y$, x>y>0); a film including carbon such as DLC (diamond-like carbon); or a film including a siloxane material such as a siloxane resin or an organic material such as epoxy, polyimide, polyimide, polyvinylphenol, benzocyclobutene, or acrylic as a single layer or a stack of layers. The siloxane material corresponds to a material including a Si—O—Si bond. Siloxane has a skeletal structure including a bond of silicon (Si) and oxygen (O). For a substituent, an organic group including at least hydrogen (such as an alkyl group or aromatic hydrocarbon) is used. A fluoro group can also be used for a substituent. In addition, an organic group including at least hydrogen, and a fluoro group may be used for a substituent.

The conductive film 274 is formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy or compound material including any of these elements as its main component, as a single layer or a stack of layers by a CVD method, a sputtering method, or the like. For example, as an alloy material including aluminum as its main component, the following can be used: a material including aluminum as its main component and also including nickel; or a material including aluminum as its main component and also including nickel and one or both of carbon and silicon. As the conductive film 274, for example, a stacked structure of a barrier film, an aluminum-silicon (Al—Si) film, and another barrier film, or a stacked structure of a barrier film, an aluminum-silicon (Al—Si) film, a titanium nitride (TiN) film, and another barrier film is preferably employed. It is to be noted that the barrier film corresponds to a thin film of titanium, titanium nitride, molybdenum, or molybdenum nitride. Since aluminum and aluminum silicon have low resistance and are inexpensive, they are suitable for forming the conductive film 274. When barrier layers are formed as an upper layer and a lower layer, the generation of a hillock in aluminum and aluminum silicon can be prevented. Moreover, when a barrier film is formed of titanium, which is an element with a high reducing property, even if a thin natural oxide film is formed over the crystalline semiconductor film, favorable contact with the crystalline semiconductor film can be made by reducing this natural oxide film.

This embodiment can be appropriately combined with the embodiment mode or any of the other embodiments shown in this specification.

Embodiment 8

This embodiment will explain characteristics of an insulating film formed by using the present invention. First, a sample A, a sample B, a sample C, and a sample D which are used for a measurement, and manufacturing methods thereof are explained.

Each of the sample A, the sample B, and the sample C had a structure in which a silicon oxynitride film ($SiO_xN_y$, $x>y>0$) was provided over a Si substrate, and an electrode made of an aluminum-titanium film was stacked over the silicon oxynitride film sequentially. The silicon oxynitride film was formed by performing plasma oxidation on a silicon oxynitride film formed by a plasma CVD method. Hereinafter, the sample A, the sample B, and the sample C are specifically explained.

As for the sample A, a Si substrate with a length of 12.7 cm on a side was prepared. A silicon oxynitride film was formed with a thickness of 9 nm over the Si substrate by a plasma CVD method under the following conditions: the $SiH_4$ flow rate was 1 sccm, the $N_2O$ flow rate was 800 sccm, the pressure in the chamber was 40 Pa, the high-frequency electric power was 150 W (60 MHz), the electrode interval was 28 mm, and the film-forming temperature (substrate temperature) was 400° C.

Next, the silicon oxynitride film was subjected to plasma oxidation for 180 seconds. After the plasma oxidation, the silicon oxynitride film had a thickness of 10 nm. The plasma oxidation was performed under the following conditions: the $O_2$ flow rate was 5 sccm, the Ar flow rate was 900 scan, the pressure in the chamber was 106.67 Pa, the high-frequency electric power was 3800 W (2.45 GHz), and the substrate temperature was 400° C.

Subsequently, an aluminum-titanium (Al—Ti) film, which is an alloy of aluminum and titanium, was formed with a thickness of 400 nm over the silicon oxynitride film by a sputtering method. The aluminum-titanium film was selectively etched by a photolithography method and an etching method, whereby an electrode with an area of $1.96 \times 10^{-3}$ $cm^2$ is formed. In accordance with the above steps, the sample A was obtained.

As for the sample B, first, a silicon oxynitride film was formed with a thickness of 9.5 nm over a Si substrate with a length of 12.7 cm on a side by a plasma CVD method. Since the silicon oxynitride film was formed under similar conditions to those of the sample A, the description is omitted.

Next, the silicon oxynitride film was subjected to plasma oxidation for 120 seconds. After the plasma oxidation, the silicon oxynitride film had a thickness of 10 nm. Since the plasma oxidation was performed under similar conditions to those of the sample A, the description is omitted.

Next, an aluminum-titanium (Al—Ti) film, which is an alloy of aluminum and titanium, was formed with a thickness of 400 nm over the silicon oxynitride film by a sputtering method. The aluminum-titanium film was selectively etched by a photolithography method and an etching method, whereby an electrode with an area of $1.96 \times 10^{-3}$ $cm^2$ is formed. In accordance with the above steps, the sample B was obtained.

As for the sample C, first, a silicon oxynitride film was formed with a thickness of 10 nm over a Si substrate with a length of 12.7 cm on a side by a plasma CVD method. Since the silicon oxynitride film was formed under similar conditions to those of the sample A, the description is omitted.

Next, the silicon oxynitride film was subjected to plasma oxidation for 60 seconds. After the plasma oxidation, the silicon oxynitride film had a thickness of 10 nm. Since the plasma oxidation was performed under similar conditions to those of the sample A, the description is omitted.

Next, an aluminum-titanium (Al—Ti) film, which is an alloy of aluminum and titanium, was formed with a thickness of 400 nm over the silicon oxynitride film by a sputtering method. The aluminum-titanium film was selectively etched, whereby an electrode with an area of $1.96 \times 10^{-3}$ $cm^2$ is formed. In accordance with the above steps, the sample C was obtained.

The sample D had a structure in which a silicon oxynitride film ($SiO_xN_y$, $x>y>0$) was provided over a Si substrate, and an electrode made of an aluminum-titanium film was stacked over the silicon oxynitride film sequentially. The silicon oxynitride film was formed by a plasma CVD method.

Specifically, first, a Si substrate with a length of 12.7 cm on a side was prepared. Then, a silicon oxynitride film was formed with a thickness of 10 nm by a plasma CVD method over the Si substrate under the following conditions: the $SiH_4$ flow rate was 1 sccm, the $N_2O$ flow rate was 800 sccm, the pressure in the chamber was 40 Pa, the high-frequency electric power was 150 W (60 MHz), the electrode interval was 28 mm, and the film-forming temperature (substrate temperature) was 400° C.

Next, an aluminum-titanium (Al—Ti) film, which is an alloy of aluminum and titanium, was formed with a thickness of 400 nm over the silicon oxynitride film by a sputtering method. The aluminum-titanium film was selectively etched to form an electrode with an area of $1.96 \times 10^{-3}$ $cm^2$. In accordance with the above steps, the sample D was obtained.

Figure 26A:
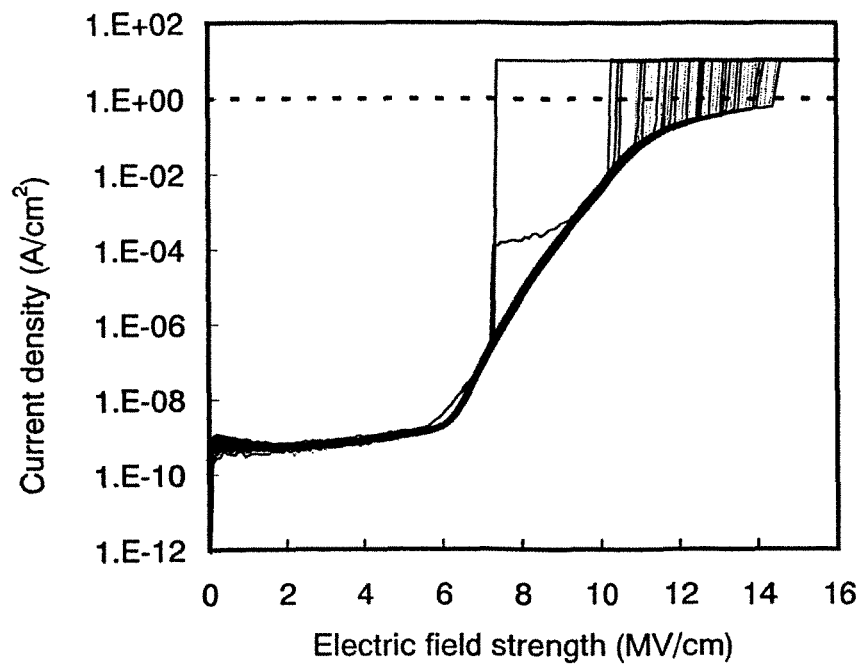
FIGS. 26A and 26B show characteristics of an insulating film of the present invention.
Figure 26B:
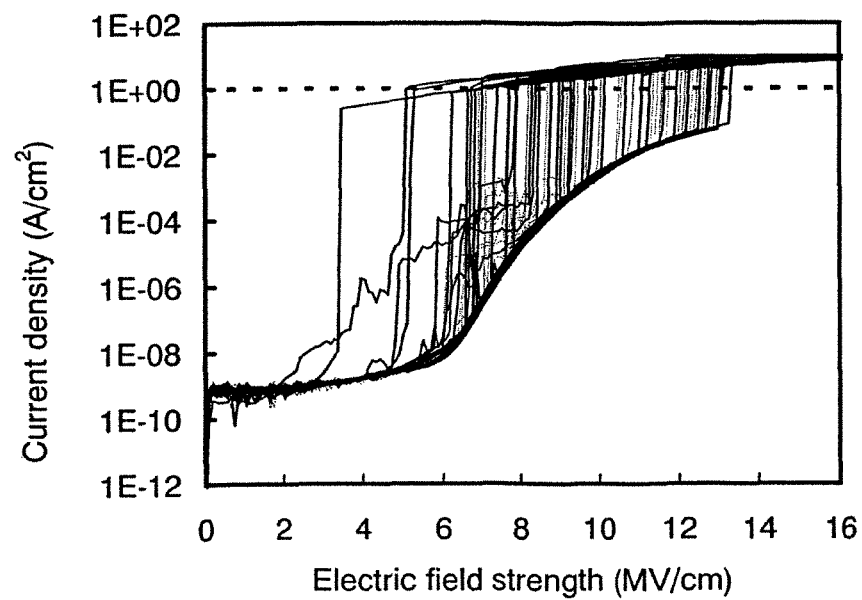

FIG. 26A shows a result of measuring current density-electric field strength (J-E) characteristics of the sample A. FIG. 26B shows a result of measuring J-E characteristics of the sample D. In each of FIGS. 26A and 26B, the vertical axis shows current density ($A/cm^2$) while the horizontal axis shows electric field strength (MV/cm). It is to be noted that the measurement was conducted at 112 points on a substrate surface and that a dotted line shows the scale at a current density of 1 A/cm² in FIGS. 26A and 26B.

Figure 27A:
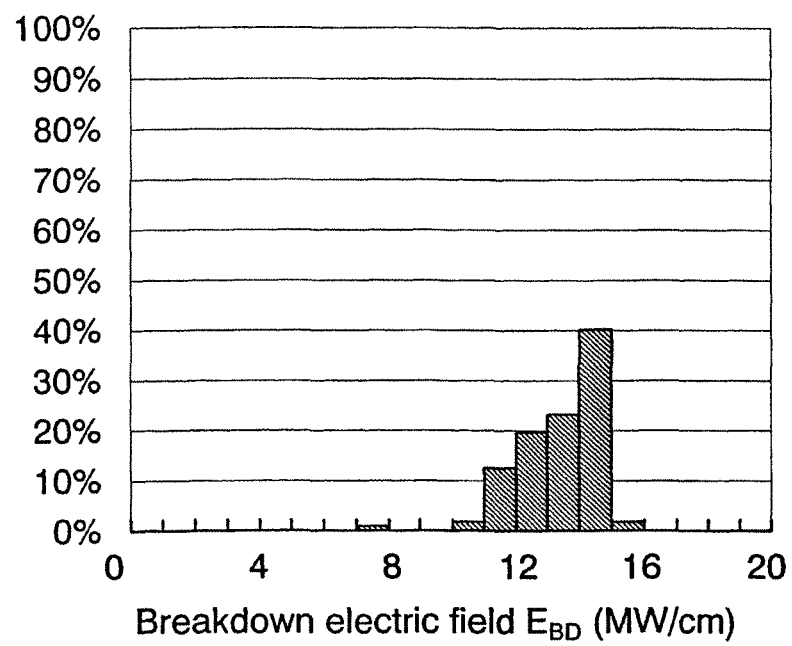
FIGS. 27A and 27B show characteristics of an insulating film of the present invention.
Figure 27B:
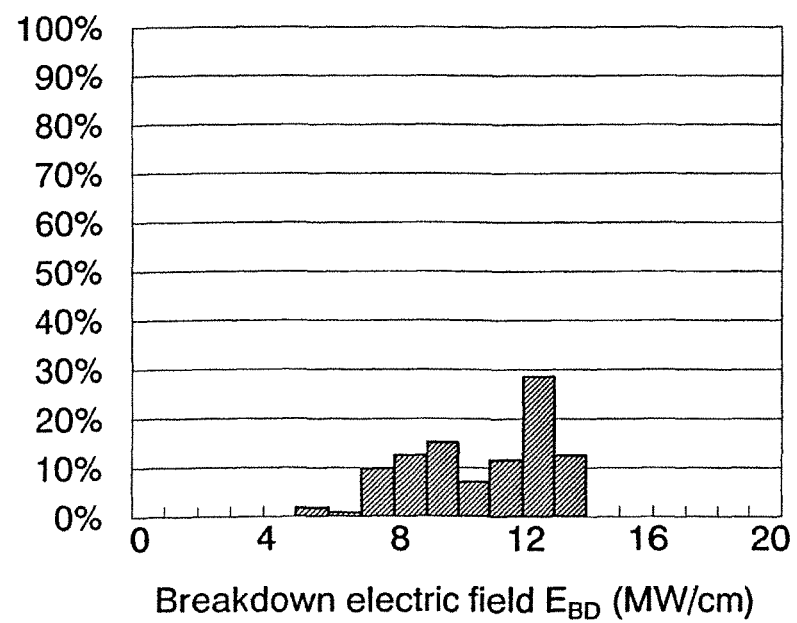

FIG. 27A shows the electric field strength at a current density of 1 A/cm² of FIG. 26A in a histogram form. FIG. 27B shows the electric field strength at a current density of 1 A/cm² of FIG. 26B in a histogram form. In each of FIGS. 27A and 27B, the vertical axis shows the percentage (%) of defects in withstand voltage while the horizontal axis shows breakdown electric field $E_{BD}$ (MV/cm). The percentage of defects in withstand voltage shown along the vertical axis was calculated based on the points at which the current density jumps at or over 1 A/cm² among the total 112 measured points.

Figure 28:
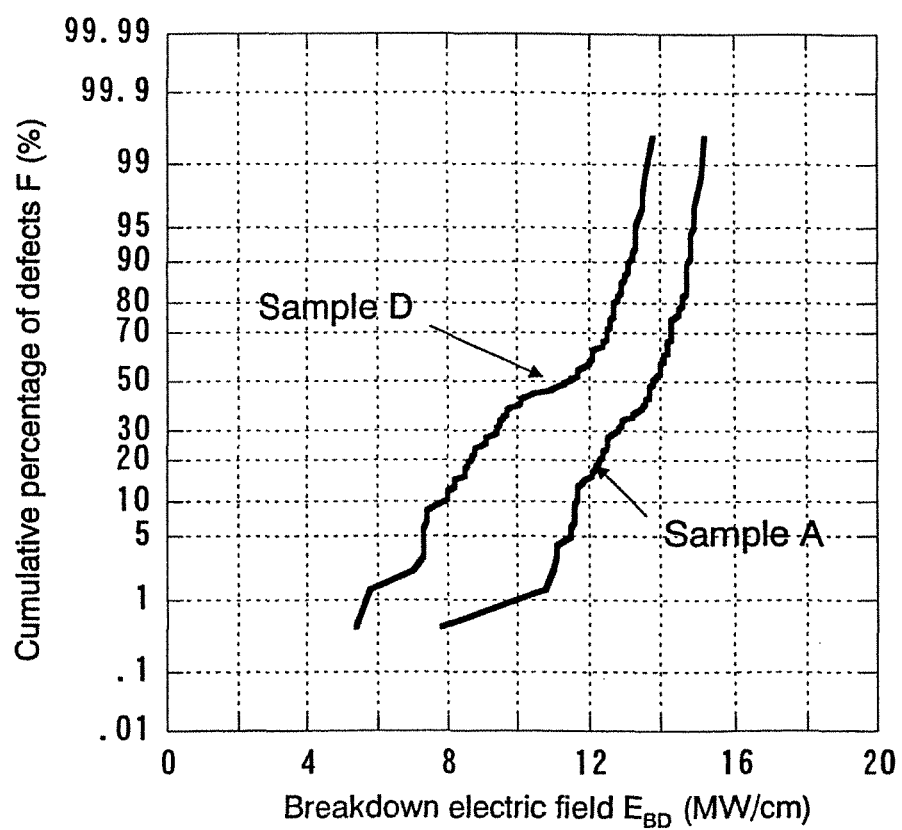
FIG. 28 shows characteristics of an insulating film of the present invention.
Figure 29A:
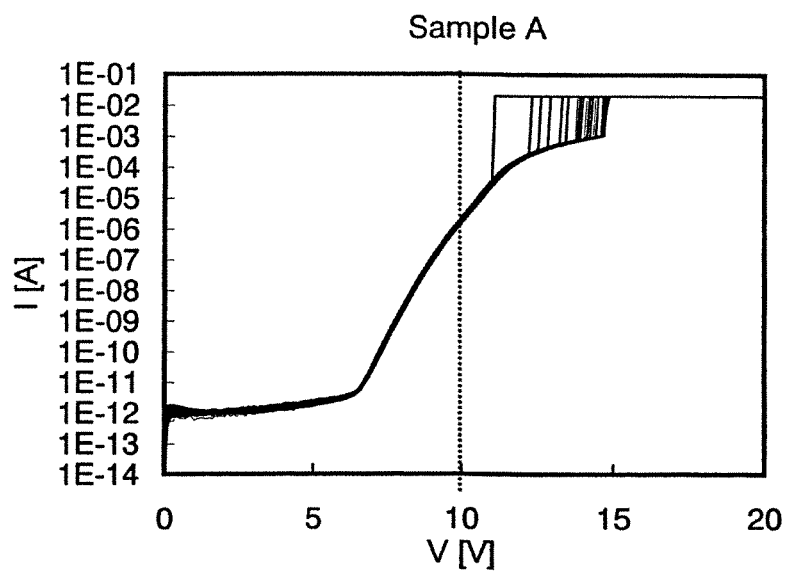
FIGS. 29A and 29B show characteristics of an insulating film of the present invention.
Figure 29B:
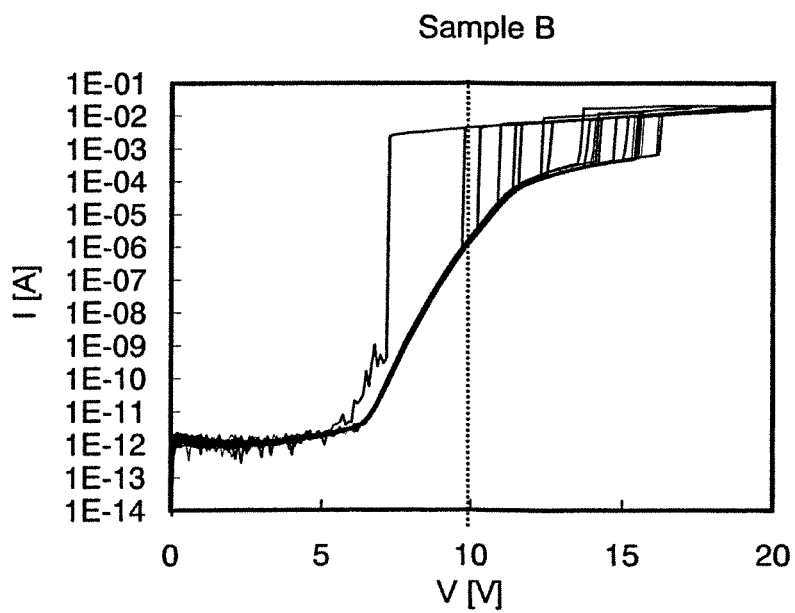
Figure 30A:
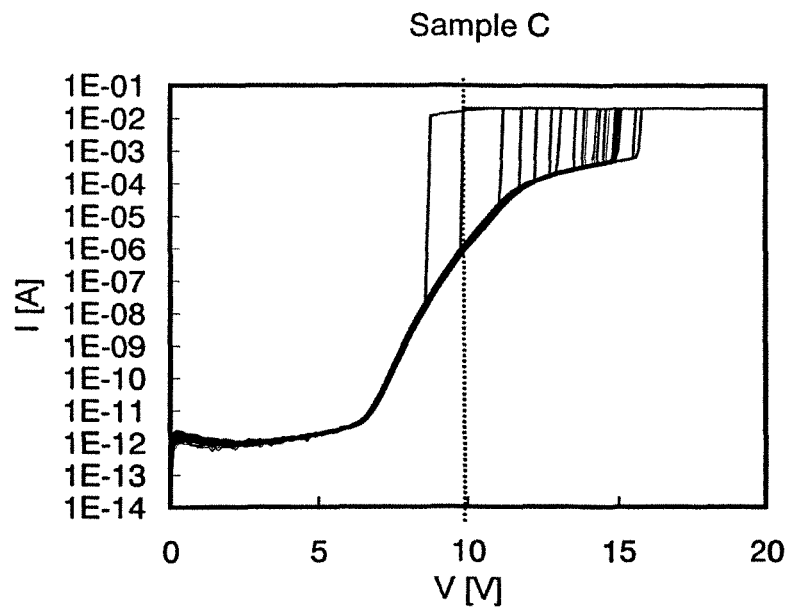
FIGS. 30A and 30B show characteristics of an insulating film of the present invention.
Figure 30B:
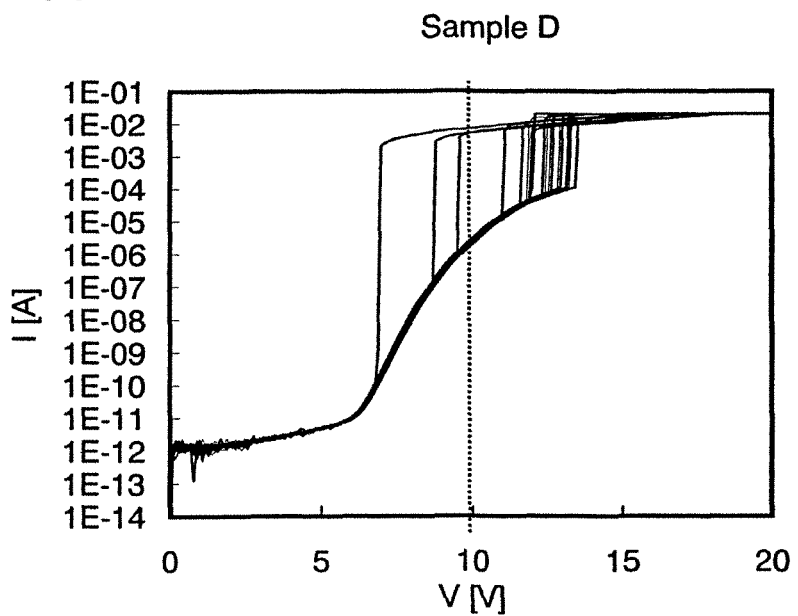

FIG. 28 is a line chart showing a relation between electric field strength and cumulative percentage of defects in withstand voltage at a current density of 1 A/cm² of FIGS. 26A and 26B. In FIG. 28, the vertical axis shows cumulative percentage of defects F (%), while the horizontal axis shows breakdown electric field $E_{BD}$ (MV/cm). It was understood from FIG. 28 that the percentage of the defects in the sample D could be known from a breakdown electric field of about 5 MV/cm; on the other hand, that of the sample A was not known until a breakdown electric field of about 8 MV/cm. Therefore, the sample A on which the plasma oxidation has been performed has a higher withstand voltage than the sample D.

It is to be noted that the graphs shown in FIGS. 27A to 28 are used as a means for evaluating the withstand voltage of the insulating films, and also called TZDB (Time Zero Dielectric Breakdown) histogram. In the TZDB histogram, the breakdown electric field ranging from 0 MV/cm to 2 MV/cm is called A mode, the breakdown electric field ranging form 2 MV/cm to 8 MV/cm is called B mode, and the breakdown electric field of 8 MV/cm or higher is called C mode. In general, it is said that if there is a defect in the A mode and the B mode when an insulating film is used to constitute a part of a device such as a transistor, the yield and reliability are lowered. In contrast, the sample A on which the plasma oxidation has been performed proved to have almost no defects in the A mode and the B mode and have the film with a high withstand voltage.

From the aforementioned measurement results, it was understood that the film (corresponding to the sample A here) formed by performing plasma oxidation on a film formed by a plasma CVD method had a higher withstand voltage than a film (corresponding to the sample D here) formed only by a plasma CVD method.

Next, FIGS. 29A and 29B and FIGS. 30A and 30B show results of measuring current-voltage (I-V) characteristics of the samples A to D, respectively. In each of FIGS. 29A to 30B, the vertical axis shows current (A) while the horizontal axis shows voltage (V). Here, a result of measuring I-V characteristics at 112 points on a substrate surface is shown. It is to be noted that in each of FIGS. 29A to 30B, a dotted line shows the scale at a voltage of 10 V.

Figure 31:
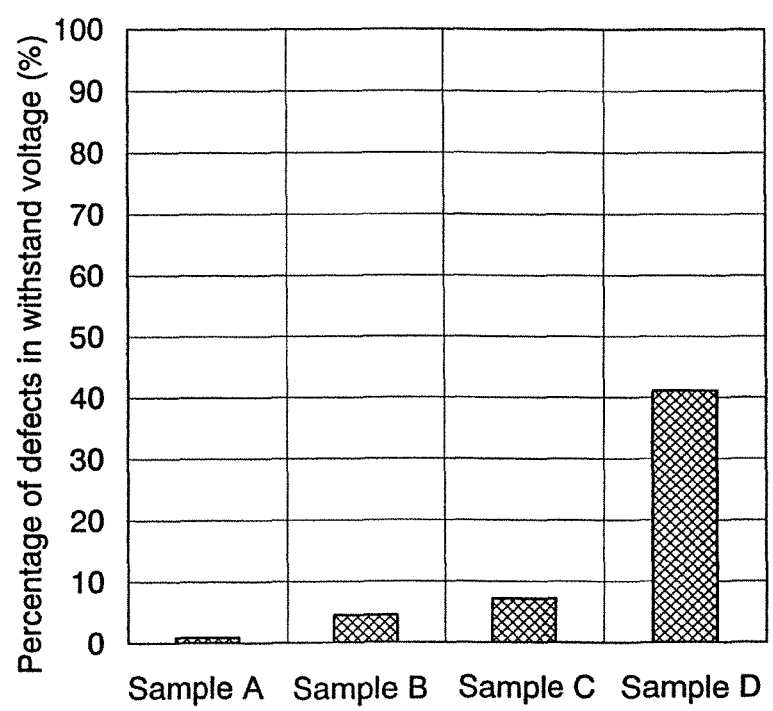
FIG. 31 shows characteristics of an insulating film of the present invention.
Figure 32A:
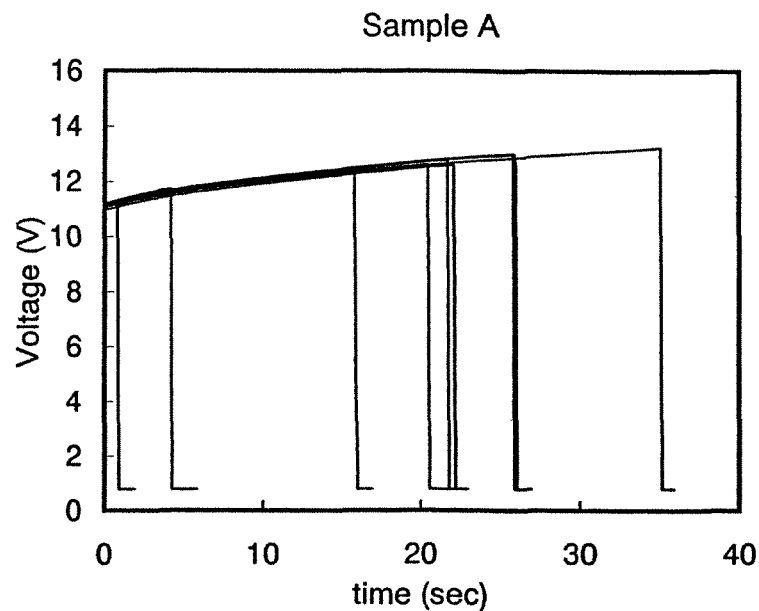
FIGS. 32A and 32B show characteristics of an insulating film of the present invention.
Figure 32B:
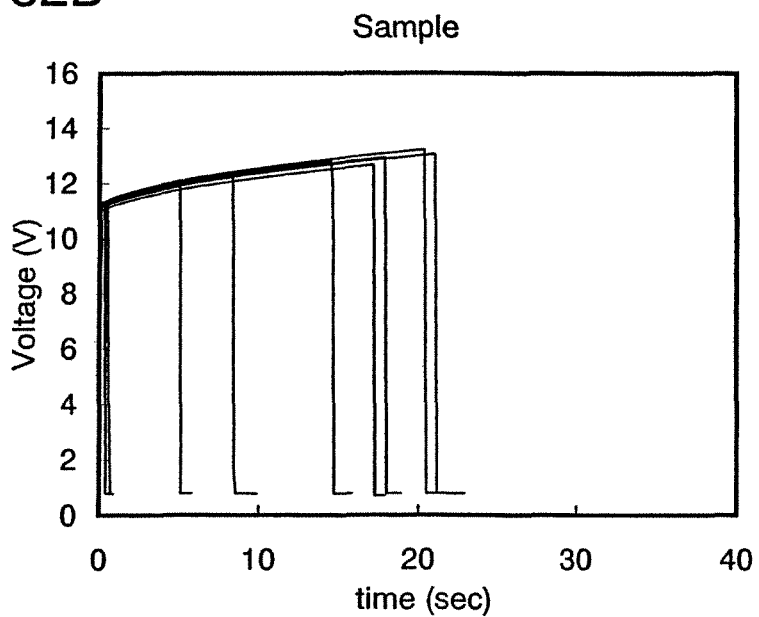
Figure 33A:
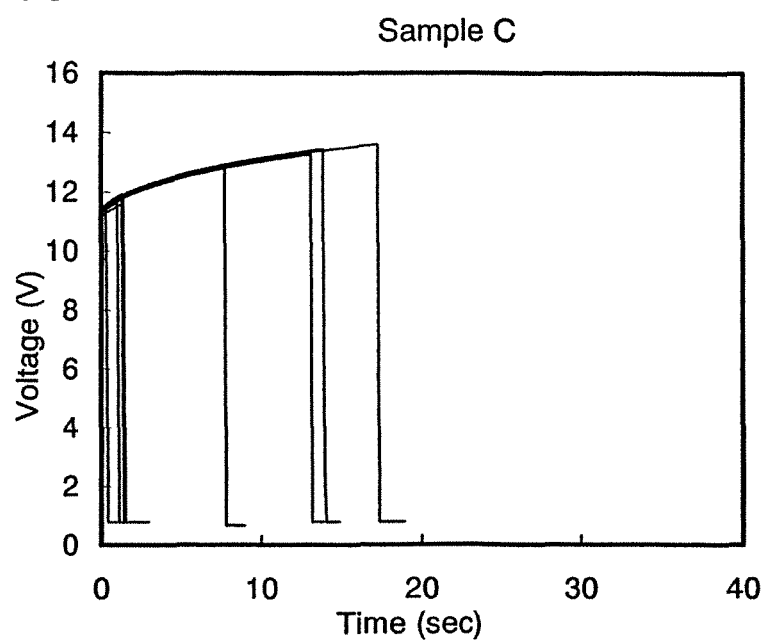
FIGS. 33A and 33B show characteristics of an insulating film of the present invention.
Figure 33B:
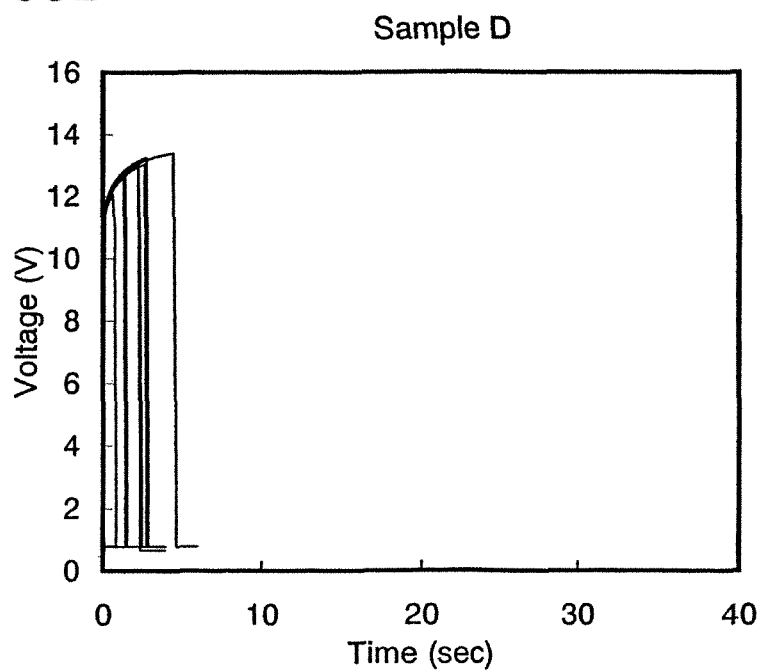

FIG. 31 shows a result of calculating the percentage (%) of defects in withstand voltage of each of the samples A to D. Based on the I-V characteristics shown in FIGS. 29A to 30B, the percentage of defects in withstand voltage was obtained in such a way that the I-V curve that jumps at less than 10 V was regarded as a defect in withstand voltage and the percentage of the number of points of the defects in withstand voltage among the total measured points was calculated. It was understood from FIG. 31 that the samples A to C on which plasma oxidation has been performed had very low percentage of defects in withstand voltage, and moreover that the percentage of defects in withstand voltage is lower in order of the sample A, the sample B, and the sample C.

FIGS. 32A to 33B each show a voltage—time relation when a certain amount of current (12 µA) flow to the samples A to D. In each of FIGS. 32A to 33B, the vertical axis shows voltage (V), while the horizontal axis shows time (sec).

Chart 2 shows a result of calculating and averaging $Q_{bd}$ (C/cm²) based on FIGS. 32A to 33B.

CHART 2

| | Sample A | Sample B | Sample C | Sample D |
|---|---|---|---|---|
| Averaging Qbd (C/cm²) | 0.469 | 0.289 | 0.158 | 0.056 |

It is to be noted that the $Q_{bd}$ is a value obtained by multiplying a value of current flowing through the samples A to D and the time until breakdown (time until the voltage is dropped to about zero). That is, the higher the $Q_{bd}$ is, the film has a higher withstand voltage. Therefore, it was understood from the result of Chart 2 that the samples A to C on which plasma oxidation has been performed had a higher withstand voltage by one digit or more of the $Q_{bd}$ value than the sample D, that the $Q_{bd}$ value was smaller in order of the samples A, B, and C, and that the longer the plasma oxidation was performed, the film had a higher withstand voltage.

Figure 34:
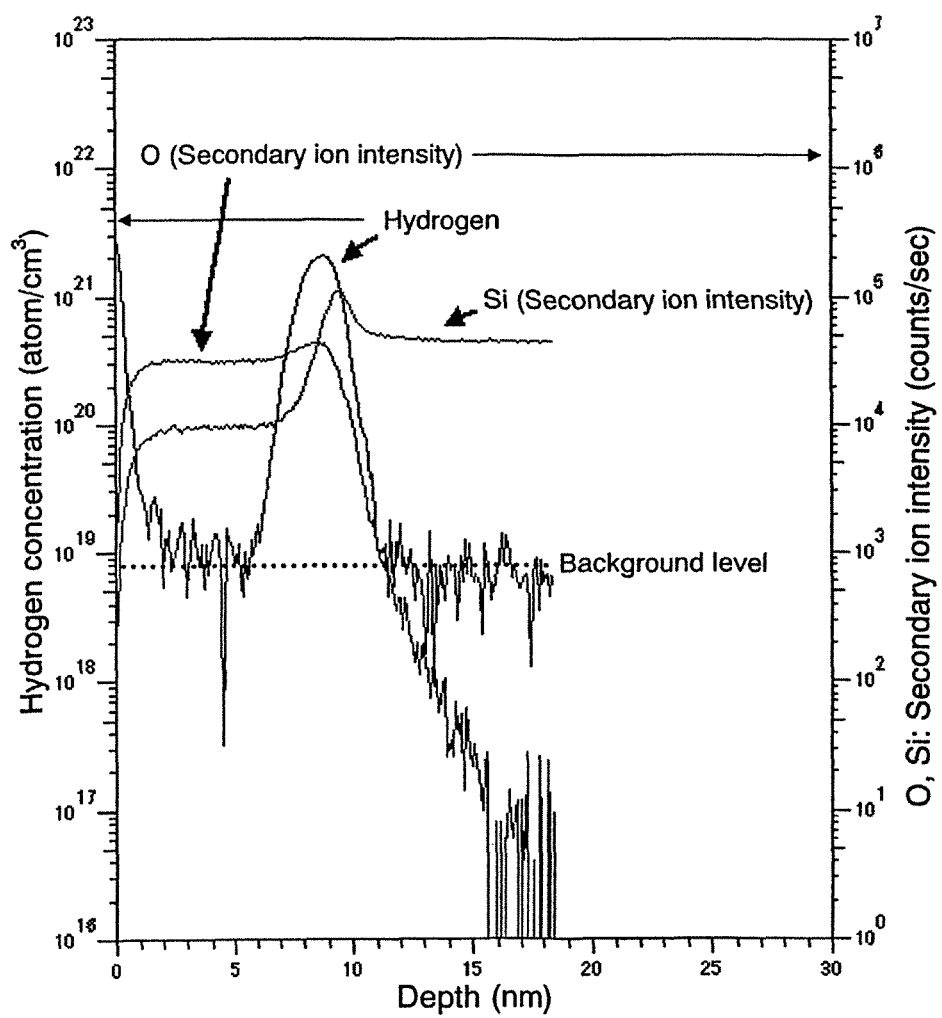
FIG. 34 shows characteristics of an insulating film of the present invention.
Figure 35:
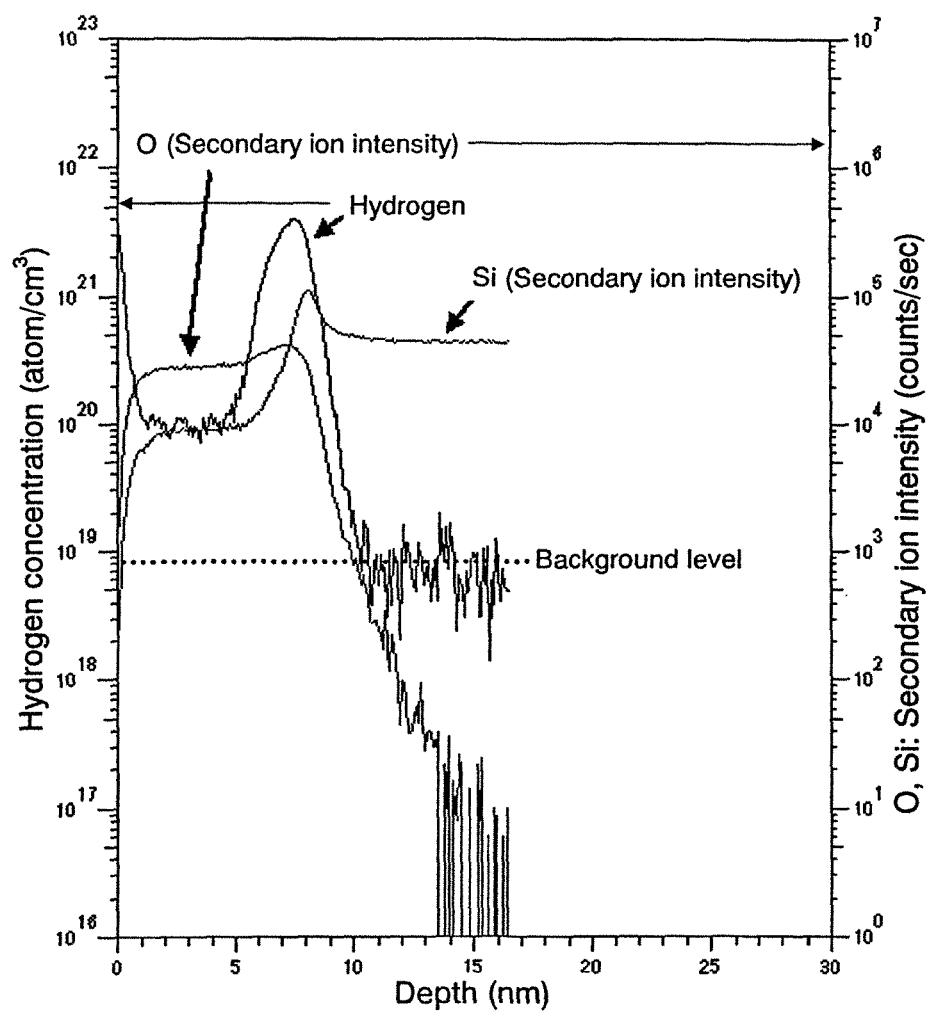
FIG. 35 shows characteristics of an insulating film of the present invention.

FIGS. 34 and 35 show results of measuring the samples A and D by secondary ion mass spectrometry (SIMS), respectively. In each of FIGS. 34 and 35, the vertical axis shows concentration (atoms/cm³), while the horizontal axis shows depth (nm) to which the sample is etched. It is to be noted that the silicon oxynitride film has a depth of about 10 nm.

In each of FIGS. 34 and 35, when attention is paid to hydrogen concentration of the silicon oxynitride film, the sample A has a hydrogen concentration of about $1 \times 10^{19}$ atoms/cm³ or less (measurement limit or less of the SIMS), while the sample D has a hydrogen concentration of about $1 \times 10^{20}$ atoms/cm³, which are 1 digit or more different from each other. Therefore, it was understood that the hydrogen concentration of the silicon oxynitride film decreased by one digit or more by the plasma oxidation.

Figure 36A:
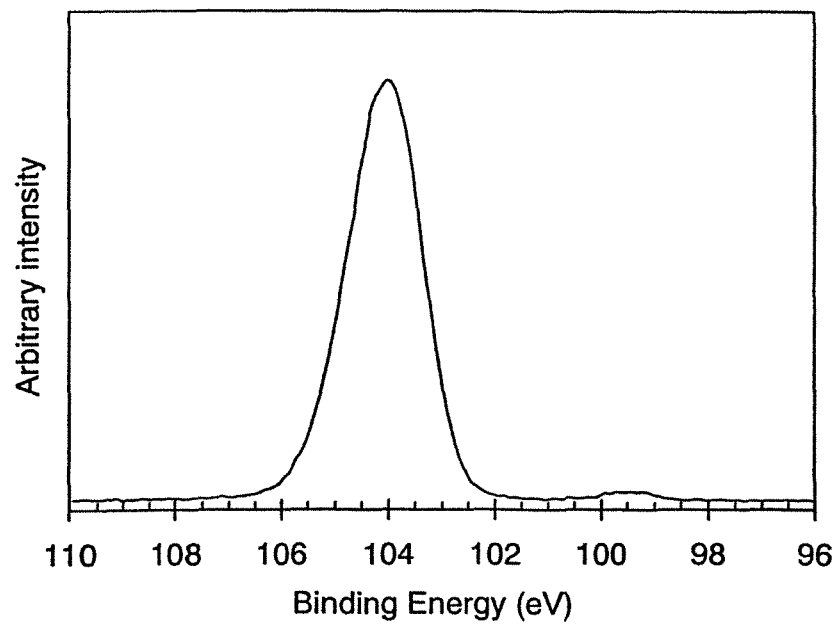
FIGS. 36A and 36B show characteristics of an insulating film of the present invention.
Figure 36B:
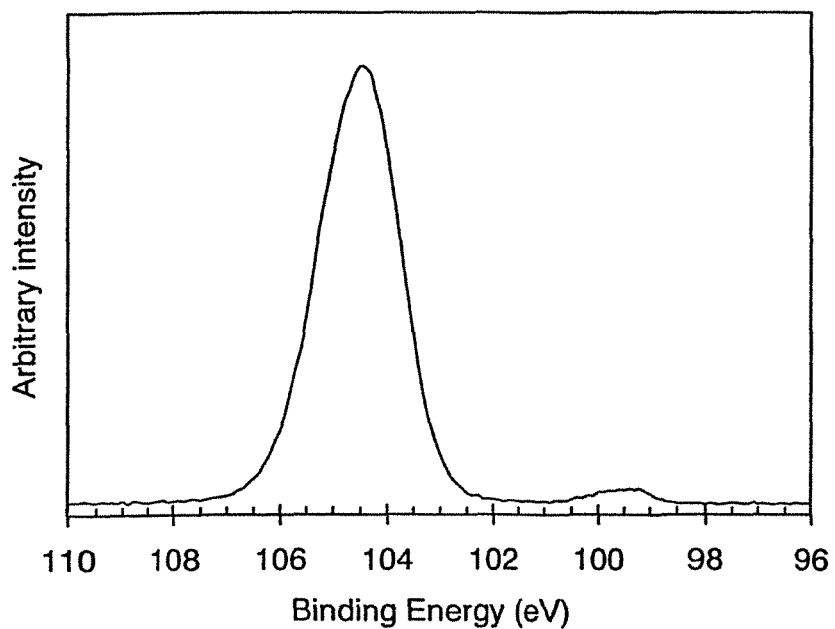

FIGS. 36A and 36B show results of measuring a Si bond state in the silicon oxynitride films of the samples A and D by X-ray photoelectron spectrometry (XPS). In FIGS. 36A and 36B, it is a Si—Si bond that has a peak at about an energy band (binding energy) of 99.4 eV and it is a bond of $SiO_2$ or the like that has a peak at about an energy band of 104 eV. In either of the samples A and D, as a result of separating and detecting the peak at about 104 eV, the peak due to a Si—H bond appearing at about energy bands of 102 eV and 103 eV was not confirmed. From the SIMS analysis results shown in FIGS. 34 and 35, it is clear that the hydrogen concentration of the silicon oxynitride film decreases by performing plasma oxidation, and moreover that, considering along with the XPS analysis result, hydrogen desorption reaction from an O—H bond in the silicon oxynitride film or a substitution reaction between hydrogen and oxygen occurs by performing the plasma oxidation.

Figure 37A:
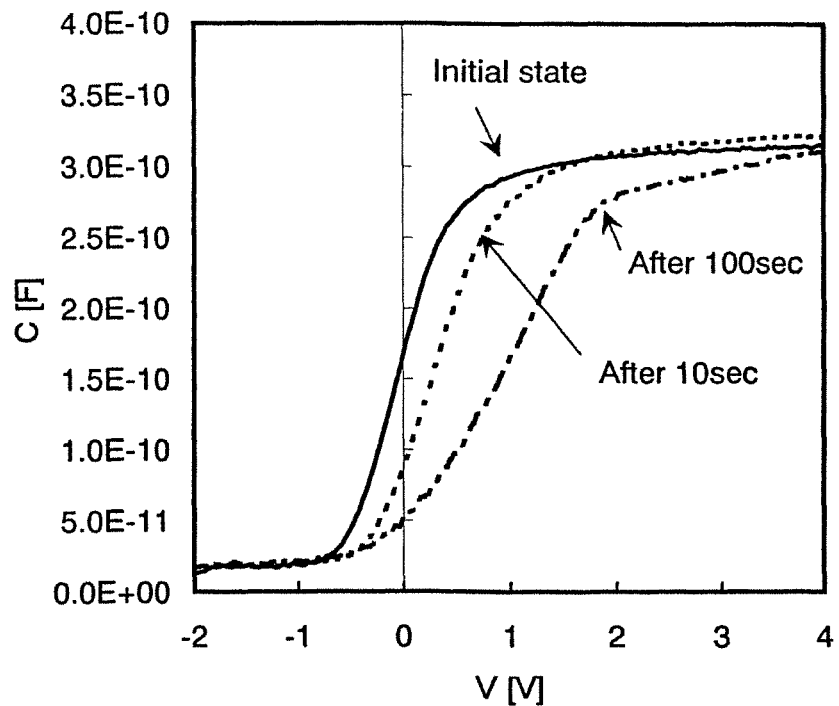
FIGS. 37A and 37B show characteristics of an insulating film of the present invention.
Figure 37B:
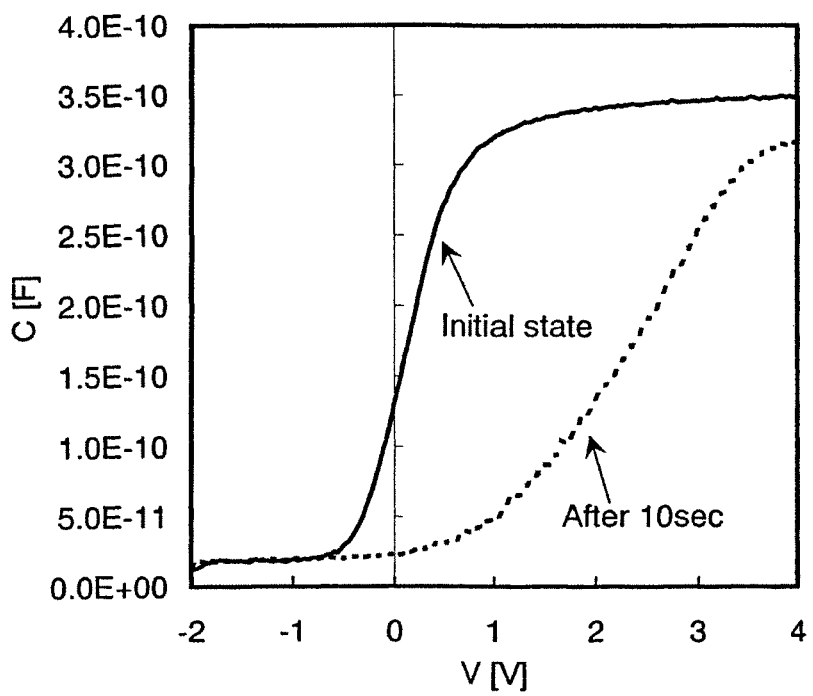

FIGS. 37A and 37B show results of a CV measurement before and after applying current stress to the samples A and D. FIGS. 37A and 37B show measurement results of the samples A and D, respectively. Here, a certain amount of current (1 µA) flows for a certain period of time (10 seconds or 100 seconds) as the current stress. The CV measurement was conducted three times: in an initial state, after feeding the certain amount of current for 10 seconds, and after feeding the certain amount of current for 100 seconds.

As can be seen from FIGS. 37A and 37B, the CV curve largely shifts to the plus side after applying the current stress for 10 seconds in the sample D, and breakdown occurs after applying the current stress for about 34 seconds. On the other hand, the CV curve shifts to the plus side after applying the current stress for 10 seconds in the sample A, but the amount of the shift is much smaller than that of the sample D. Moreover, even after the current stress is applied for 100 seconds, the breakdown does not occur and the amount of the shift of the C-V curve is smaller than that after the current stress is applied for 10 seconds in the sample D.

The dull rise of the CV curve due to the plus-shift of the CV curve after applying the current stress in the CV measurement indicates that electron traps are generated in the oxide film and the interface state density increases. As can be seen from FIGS. 37A and 37B, the amount of the plus-shift of the CV curve and the degree that the rise of the CV curve becomes dull are smaller in the sample A than in the sample D. Accordingly, it was understood that plasma oxidation could decrease the O—H bonds that become electron traps and suppressed the generation of electron traps due to electrical stress.

Then, the samples A and D were etched by using 0.5 wt % hydrofluoric acid. At this time, the etching rate of the sample D was about 8.43 nm/min. On the other hand, the etching rate of the sample A was about 4.33 nm/min, which is about half of that of the sample D. Therefore, it was understood that a denser film could be obtained by performing plasma oxidation.

From the above results, it was understood that a dense film with a high withstand voltage could be obtained by performing plasma oxidation on an insulating film formed by a plasma CVD method as in the present invention. Moreover, it was understood that the hydrogen concentration of the film decreased by performing plasma oxidation on the insulating film formed by a plasma CVD method.

From the above results, it is considered that a dense film with a high withstand voltage can be obtained by plasma oxidation because hydrogen of the O—H bond in the film is desorbed by an oxygen radical or a substitution reaction between hydrogen and oxygen in the film occurs, by which hydrogen in the film decreases.

Embodiment 9

This embodiment will hereinafter explain an application example of a semiconductor device capable of inputting and outputting data without contact, which is provided with the aforementioned nonvolatile semiconductor memory device of the present invention, with reference to drawings. The semiconductor device capable of inputting and outputting data without contact is also referred to as an RFID tag, an ID tag, an IC tag, an IC chip, an RF tag, a wireless tag, an electronic tag, or a wireless chip depending on its usage.

Figure 38A:
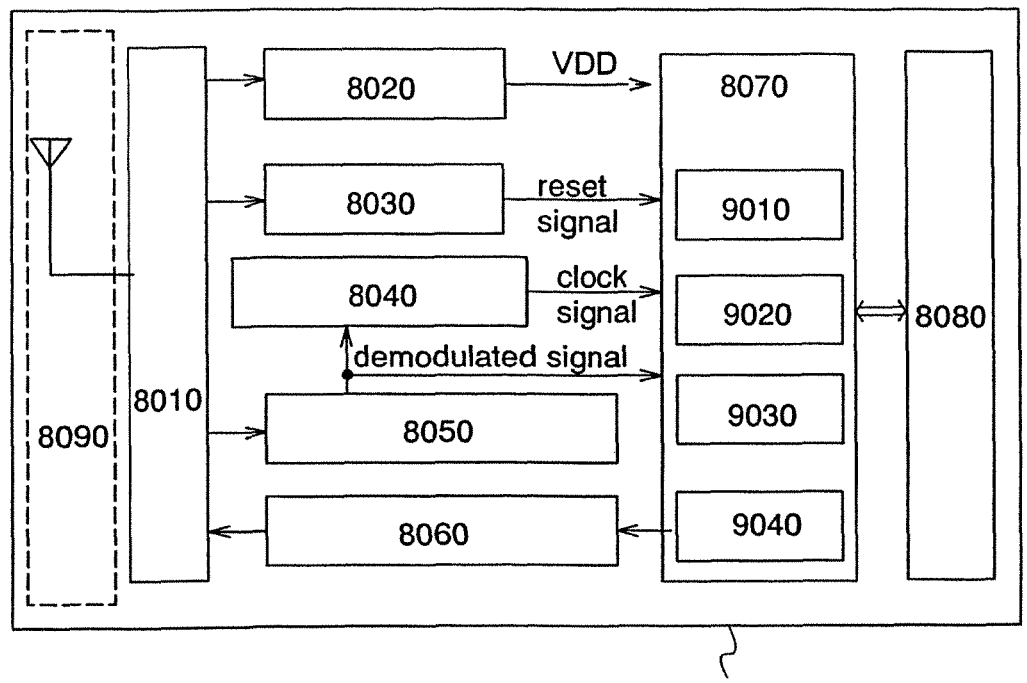
FIGS. 38A to 38C each show an example of using a semiconductor device of the present invention.

A semiconductor device 8000 has a function of exchanging data without contact, which includes a high-frequency circuit 8010, a power source circuit 8020, a reset circuit 8030, a clock generating circuit 8040, a data demodulating circuit 8050, a data modulating circuit 8060, a controlling circuit 8070 for controlling another circuit, a memory circuit 8080, and an antenna 8090 (FIG. 38A). The high-frequency circuit 8010 is a circuit which receives a signal with the antenna 8090 and outputs from the antenna 8090, a signal received from the data modulating circuit 8060. The power source circuit 8020 is a circuit for generating a power source potential based on a received signal. The reset circuit 8030 is a circuit for generating a reset signal. The clock generating circuit 8040 is a circuit for generating various clock signals based on a received signal inputted through the antenna 8090. The data demodulating circuit 8050 is a circuit for demodulating a received signal and outputting the demodulated signal to the controlling circuit 8070. The data modulating circuit 8060 is a circuit for modulating a signal received from the controlling circuit 8070. Moreover, as the controlling circuit 8070, for example, a code extracting circuit 9010, a code judging circuit 9020, a CRC judging circuit 9030, and an output unit circuit 9040 are provided. It is to be noted that the code extracting circuit 9010 is a circuit for extracting each of a plurality of codes included in an instruction sent to the controlling circuit 8070. The code judging circuit 9020 is a circuit for judging the content of an instruction based on comparison between the extracted code and a code corresponding to a reference. The CRC judging circuit 9030 is a circuit for detecting whether or not there is a transmission error or the like, based on the judged code.

Next, an example of an operation of the aforementioned semiconductor device is explained. First, a wireless signal is received with the antenna 8090. The wireless signal is then sent to the power source circuit 8020 through the high-frequency circuit 8010, and a high power source potential (hereinafter referred to as VDD) is generated. The VDD is supplied to each circuit of the semiconductor device 8000. In addition, the signal sent to the data demodulating circuit 8050 through the high-frequency circuit 8010 is demodulated (hereinafter the signal which has been demodulated is called a demodulation signal). Moreover, the signal and the demodulation signal which have passed the reset circuit 8030 and the clock generating circuit 8040 through the high-frequency circuit 8010 are sent to the controlling circuit 8070. The signals sent to the controlling circuit 8070 are analyzed by the code extracting circuit 9010, the code judging circuit 9020, the CRC judging circuit 9030, and the like. Then, information of the semiconductor device which is stored in the memory circuit 8080 is outputted based on the analyzed signal. The outputted information of the semiconductor device is encoded through the output unit circuit 9040. Further, the encoded information of the semiconductor device 8000 is sent by the antenna 8090 as a wireless signal through the data modulating circuit 8060. In the plural circuits of the semiconductor device 8000, a low power source potential (hereinafter VSS) is common, and the VSS can be GND. Moreover, the nonvolatile semiconductor memory device of the present invention can be applied to the memory circuit 8080.

In this manner, data of the semiconductor device can be read by sending the signal from a communication means (such as a reader/writer or a means having a function of a reader or a writer) to the semiconductor device 8000 and receiving with the communication means, the signal sent from the semiconductor device 8000.

The semiconductor device 8000 may supply power source voltage to each circuit by an electromagnetic wave without mounting a power source (battery) or may supply power source voltage to each circuit by an electromagnetic wave and a power source (battery) by mounting the power source (battery).

Figure 38B:
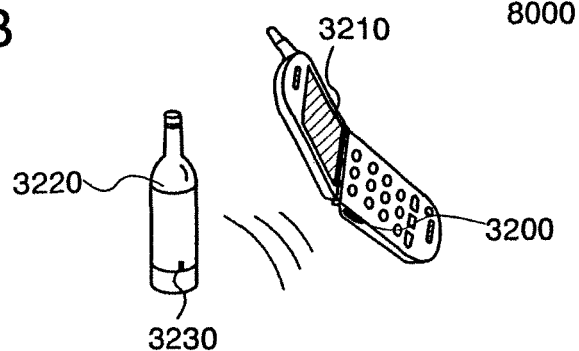
Figure 38C:
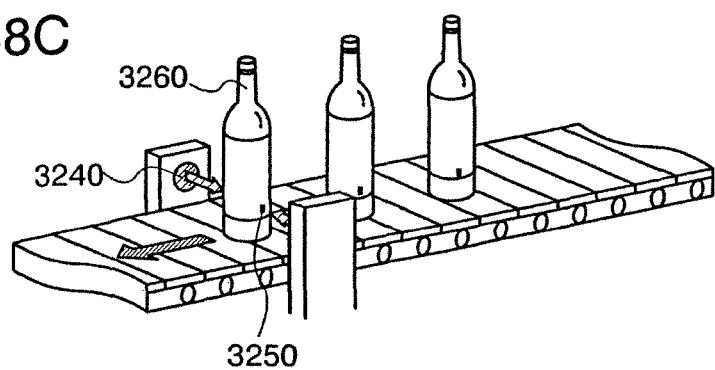

Next, an example of using of a semiconductor device in which data can be inputted/outputted without contact is explained. A side surface of a mobile terminal including a display portion 3210 is provided with a reader/writer 3200. A side surface of a product 3220 is provided with a semiconductor device 3230 (FIG. 38B). When the reader/writer 3200 is held over the semiconductor device 3230 included in the product 3220, the display portion 3210 displays information on the product, such as a material, a production area, an inspection result for each production step, history of circulation process, and description of the product. In addition, when a product 3260 is transferred by a conveyer belt, the product 3260 can be inspected by using a semiconductor device 3250 provided to the product 3260 and a reader/writer 3240 (FIG. 38C). In this manner, by using the semiconductor device in the system, information can be obtained easily and higher performance and higher value addition are achieved.

Moreover, the nonvolatile semiconductor memory device of the present invention can be used for electronic appliances of every field that are provided with memories. For example, the electronic appliance to which the nonvolatile semiconductor memory device of the present invention is applied includes a camera such as a video camera or a digital camera, a goggle type display (head mount display), a navigation system, a sound reproducing device (such as a car audio device or an audio component device), a computer, a game machine, a mobile information terminal (such as a mobile computer, a mobile phone, a mobile game machine, or an electronic book), an image reproducing device provided with a recording medium (specifically, a device which reproduces a recording medium such as a DVD (digital versatile disk) and which has a display for displaying the image), and the like. FIGS. 39A to 39E show specific examples of such electronic appliances.

Figure 39A:
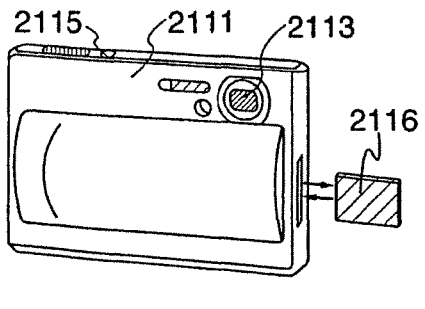
FIGS. 39A to 39E each show an example of using a semiconductor device of the present invention.
Figure 39B:
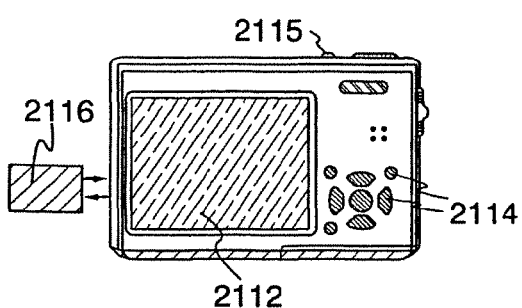

FIGS. 39A and 39B show a digital camera. FIG. 39B shows a back side of the digital camera of FIG. 39A. This digital camera includes a housing 2111, a display portion 2112, a lens 2113, operation keys 2114, a shutter button 2115, and the like and is provided with a removable nonvolatile memory 2116. The memory 2116 stores data of photographs taken with the digital camera. The nonvolatile semiconductor memory device formed by using the present invention can be applied to the memory 2116. The semiconductor device formed by using the present invention can be applied as a switching element that drives the display portion 2112.

Figure 39C:
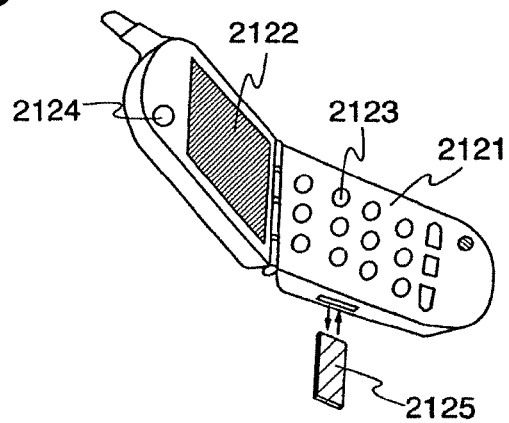

FIG. 39C shows a mobile phone as a typical example of a mobile terminal. This mobile phone includes a housing 2121, a display portion 2122, operation keys 2123, and the like. The mobile phone is provided with a removable nonvolatile memory 2125 and can store and reproduce data of the mobile phone, such as phone numbers, images, and music in the memory 2125. The nonvolatile semiconductor memory device formed by using the present invention can be applied to the memory 2125. The semiconductor device manufactured using the present invention can be applied as a switching element that drives the display portion 2122.

Figure 39D:
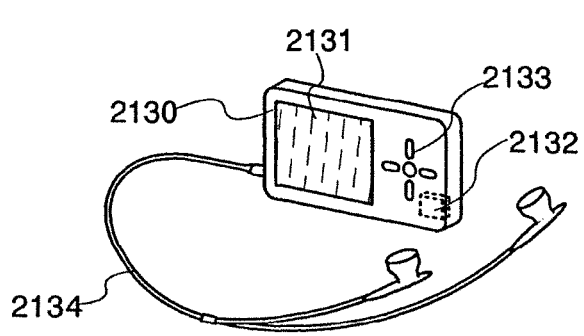

FIG. 39D shows a digital player as a typical example of an audio device. The digital player shown in FIG. 39D includes a main body 2130, a display portion 2131, a memory portion 2132, an operation portion 2133, an earphone 2134, and the like. It is to be noted that the earphone 2134 can be replaced by a headphone or a wireless earphone. For the memory portion 2132, the nonvolatile semiconductor memory device formed by using the present invention can be used. Moreover, the semiconductor device manufactured using the present invention can be applied as a switching element that drives the display portion 2131. For example, images and voices (music) can be recorded and reproduced by operating the operation portion 2133 with the use of a NAND-type nonvolatile memory with a recording capacity of 20 to 200 gigabytes (GB). It is to be noted that the power consumption of the display portion 2131 can be suppressed by displaying white letters on a black background. This is particularly effective in a mobile audio device. The nonvolatile semiconductor memory device provided in the memory portion 2132 may be a removable one.

Figure 39E:
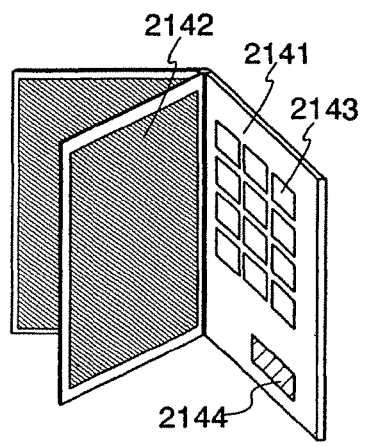

FIG. 39E shows an electronic book (also called electronic paper), which includes a main body 2141, a display portion 2142, operation keys 2143, and a memory portion 2144. The main body 2141 may incorporate a modem so that information can be transmitted and received wirelessly. The memory portion 2144 can use the nonvolatile semiconductor memory device formed by using the present invention. The semiconductor device manufactured using the present invention can be applied as a switching element that drives the display portion 2142. For example, images and voices (music) can be recorded and reproduced by operating the operation keys 2143 with the use of a NAND-type nonvolatile memory with a recording capacity of 20 to 200 gigabytes (GB). The nonvolatile semiconductor memory device provided in the memory portion 2144 may be a removable one.

As thus described, the nonvolatile semiconductor memory device and the semiconductor device of the present invention can be applied in quite a wide range and can be used for electronic appliances of every field that have memories.

Embodiment 10

This embodiment will explain characteristics of a nonvolatile memory element manufactured by using the present invention. First, description is made of a method for manufacturing a nonvolatile memory element A and a nonvolatile memory element B used for a measurement.

Figure 40A:
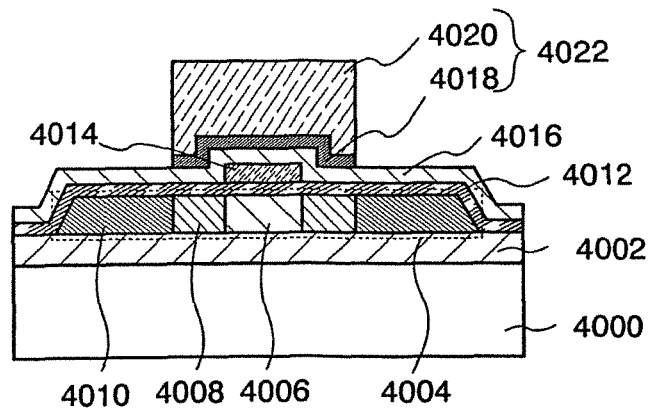
FIGS. 40A and 40B show characteristics of a nonvolatile semiconductor memory device of the present invention.
Figure 40B:
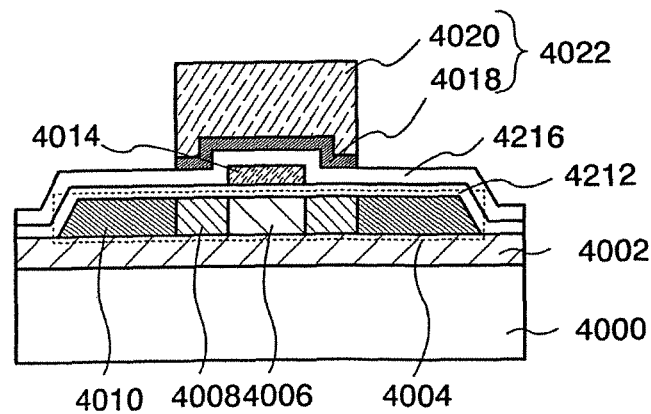

FIG. 40A shows a structure of the memory element A and FIG. 40B shows a structure of the memory element B.

The memory element A has the structure in which a semiconductor film 4004 is formed over a glass substrate 4000 with a base insulating film 4002 interposed therebetween, and a tunnel insulating film 4012, a charge accumulating film 4014, a control insulating film 4016, and a control gate electrode 4022 are stacked in order over the semiconductor film 4004. The base insulating film 4002 is formed by sequentially stacking a silicon nitride oxide film (with a thickness of 50 nm) and a silicon oxynitride film (with a thickness of 150 nm) by a plasma CVD method. The semiconductor film 4004 is formed using a polycrystalline silicon film, and a channel formation region 4006, an LDD region 4008, and a source or drain region 4010 are provided in the semiconductor film 4004. The tunnel insulating film 4012 is formed by performing plasma oxidation for 180 seconds on a 9-nm-thick silicon oxide film formed by a plasma CVD method over the semiconductor film 4004. The charge accumulating film 4014 is formed by adding phosphorus to a 50-nm-thick silicon film formed a plasma CVD method. The control insulating film 4016 is formed by performing plasma oxidation for 180 seconds on a 15-nm-thick silicon oxynitride film, a 10-nm-thick silicon nitride film, and a 15-nm-thick silicon oxynitride film that are formed continuously by a plasma CVD method. The control gate electrode 4022 is formed by sequentially stacking a tantalum nitride film 4018 (with a thickness of 30 nm) and a tungsten film 4020 (with a thickness of 370 nm). The source or drain region 4010 and the LDD region 4008 have n-type conductivity, and the source or drain region 4010 has a higher impurity concentration than the LDD region 4008. The channel formation region 4006 has p-type conductivity. The tunnel insulating film 4012 and the control insulating film 4016 are subjected to the plasma oxidation continuously after forming the insulating films by a plasma CVD method.

The memory element B has the same structure as the memory element A except that the tunnel insulating film 4212 and the control insulating film 4216 are formed not by the plasma oxidation but by only a plasma CVD method.

Chart 3 shows a result of a change (ΔVth) of threshold voltage (Vth) in a case of repeating writing and reading 1000 times with the use of the nonvolatile memory elements A and B. Chart 3 shows a threshold value (initial Vth) in an initial state before writing/reading, and a threshold value (Vth after $10^3$ times) after repeating writing/reading 1000 times. Moreover, the change ($\Delta$Vth) of the threshold value was obtained by subtracting the threshold value (Vth after $10^3$ times) after repeating writing/reading 1000 times from the threshold value (initial Vth) in the initial state.

CHART 3

| memory element | initial Vth | Vth after $10^3$ times | Change of the threshold value |
|---|---|---|---|
| A | 4.0 V | 3.1 V | −0.9 V |
| B | 3.9 V | 2.3 V | −1.6 V |

As shown in Chart 3, the change of the threshold value in the case of repeating the writing/reading 1000 times with the nonvolatile memory element A was about −0.9 V. On the other hand, the change of the threshold value in the case of repeating the writing/reading 1000 times with the nonvolatile memory element B was about −1.6 V. Therefore, it was understood that the change of the threshold value due to the repetition of the writing/reading could be reduced and the reliability could be improved by performing the plasma oxidation on the insulating film according to the present invention.

This application is based on Japanese Patent Application serial no. 2006-147467 filed in Japan Patent Office on May 26, in 2006, the entire contents of which are hereby incorporated by reference.

EXPLANATION OF REFERENCE

10: SUBSTRATE, 12: FIRST INSULATING FILM, 14: SECOND INSULATING FILM, 52: MEMORY CELL ARRAY, 54: PERIPHERAL CIRCUIT, 56: ADDRESS BUFFER, 58: CONTROLLING CIRCUIT, 60: BOOSTING CIRCUIT, 62: ROW DECODER, 64: COLUMN DECODER, 66: SENSE AMPLIFIER, 68: DATA BUFFER, 70: DATA INPUT/OUTPUT BUFFER, 80: ANTENNA, 82: DIELECTRIC PLATE, 84: GAS SUPPLYING PORTION, 86: EVACUATION PORT, 88: SUPPORT BASE, 90: TEMPERATURE CONTROLLING PORTION, 92: MICROWAVE SUPPLYING PORTION, 94: PLASMA, 100: SUBSTRATE, 102: INSULATING FILM, 104: SEMICONDUCTOR FILM, 106: SEMICONDUCTOR FILM, 108: SEMICONDUCTOR FILM, 110: SEMICONDUCTOR FILM, 112: FIRST INSULATING FILM, 116: FIRST INSULATING FILM, 120: CHARGE ACCUMULATING FILM, 121: CHARGE ACCUMULATING FILM, 122: RESIST, 124: RESIST, 126: IMPURITY REGION, 128: SECOND INSULATING FILM, 130: RESIST, 132: THIRD INSULATING FILM, 136: CONDUCTIVE FILM, 138: CONDUCTIVE FILM, 140: GATE ELECTRODE, 142: GATE ELECTRODE, 144: GATE ELECTRODE, 146: GATE ELECTRODE, 148: RESIST, 150: CHANNEL FORMATION REGION, 152: IMPURITY REGION, 154: CHANNEL FORMATION REGION, 156: HIGH-CONCENTRATION IMPURITY REGION, 158: LOW-CONCENTRATION IMPURITY REGION, 160: CHANNEL FORMATION REGION, 162: HIGH-CONCENTRATION IMPURITY REGION, 164: LOW-CONCENTRATION IMPURITY REGION, 166: RESIST, 168: CHANNEL FORMATION REGION, 170: HIGH-CONCENTRATION IMPURITY REGION, 172: INSULATING FILM, 174: CONDUCTIVE FILM, 200: SUBSTRATE, 204: REGION, 206: REGION, 207: P WELL, 208: REGION, 210: REGION, 212: FIRST INSULATING FILM, 216: FIRST INSULATING FILM, 220: CHARGE ACCUMULATING FILM, 221: CHARGE ACCUMULATING FILM, 223: CHARGE ACCUMULATING FILM, 225: CHARGE ACCUMULATING FILM, 228: SECOND INSULATING FILM, 230: RESIST, 232: THIRD INSULATING FILM, 234: THIRD INSULATING FILM, 236: CONDUCTIVE FILM, 238: CONDUCTIVE FILM, 240: GATE ELECTRODE, 242: GATE ELECTRODE, 244: GATE ELECTRODE, 246: GATE ELECTRODE, 250: CHANNEL FORMATION REGION, 251: LOW-CONCENTRATION IMPURITY REGION, 253: IMPURITY REGION, 254: CHANNEL FORMATION REGION, 255: LOW-CONCENTRATION IMPURITY REGION, 257: IMPURITY REGION, 260: CHANNEL FORMATION REGION, 261: LOW-CONCENTRATION IMPURITY REGION, 263: IMPURITY REGION, 266: CHANNEL FORMATION REGION, 267: LOW-CONCENTRATION IMPURITY REGION, 269: IMPURITY REGION, 272: INSULATING FILM, 274: CONDUCTIVE FILM, 280: INSULATING FILM, 331: SUBSTRATE TO BE PROCESSED, 351: SUPPORT BASE, 353: EVACUATION PORT, 357: TEMPERATURE CONTROLLING PORTION, 360: ELECTRODE PLATE, 361: HIGH-FREQUENCY ELECTRIC POWER INTRODUCING PORTION, 362: GAS INTRODUCING PORTION, 400: SUBSTRATE, 402: BASE INSULATING FILM, 404: SEMICONDUCTOR FILM, 406: FIRST INSULATING FILM, 408: SECOND INSULATING FILM, 410: CONDUCTIVE FILM, 412: CONDUCTIVE FILM, 414: CONDUCTIVE FILM, 416: CONDUCTIVE FILM, 418: GATE ELECTRODE, 420: CHANNEL FORMATION REGION, 422: IMPURITY REGION, 424: THIRD INSULATING FILM, 426: INSULATING FILM, 428: CONDUCTIVE FILM, 600: SUBSTRATE, 601: REGION, 602: INSULATING FILM, 603: FIRST INSULATING FILM, 604: CHARGE ACCUMULATING FILM, 606: GATE ELECTRODE, 608: SECOND INSULATING FILM, 612: CONDUCTIVE FILM, 614: CONDUCTIVE FILM, 616: CONDUCTIVE FILM, 618: CONDUCTIVE FILM, 620: GATE ELECTRODE, 622: CHANNEL FORMATION REGION, 624: IMPURITY REGION, 626: IMPURITY REGION, 822: IMPURITY REGION, 824: THIRD INSULATING FILM, 825: CHANNEL FORMATION REGION, 826: IMPURITY REGION, 827: IMPURITY REGION, 828: INSULATING FILM, 830: INSULATING FILM, 832: CONDUCTIVE FILM, 900: SUBSTRATE, 902: BASE INSULATING FILM, 904: SEMICONDUCTOR FILM, 906: FIRST INSULATING FILM, 907: SECOND INSULATING FILM, 908: CHARGE ACCUMULATING FILM, 910: THIRD INSULATING FILM, 911: INSULATING FILM, 912: CONDUCTIVE FILM, 914: CONDUCTIVE FILM, 916: CHARGE ACCUMULATING FILM, 918: INSULATING FILM, 920: CONDUCTIVE FILM, 924: GATE ELECTRODE, 926: CHANNEL FORMATION REGION, 928: IMPURITY REGION, 2111: HOUSING, 2112: DISPLAY PORTION, 2113: LENS, 2114: OPERATION KEY, 2115: SHUTTER BUTTON, 2116: MEMORY, 2121: HOUSING, 2122: DISPLAY PORTION, 2123: OPERATION KEY, 2125: MEMORY, 2130: MAIN BODY, 2131: DISPLAY PORTION, 2132: MEMORY PORTION, 2133: OPERATION PORTION, 2134: EARPHONE, 2141: MAIN BODY, 2142: DISPLAY PORTION, 2143: OPERATION KEY, 2144: MEMORY PORTION, 3200: READER/WRITER, 3210: DISPLAY PORTION, 3220: PRODUCT, 3230: SEMICONDUC-

TOR DEVICE, 3240: READER/WRITER, 3250: SEMICONDUCTOR DEVICE, 3260: PRODUCT, 4000: GLASS SUBSTRATE, 4002: BASE INSULATING FILM, 4004: SEMICONDUCTOR FILM, 4006: CHANNEL FORMATION REGION, 4008: LDD REGION, 4010: DRAIN REGION, 4012: TUNNEL INSULATING FILM, 4014: CHARGE ACCUMULATING FILM, 4016: CONTROL INSULATING FILM, 4018: TANTALUM NITRIDE FILM, 4020: TUNGSTEN FILM, 4022: CONTROL GATE ELECTRODE, 4212: TUNNEL INSULATING FILM, 4216: CONTROL INSULATING FILM, 8000: SEMICONDUCTOR DEVICE, 8010: HIGH-FREQUENCY CIRCUIT, 8020: POWER SOURCE CIRCUIT, 8030: RESET CIRCUIT, 8040: CLOCK GENERATING CIRCUIT, 8050: DATA DEMODULATING CIRCUIT, 8060: DATA MODULATING CIRCUIT, 8070: CONTROLLING CIRCUIT, 8080: MEMORY CIRCUIT, 8090: ANTENNA, 9010: CODE EXTRACTING CIRCUIT, 9020: CODE JUDGING CIRCUIT, 9030: CRC JUDGING CIRCUIT, AND 9040: OUTPUT UNIT CIRCUIT

What is claimed is:

1. A semiconductor device comprising:
a first insulating film;
a pair of impurity regions over the first insulating film;
a semiconductor region having a channel formation region between the pair of impurity regions; and
a gate electrode over the semiconductor region with a gate insulating film interposed therebetween,
wherein the gate insulating film has a hydrogen concentration of $5\times10^{19}$ atoms/cm$^3$ or less,
wherein the gate insulating film includes a region having a hydrogen concentration of $1\times10^{20}$ atoms/cm$^3$ or more, the region being positioned in the vicinity of a surface of the gate insulating film,
wherein the gate insulating film is formed by performing a plasma oxidation treatment on an insulating film formed b a CVD method a sputtering method or a thermal oxidation method,
wherein the gate insulating film comprises:
a first region covering the pair of impurity regions and the semiconductor region, and
a second region being in contact with the first insulating film, and
wherein a thickness of the gate insulating film in the first region is larger than that in the second region.

2. The semiconductor device according to claim 1, wherein the gate insulating film comprises silicon oxide, silicon oxynitride, silicon nitride oxide, aluminum oxide, tantalum oxide, or hafnium oxide.

3. The semiconductor device according to claim 1, wherein the gate insulating film comprises an element of a noble gas.

4. The semiconductor device according to claim 1, wherein the semiconductor region is formed in a semiconductor film over a substrate.

5. The semiconductor device according to claim 4, wherein the semiconductor film comprises silicon as its main component.

6. The semiconductor device according to claim 1, wherein the semiconductor region is formed over a single-crystal Si substrate.

7. The semiconductor device according to claim 1, wherein the semiconductor region is formed in an SOI substrate.

8. The semiconductor device according to claim 1, wherein the semiconductor region is formed in a compound semiconductor substrate.

9. A electronic appliance comprising the semiconductor device according to claim 1, wherein the electronic appliance is a camera, a goggle type display, a navigation system, a sound reproducing device, a computer, a game machine, a mobile information terminal, or an image reproducing device.

10. The semiconductor device according to claim 1, further comprising:
a sidewall insulating layer in contact with side surfaces of the gate electrode; and
a second insulating film in contact with the gate insulating film, the gate electrode, and the sidewall insulating layer,
wherein the second insulating film is formed of an organic material or a siloxane material.

11. A semiconductor device comprising:
a first insulating film;
a semiconductor region having a channel formation region, a pair of first impurity regions and a pair of second impurity regions over the first insulating film;
a gate electrode over the semiconductor region with a gate insulating film interposed therebetween;
wherein the channel formation region is between the pair of first impurity regions,
wherein the channel formation region and the pair of first impurity regions are between the pair of second impurity regions,
wherein an impurity concentration of the pair of first impurity regions is lower than that of the pair of second impurity regions,
wherein the gate insulating film has a hydrogen concentration of $5\times10^{19}$ atoms/cm$^3$ or less,
wherein the gate insulating film includes a region having a hydrogen concentration of $1\times10^{20}$ atoms/cm$^3$ or more, the region being positioned in the vicinity of a surface of the gate insulating film,
wherein the gate insulating film is formed by performing a plasma oxidation treatment on an insulating film formed by a CVD method, a sputtering method, or a thermal oxidation method,
wherein the gate insulating film comprises:
a first region covering the semiconductor region, the pair of first impurity regions, and the pair of second impurity regions, and
a second region being in contact with the first insulating film,
wherein a thickness of the gate insulating film in the first region is larger than that in the second region.

12. The semiconductor device according to claim 11, wherein the gate insulating film comprises silicon oxide, silicon oxynitride, silicon nitride oxide, aluminum oxide, tantalum oxide, or hafnium oxide.

13. The semiconductor device according to claim 11, wherein the gate insulating film comprises an element of a noble gas.

14. The semiconductor device according to claim 11, wherein the semiconductor region is formed in a semiconductor film over a substrate.

15. The semiconductor device according to claim 14, wherein the semiconductor film comprises silicon as its main component.

16. The semiconductor device according to claim 11, wherein the semiconductor region is formed over a single-crystal Si substrate.

17. The semiconductor device according to claim 11, wherein the semiconductor region is formed in an SOI substrate.

18. The semiconductor device according to claim 11, wherein the semiconductor region is formed in a compound semiconductor substrate.

19. A electronic appliance comprising the semiconductor device according to claim 11, wherein the electronic appliance is a camera, a goggle type display, a navigation system, a sound reproducing device, a computer, a game machine, a mobile information terminal, or an image reproducing device.

20. The semiconductor device according to claim 11, further comprising:
- a sidewall insulating layer in contact with side surfaces of the gate electrode; and
- a second insulating film in contact with the gate insulating film, the gate electrode, and the sidewall insulating layer,
- wherein the second insulating film is formed of an organic material or a siloxane material.

* * * * *

UNITED STATES PATENT AND TRADEMARK OFFICE
CERTIFICATE OF CORRECTION

PATENT NO. : 9,231,070 B2  Page 1 of 1
APPLICATION NO. : 13/113255
DATED : January 5, 2016
INVENTOR(S) : Tetsuya Kakehata et al.

It is certified that error appears in the above-identified patent and that said Letters Patent is hereby corrected as shown below:

In the Specification:

Col. 9, line 44, "(such as Si or the" should read --(such as Si or $Si_XGe_{1-X}$), the--

Col. 10, line 33, "(see. FIG. 4B)" should read --(see FIG. 4B)--

Col. 23, line 32, "phosphorus (F)" should read --phosphorus (P)--

Col. 30, line 14, "0 V is, applied" should read --0 V is applied,--

Col. 37, line 56, "5 scan," should read --5 sccm,--

Col. 38, line 3, "oxynitride x>y>0), or" should read --oxynitride ($SiO_XN_Y$, x>y>0), or--

Col. 38, line 26, "($Ta_xO_y$, hafnium" should read --($Ta_xO_y$), hafnium--

Col. 46, line 54, "polyimide" should read --polyamide,--

Col. 47, line 60, "900 scan," should read --900 sccm,--

In the Claims:

Col. 57, line 39, Claim 1 "b a CVD method a sputtering method or" should read --by a CVD method, a sputtering method, or--

Signed and Sealed this
Twenty-sixth Day of April, 2016

Michelle K. Lee
*Director of the United States Patent and Trademark Office*